(12) United States Patent
De Schiffart et al.

(10) Patent No.: US 10,908,510 B2
(45) Date of Patent: *Feb. 2, 2021

(54) IMPRINT LITHOGRAPHY

(71) Applicant: ASML NETHERLANDS B.V., Veldhoven (NL)

(72) Inventors: Catharinus De Schiffart, Nijmegen (NL); Michael Jozef Mathijs Renkens, Sittard (NL); Gerard Van Schothorst, Waardenburg (NL); Andre Bernardus Jeunink, Bergeijk (NL); Gregor Edward Van Baars, Eindhoven (NL); Sander Frederik Wuister, Eindhoven (NL); Yvonne Wendela Kruijt-Stegeman, Eindhoven (NL); Norbert Erwin Therenzo Jansen, Eindhoven (NL); Toon Hardeman, 's-Hertogenbosch (NL); George Arie Jan De Fockert, Apeldoorn (NL); Johan Frederik Dijksman, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/550,451

(22) Filed: Aug. 26, 2019

(65) Prior Publication Data

US 2019/0377265 A1    Dec. 12, 2019

Related U.S. Application Data

(63) Continuation of application No. 15/828,523, filed on Dec. 1, 2017, which is a continuation of application (Continued)

(51) Int. Cl.
*G03F 7/20* (2006.01)
*G03F 9/00* (2006.01)

(52) U.S. Cl.
CPC .......... *G03F 7/7035* (2013.01); *G03F 7/709* (2013.01); *G03F 7/7085* (2013.01); (Continued)

(58) Field of Classification Search
CPC .... G03F 9/7003; G03F 9/7038; G03F 9/7042; G03F 9/7092; G03F 9/7096; (Continued)

(56) References Cited

U.S. PATENT DOCUMENTS

| 4,731,155 A | 3/1988 | Napoli et al. |
| 5,772,905 A | 6/1998 | Chou |

(Continued)

FOREIGN PATENT DOCUMENTS

| JP | H10-291251 | 11/1998 |
| JP | 2001-023896 | 1/2001 |

(Continued)

OTHER PUBLICATIONS

International Search Report dated Dec. 30, 2011 in corresponding International Patent Application No. PCT/EP2011/059831.

(Continued)

*Primary Examiner* — Christina A Riddle
(74) *Attorney, Agent, or Firm* — Pillsbury Winthrop Shaw Pittman, LLP

(57) ABSTRACT

An imprint lithography apparatus having a first frame to be mounted on a floor, a second frame mounted on the first frame via a kinematic coupling, an alignment sensor mounted on the second frame, to align an imprint lithography template arrangement with a target portion of a substrate, and a position sensor to measure a position of the imprint lithography template arrangement and/or a substrate stage relative to the second frame.

20 Claims, 22 Drawing Sheets

Related U.S. Application Data

No. 13/812,844, filed as application No. PCT/EP2011/059831 on Jun. 14, 2011, now Pat. No. 9,864,279.

(60) Provisional application No. 61/426,275, filed on Dec. 22, 2010, provisional application No. 61/418,214, filed on Nov. 30, 2010, provisional application No. 61/382,151, filed on Sep. 13, 2010, provisional application No. 61/370,940, filed on Aug. 5, 2010.

(52) U.S. Cl.
CPC ...... *G03F 7/70775* (2013.01); *G03F 7/70825* (2013.01); *G03F 9/7042* (2013.01)

(58) Field of Classification Search
CPC ............. G03F 7/70691; G03F 7/70733; G03F 7/70783; G03F 7/709; G03F 7/7035; G03F 7/70375; G03F 7/70416; G03F 7/70633; G03F 7/70666; G03F 7/70675; G03F 7/70683; G03F 7/70716; G03F 7/70725; G03F 7/70758; G03F 7/70775; G03F 7/70816; G03F 7/70825; G03F 7/7085; G03F 7/0002; B82Y 10/00; B82Y 40/00; B29C 43/14; B29C 43/04; B29C 43/021; B29C 2043/142
USPC ... 355/52–55, 72–77, 78, 83–87, 91–95, 97, 355/99, 102, 103, 122, 132; 977/887; 430/322; 264/293, 496, 40.1, 40.5; 216/44; 425/174.4, 150, 406
See application file for complete search history.

(56) References Cited

U.S. PATENT DOCUMENTS

| | | | |
|---|---|---|---|
| 5,894,056 A | 4/1999 | Kalizaki et al. | |
| 5,986,743 A | 11/1999 | Hanzawa | |
| 6,334,960 B1 | 1/2002 | Willson et al. | |
| 6,459,088 B1 | 10/2002 | Yasuda et al. | |
| 6,906,786 B2 | 6/2005 | Cox et al. | |
| 7,180,571 B2 | 2/2007 | Cadee | |
| 7,359,032 B2 | 4/2008 | Dansberg et al. | |
| 8,248,608 B2 | 8/2012 | Den Boef | |
| 9,715,171 B2 | 7/2017 | Butler et al. | |
| 2002/0150398 A1 | 10/2002 | Choi et al. | |
| 2003/0081193 A1* | 5/2003 | White | B82Y 10/00 355/72 |
| 2004/0008331 A1 | 1/2004 | Cox et al. | |
| 2004/0041101 A1 | 3/2004 | Akutsu | |
| 2004/0124566 A1 | 7/2004 | Sreenivasan et al. | |
| 2005/0064054 A1* | 3/2005 | Kasumi | B82Y 10/00 425/112 |
| 2005/0083496 A1 | 4/2005 | Dansberg et al. | |
| 2005/0193944 A1 | 9/2005 | Simon | |
| 2005/0274693 A1 | 12/2005 | Heidari et al. | |
| 2006/0033896 A1* | 2/2006 | Kiriya | G03B 27/42 355/53 |
| 2006/0033903 A1* | 2/2006 | Yuan | G03F 7/70725 355/72 |
| 2006/0077374 A1 | 4/2006 | Sreenivasan et al. | |
| 2006/0119810 A1 | 6/2006 | Cadee | |
| 2006/0130678 A1 | 6/2006 | Sewell | |
| 2006/0137555 A1 | 6/2006 | Simon | |
| 2006/0180952 A1 | 8/2006 | Kruijt-Stegeman et al. | |
| 2006/0227308 A1 | 10/2006 | Brink et al. | |
| 2006/0231979 A1 | 10/2006 | Van Santen et al. | |
| 2006/0254446 A1 | 11/2006 | Lof | |
| 2006/0267231 A1* | 11/2006 | Van Santen | B29C 43/003 264/40.1 |
| 2007/0102838 A1 | 5/2007 | Simon | |
| 2007/0138699 A1 | 6/2007 | Wuister et al. | |
| 2007/0141191 A1 | 6/2007 | Kruijt-Stegeman et al. | |
| 2007/0145643 A1 | 6/2007 | Dijksman et al. | |
| 2007/0200276 A1 | 8/2007 | Mackey et al. | |
| 2007/0237886 A1 | 10/2007 | Dijksman et al. | |
| 2007/0266875 A1 | 11/2007 | Ten Berge | |
| 2007/0287081 A1 | 12/2007 | Cherala et al. | |
| 2008/0145774 A1 | 6/2008 | Kruijt-Stegeman et al. | |
| 2008/0271628 A1 | 11/2008 | Kruijt-Stegeman et al. | |
| 2009/0108483 A1 | 4/2009 | Suehira et al. | |
| 2009/0108484 A1* | 4/2009 | Kruijt-Stegeman | B82Y 10/00 264/40.5 |
| 2010/0031833 A1 | 2/2010 | Kasumi et al. | |
| 2010/0044917 A1 | 2/2010 | Kruijt-Stegeman et al. | |
| 2010/0052217 A1* | 3/2010 | Kasumi | B82Y 10/00 264/293 |
| 2010/0072649 A1* | 3/2010 | Kawakami | G03F 7/0002 264/40.7 |
| 2010/0072664 A1 | 3/2010 | Kawakami et al. | |
| 2010/0078840 A1* | 4/2010 | Kawakami | B82Y 10/00 264/40.1 |
| 2010/0085551 A1 | 4/2010 | Vermeulen et al. | |
| 2010/0149516 A1 | 6/2010 | Loopstra et al. | |
| 2010/0297282 A1* | 11/2010 | De Schiffart | B82Y 10/00 425/385 |
| 2011/0001254 A1 | 1/2011 | Kruijt-Stegeman et al. | |
| 2011/0003023 A1 | 1/2011 | Vermeulen et al. | |
| 2011/0008483 A1 | 1/2011 | Jeunink et al. | |
| 2011/0163477 A1 | 7/2011 | Butler et al. | |
| 2012/0225152 A1 | 9/2012 | Wuister et al. | |
| 2012/0313295 A1 | 12/2012 | Den Boef et al. | |
| 2013/0182236 A1 | 7/2013 | De Schiffart et al. | |

FOREIGN PATENT DOCUMENTS

| | | |
|---|---|---|
| JP | 2001-044264 | 2/2001 |
| JP | 2001-260218 | 9/2001 |
| JP | 2005-167166 | 6/2005 |
| JP | 2005228978 | 8/2005 |
| JP | 2005-353858 | 12/2005 |
| JP | 2006-140366 | 6/2006 |
| JP | 2006-245071 | 9/2006 |
| JP | 2006-303292 | 11/2006 |
| JP | 2006339347 | 12/2006 |
| JP | 2007-160565 | 6/2007 |
| JP | 2008501244 | 1/2008 |
| JP | 2008034766 | 2/2008 |
| JP | 2008098633 | 4/2008 |
| JP | 2008-110610 | 5/2008 |
| JP | 2008-210867 | 9/2008 |
| JP | 2008306171 | 12/2008 |
| JP | 2009518207 | 5/2009 |
| JP | 2009-141328 | 6/2009 |
| JP | 2009-286085 | 12/2009 |
| JP | 2010-040879 | 2/2010 |
| JP | 2010-080713 | 4/2010 |
| JP | 2010093252 | 4/2010 |
| JP | 58-91291 | 3/2016 |
| TW | 200627081 | 8/2006 |
| WO | 02/067055 | 8/2002 |
| WO | 2007/077920 | 7/2007 |
| WO | 2010047768 | 4/2010 |
| WO | 2010056349 | 5/2010 |
| WO | 2011/139337 | 11/2011 |
| WO | 2012/016744 | 2/2012 |

OTHER PUBLICATIONS

Haisma, Jan et al., "Mold-assisted nanolithography: A process for reliable pattern replication," J. Vac. Sci. Technol. B, vol. 14, No. 6, pp. 4124-4128 (Nov./Dec. 1996).

Taiwan Office Action dated Dec. 4, 2013 in corresponding Taiwan Patent Application No. 100122510.

Japanese Office Action dated Feb. 6, 2014 in corresponding Japanese Patent Application No. 2013-522153.

Japanese Office Action dated Oct. 24, 2014 in corresponding Japanese Patent Application No. 2013-522153.

Japanese Office Action dated Jul. 31, 2015 in corresponding Japanese Patent Application No. 2014-257622.

(56) References Cited

OTHER PUBLICATIONS

Japanese Office Action dated Feb. 21, 2018 in corresponding Japanese Patent Application No. 2017-079364.
Japanese Office Action issued in corresponding Japanese Patent Application No. 2019-088253, dated Feb. 10, 2020.
U.S. Office Action issued in corresponding U.S. Appl. No. 15/828,523, dated Feb. 5, 2020.
U.S. Final Office Action issued in corresponding U.S. Appl. No. 15/828,523, dated Jul. 9, 2020.

* cited by examiner

IMPRINT LITHOGRAPHY

This application is a continuation of pending U.S. patent application Ser. No. 15/828,523, filed Dec. 1, 2017, which is a continuation of U.S. patent application Ser. No. 13/812,844, filed Jan. 28, 2013, now U.S. Pat. No. 9,864,279, which is the U.S. national phase entry of PCT Patent Application No. PCT/EP2011/059831, filed Jun. 14, 2011, which claims the benefit of priority of U.S. provisional patent application 61/370,940, filed on Aug. 5, 2010, which claims the benefit of priority of U.S. provisional application 61/382,151, filed on Sep. 13, 2010, which claims the benefit of priority of U.S. provisional application 61/418,214, filed on Nov. 30, 2010, and which claims the benefit of priority of U.S. provisional application 61/426,275, filed on Dec. 22, 2010, each of the foregoing applications is incorporated herein in its entirety by reference.

FIELD

The present invention relates to imprint lithography, and in particular to an imprint lithography apparatus (or related apparatus) and/or an imprint lithography method or process (or related method or process).

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are, however, rather costly.

A potentially less costly road to smaller features that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template, and the dimensions of pattern features constituting that pattern.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows around and about protrusions on, or recessed in, the patterned surface, to adopt the topography of that patterned surface. The protrusions define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation such as UV radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets (e.g. deposited by ink jet printing) on the surface of a substrate to be patterned, but may alternatively be provided using spin coating or the like.

As with any form of lithography, it is desirable to be able to apply patterns to a substrate in an accurate and consistent manner. In some instances, it may be required to align the application of a pattern on top of and relative to a previously applied (and/or processed) pattern. This is known as an overlay requirement. It becomes increasingly difficult to meet these pattern application requirements and/or overlay requirements if there are positional errors of, or in the measurement of, the imprint lithography template with respect to a target portion (which includes an area, region, or the like) of a substrate.

SUMMARY

An imprint lithography apparatus may be prone to the above-mentioned positional errors. Accordingly, it is desirable, for example, to provide an imprint lithography apparatus which reduces the magnitude and/or frequency of such positional errors. State of the art imprint lithography apparatuses and/or methods may have one or more problems or disadvantages associated with or related to one or more of: resolution, overlay, productivity, focus, cost of goods, cost of hardware, throughput, defectivity, amongst other issues. It is desirable, for example, to provide an imprint lithography related apparatus and/or method which obviates or mitigates one or more problems or disadvantages of the art, whether identified herein or elsewhere, and/or which provides an alternative to state of the art lithography apparatuses and/or methods.

According to an aspect, there is provided an imprint lithography apparatus, comprising: a first frame to be mounted on a floor; a second frame mounted on the first frame via a kinematic coupling; an alignment sensor mounted on the second frame, for aligning an imprint lithography template arrangement with a target portion of a substrate; and one or more position sensors for measuring a position of the imprint lithography template arrangement and/or a substrate stage relative to the second frame.

The first frame may be mounted on the floor by one or more vibration isolation systems.

A portion of the second frame may extend from outside of the first frame, and into a region located within the first frame, so that the measurement of position may be undertaken relative to or using that portion of the second frame.

According to an aspect, there is provided an imprint lithography apparatus, comprising: a first frame to be mounted on a floor; a second frame mounted on the first frame via a vibration isolation system; an imprint lithography template arrangement configured, at least in use, to be mounted on the second frame via a kinematic coupling; and an alignment sensor mounted on the second frame, for aligning the imprint lithography template arrangement with a target portion of a substrate; and one or more position sensors for measuring a position of a substrate stage relative to the second frame.

The second frame may be located substantially within the first frame.

The apparatus may further comprise one or more release compensation actuators connected between the first frame and the imprint lithography template arrangement.

A point or points of connection of the one or more release compensation actuators may be linked (e.g. by proximity or other spatial relationship) to a point of connection of the kinematic coupling via which the imprint lithography template arrangement is mounted to the second frame.

The point or points of connection of the one or more release compensation actuators may be on an opposite side of the imprint lithography template arrangement to the point of connection of the kinematic coupling via which the imprint lithography template arrangement is mounted to the second frame.

The one or more release compensation actuators may extend through the second frame.

According to either the first or second aspects of the invention, the following features may be used in addition to, or as an alternative to, those features already described above:

The substrate stage may be a five degree of freedom short stroke substrate stage (which includes six degrees of freedom or greater). The substrate stage may be a five degree of freedom (which includes six degrees of freedom or greater) isolated (e.g. spatially isolated or separated) short stroke substrate stage. The substrate stage may additionally comprise or be a three degree of freedom long stroke substrate stage.

The substrate stage may be capable of translational long stroke movement along two axes parallel to a plane of the substrate (x and y axes), and along an axis perpendicular to that plane (z axis).

The substrate stage may be capable of rotational movement about the two axes that are parallel to the plane of the substrate (rotation about x and y axes).

The substrate stage may be capable of rotational movement about the two axes that are parallel to the plane of the substrate (rotation about x and y axes), and about the axis that is perpendicular to that plane (rotation about z axis), and the substrate stage may be capable of translational short stroke movement along the two axes parallel to the plane of the substrate (x and y axes).

The imprint lithography template arrangement may be capable of translational short stroke movement along the two axes parallel to the plane of the substrate (x and y axes), and the imprint lithography template arrangement may be capable of rotational movement about the axis that is perpendicular to that plane (rotation about z axis).

The substrate stage may be capable of translational long stroke movement along two axes parallel to a plane of the substrate (x and y axes).

The substrate stage may be capable of rotational movement about the two axes that are parallel to the plane of the substrate (rotation about x and y axes).

The substrate stage may be capable of rotational movement about the two axes that are parallel to the plane of the substrate (rotation about x and y axes), and about the axis that is perpendicular to that plane (rotation about z axis), and the substrate stage may be capable of translational short stroke movement along the two axes parallel to the plane of the substrate (x and y axes).

The imprint lithography template arrangement may be capable of long stroke movement along an axis perpendicular to the plane of the substrate (z axis).

The imprint lithography template arrangement may be capable of translational short stroke movement along the two axes parallel to the plane of the substrate (x and y axes), and the imprint lithography template arrangement may be capable of rotational movement about the axis that is perpendicular to that plane (rotation about z axis).

An object referred to herein as being capable of movement or rotation will be understood to encompass both movement or rotation of the object my some inherent driving means, and movement or rotation by a separate (e.g. independent) driving means.

The apparatus may further comprise one or more heat shields for shielding the second frame.

The second frame may be formed from a material with a low coefficient of thermal expansion, for example less than or substantially equal to 1 μm/m·K and/or a high thermal conductance, for example greater than 20 W/(m·K). The apparatus alternatively or additionally comprise a cooling or thermal conditioning system to cool or thermally condition the second frame. The second frame may preferably be formed from aluminium.

The second frame may be constructed and/or arranged to have internal dynamical modes that are of a high frequency (e.g. typically 100 Hz or higher).

The substrate stage may be coupled to the first frame, for example by being in direct or indirect connection (e.g. via an intermediate structure) with the first frame.

The substrate stage may be, or may comprise, or may form a part of one or more of: a substrate holder; a positioner of the substrate; a positioner of a substrate holder.

The first frame may be, or may be referred to as a base frame, and/or wherein the second frame may be, or may be referred to as a metrology frame.

According to an aspect, there is provided an imprint lithography apparatus, comprising: a base frame; a metrology frame; an imprint lithography template arrangement in connection with the base frame or the metrology frame via one or more kinematic couplings and one or more release compensation actuators.

One or more kinematic couplings may be located in series with the one or more release compensation actuators.

A point or points of connection of the one or more release compensation actuators may be on an opposite side of the imprint lithography template arrangement to a point or points of connection of the kinematic couplings.

According to an aspect, there is provided an imprint lithography method for using an imprint lithography apparatus, the apparatus comprising: a base frame; a metrology frame; and an imprint lithography template arrangement; and the method comprising: using the imprint lithography arrangement to imprint a pattern into a layer of imprintable medium provided on a substrate, when the imprint lithography arrangement is in connection with the metrology frame; fixing the pattern provided in the imprintable medium; moving the imprint lithography template arrangement to disconnect the imprint lithography arrangement from the metrology frame, and connecting the imprint lithography template arrangement to the base frame; and releasing the imprint lithography template arrangement from the substrate.

The imprint lithography template arrangement may be moved by movement of a substrate stage that holds the substrate.

Movement of the substrate will cause movement of the imprint lithography template arrangement, because the fixing of the pattern will cause the imprint lithography template arrangement to be at least partially attached to the substrate, via the fixed pattern. Movement may be toward the imprint lithography template arrangement, which may make it easier to move the imprint lithography template arrangement (e.g. moving the substrate away from the imprint lithography template arrangement may result in the substrate at least partially releasing from the imprint lithography template arrangement, which may be undesirable, at least at this stage of the method).

Releasing the imprint lithography template arrangement may comprise holding the imprint lithography template arrangement using an actuator in connection with the base frame, and pulling the substrate away from the imprint lithography template arrangement via movement of the substrate stage that holds the substrate.

The imprint lithography template arrangement may be biased toward (e.g. into) connection with the metrology frame. The aforementioned movement of the imprint lithography template arrangement may at least partially overcome the bias.

The actuator may be (additionally) capable of biasing the imprint lithography template arrangement toward (e.g. into) connection with the metrology frame.

According to an aspect, there is provided an imprint lithography apparatus, comprising: a base frame; a metrology frame connected to the base frame; and an imprint lithography template arrangement; the imprint lithography template arrangement being movable between a first configuration and a second configuration, the first configuration being defined by the imprint lithography template arrangement being connected to the metrology frame, and the second configuration being defined by the imprint lithography template arrangement being disconnected from the metrology frame and connected to the base frame.

According to an aspect, there is provided an imprint lithography template arrangement (e.g. an imprint lithography template) clamping configuration, the clamping configuration including at least one clamp that comprises: a base region; a burl extending from the base region, and arranged in use to come into contact with the imprint lithography template arrangement; a space that surrounds the burl; one or more seal walls extending from the base region and surrounding the space that surrounds the burl, the burl extending further from the base region than the one or more seal walls; the one or more seal walls being configured to provide, in use, an at least a partial seal with the imprint lithography template arrangement, when the space is at a lower pressure than ambient pressure; and wherein the burl is at least partially flexible in a direction parallel to a plane of the imprint lithography template arrangement (i.e. perpendicular or orthogonal to the length of the burl), to allow for movement, expansion or compression of the imprint lithography template arrangement, without slip of the burl relative to the imprint lithography template arrangement.

The burl may be: at least 1 mm long; at least 5 mm long; at least 5-10 mm; at least 10 mm long; and/or less than 100 mm long. Such a length of burl may ensure that the burl is sufficiently flexible in a direction perpendicular or orthogonal to its length.

The burl may extend: 1-10 μm further from the base region than the one or more seal walls; or 3-5 μm further from the base region than the one or more seal walls. This may provide a gap of similar size between the seal walls and the imprint lithography template arrangement sufficient for a seal to be established or maintained, while at the same time preventing contact of the walls with the imprint lithography template arrangement, which might otherwise generate contamination, friction and/or distortion.

The clamp may comprise a plurality of burls, constructed and arranged to be distributable (i.e. in use) around a periphery of the imprint lithography template arrangement.

The one or more seal walls may comprise: an outer seal wall that extends around an outer perimeter of a region containing the burl or burls; and an inner seal wall that extends around an inner perimeter of the region containing the burl or burls.

The clamping configuration may comprise a plurality of the described clamps, constructed and arranged so as to be disposable (i.e. in use) around a periphery of the imprint lithography template arrangement.

The clamp or clamping configuration may be, or may form a part of, another imprint lithography template arrangement (e.g. an imprint lithography template holder).

According to an aspect, there is provided a method of releasing an imprint lithography template from a substrate that is held on a substrate stage, the method comprising: pulling the substrate and the imprint lithography template away from one another (which could involve moving one or both of the substrate and the imprint lithography template, for example by movement of respective holding stages, or holders); and applying a rotation moment to one or both of the imprint lithography template and substrate toward the other of the imprint lithography template and substrate, such that at a radial extremity of an interface between the imprint lithography template and the substrate, there is a cumulative force acting on the substrate that results in the substrate being held on the substrate stage. This may be described as the rotation being such that there is pressing force into the substrate at the radial extremity.

The pulling and applying of the rotation moment (i.e. the rotating) may be undertaken at the same time. The pulling and rotating may be undertaken using the same apparatus. The pulling and rotating may be undertaken in the same process. The pulling may result in the rotation. The rotation may result in the pulling.

A relationship between a pulling force, or a component thereof, acting through a center of the imprint lithography template, and a moment associated with the rotation is defined as: $F<M/b$, where F is the pulling force, or the component thereof, acting through the center of the imprint lithography template, M is the moment induced by the rotation, and b is a radial distance from the center of the imprint lithography template to the radial extremity of the interface between the imprint lithography template and the substrate.

The method may be undertaken at a peripheral region of the substrate, where holding forces provided by a substrate stage might be lower than at, for example, a more central region of the substrate.

According to an aspect, there is provided an imprint lithography apparatus comprising: an imprint lithography template holder for holding an imprint lithography template; a substrate stage for holding a substrate; wherein, during release of an imprint lithography template from a substrate, one or both of the imprint lithography template holder and substrate stage are constructed and arranged to be movable to: pull the substrate and the imprint lithography template away from one another; and apply a rotation moment to one or both of the imprint lithography template and substrate toward the other of the imprint lithography template and substrate, such that at a radial extremity of an interface between the imprint lithography template and the substrate, there is a cumulative force acting on the substrate that results in the substrate being held on the substrate stage.

According to an aspect, there is provided an actuation arrangement for positioning and/or deforming an imprint lithography template arrangement, the arrangement comprising: a first actuator, locatable, in use, on a first side of the imprint lithography template arrangement; a second actuator, locatable, in use, on a second, opposite side of the imprint lithography template arrangement; and a signal amplifier for amplifying a control signal applicable to both the first actuator and the second actuator.

The first actuator may be locatable directly opposite the second actuator.

The actuation arrangement may comprise: a plurality of first actuators, locatable, in use, on a first side of the imprint lithography template arrangement; a plurality of second actuators, locatable, in use, on a second, opposite side of the imprint lithography template arrangement; and a signal amplifier for amplifying a control signal applicable to directly opposing actuators of the pluralities, or for amplifying a control signal applicable to groups of actuators locatable on opposite sides of the imprint lithography template arrangement.

Each actuator may be a piezoelectric actuator or a Lorentz actuator.

The actuation arrangement may form part of an imprint lithography template holder (or, more generally, an imprint lithography template arrangement), which includes the actuation arrangement being an imprint lithography template holder (or, more generally, an imprint lithography template arrangement).

The term 'locatable' used to describe the position of actuators may include 'located'. For example, in some embodiments, an imprint lithography template arrangement (e.g. an imprint lithography template holder) may be or comprise the actuation arrangement, and this imprint lithography template arrangement may be in permanent, or long-term, connection with the imprint lithography template. The actuators will then be located on one or more sides of the imprint lithography template.

According to an aspect, there is provided an imprint lithography method, comprising: imprinting an imprint lithography template into a layer of imprintable medium provided on a substrate to form a pattern in that layer of imprintable medium; controlling a position (which includes orientation) or deformation of the imprint lithography template relative to the substrate (e.g. a target portion thereof) when the imprint lithography template is imprinted into the imprintable medium; and fixing the pattern provided in the layer of imprintable medium; wherein controlling the position or deformation of the imprint lithography template relative to the substrate comprises: i) undertaking relatively high bandwidth control at a first level when the imprintable medium is in an unfixed, substantially liquid and/or flowable state; then/followed by ii) undertaking higher bandwidth control at a second level, higher than the first level, when the imprintable medium is in an intermediate state, in-between the unfixed, substantially liquid and/or flowable state, and a fixed, substantially solid state; then/followed by iii) relatively low bandwidth control when the imprintable medium is in a fixed, substantially solid state.

A transition between the higher bandwidth control at the second level and the relatively low bandwidth control will occur when the imprintable medium is in an intermediate state.

A transition between the higher and higher bandwidth control may also occur when the imprintable medium is in an intermediate state.

Controlling a position or deformation of the imprint lithography template relative to the substrate may comprise control of one or more servomechanisms.

Controlling a position of the imprint lithography template relative to the substrate when the imprint lithography template is imprinted into the imprintable medium may comprise aligning, or maintaining alignment of, the imprint lithography template arrangement relative to a target portion the substrate.

Controlling a position or deformation of the imprint lithography template relative to the substrate may comprise controlling a position or deformation of the imprint lithography template, or the substrate, or both (in series or parallel) the imprint lithography template relative and the substrate.

According to an aspect, there is provided an actuation arrangement for positioning and/or deforming an imprint lithography template arrangement, the arrangement comprising: one or more actuators, locatable, in use, around the imprint lithography template arrangement; fixed abutment points for fixing three degrees of freedom of the imprint lithography template arrangement, the three degrees of freedom being: translation along a first axis parallel to a plane of the imprint lithography template arrangement; translation along a second axis, perpendicular to the first axis and parallel to the plane of the imprint lithography template arrangement; and rotation about a third axis, perpendicular to the first and second axes; the actuation arrangement further comprising: a controller for controlling a force provided by the one or more actuators to the imprint lithography template arrangement, the controller being configured to ensure that the provided force is such that a cumulative force acting along the first axis, second axis, and about the third axis, is minimal.

The actuation arrangement may further comprise a biasing member, arranged to bias, in use, the imprint lithography template arrangement into contact with the fixed abutment points (i.e. to fix, or facilitate the fixing of, the three degrees of freedom discussed above).

The aforementioned cumulative force may be described as minimal in that that a force applied to one, more or all fixed abutment points (or along or about the aforementioned axes), is: less than 5% of a total force applied to the imprint lithography template arrangement; or less than 4% of a total force applied to the imprint lithography template arrangement; or less than 3% of a total force applied to the imprint lithography template arrangement; or less than 2% of a total force applied to the imprint lithography template arrangement; or less than 1% of a total force applied to the imprint lithography template arrangement; or substantially (i.e. plus or minus 0.5%) 1% of a total force applied to the imprint lithography template arrangement; or substantially 0% (up to 0.5%) of a total force applied to the imprint lithography template arrangement.

The imprint lithography template arrangement may be substantially rectangular (which includes substantially square), and the actuation arrangement may comprise three fixed abutment points arranged such that: two fixed abutment points are locatable along one side of the imprint lithography template arrangement; and one fixed abutment point is locatable along an adjacent side of the imprint lithography template arrangement.

The controller may be configured to ensure that the provided force is such that the cumulative force acting along the first axis, second axis, and about the third axis, is minimal during a deformation control mode (i.e. a mode in which deformation of the imprint lithography template arrangement is taking place).

The actuation arrangement may form a part an imprint lithography template holder.

The aforementioned imprint lithography template arrangement might be an imprint lithography template, or an imprint lithography template holder that is holding such a template.

According to an aspect, there is provided an method of controlling a position and/or deformation of an imprint lithography template arrangement, the method comprising:

fixing three degrees of freedom of the imprint lithography template arrangement, the three degrees of freedom being: translation along a first axis parallel to a plane of the imprint lithography template arrangement; translation along a second axis, perpendicular to the first axis and parallel to the plane of the imprint lithography template arrangement; and rotation about a third axis, perpendicular to the first and second axes; and controlling a force provided to the imprint lithography template arrangement to control a position or deformation of the imprint lithography template arrangement, ensuring that the provided force is such that a cumulative force acting along the first axis, second axis, and about the third axis, is minimal.

The term 'locatable' used to describe the position of actuators may include 'located'. For example, in some embodiments, an imprint lithography template arrangement (e.g. an imprint lithography template holder) may be or comprise the actuation arrangement, and this imprint lithography template arrangement may be in permanent, or long-term, connection with the imprint lithography template. The actuators will then be located on one or more sides of the imprint lithography template.

According to an aspect of the present invention, there is provided an imprint lithography apparatus, comprising: an imprint lithography template arrangement for use in imprinting a pattern into a layer of imprintable medium provided on a substrate; one or more actuators for positioning and/or deforming the imprint lithography template arrangement; a substrate stage for holding the substrate; an alignment sensor for aligning the imprint lithography template arrangement relative to a target portion of the substrate, the alignment sensor having a first detection bandwidth; a relative position sensor for measuring a relative position between the imprint lithography template arrangement and the substrate, the relative position sensor having a second detection bandwidth, greater than the first detection bandwidth of the alignment sensor.

The alignment sensor might have a detection bandwidth of: less than 10 Hz; or less than 5 Hz.

The relative position sensor might have a detection bandwidth of: greater than 100 Hz; or greater than 200 Hz.

The one or more actuators may comprise, or be in connection with, a force sensor for measuring, directly or indirectly, a force applied by the one or more actuators.

The force sensor may have a third detection bandwidth, that third detection bandwidth being greater than the first detection bandwidth of the alignment sensor.

The force sensor may be a position or current sensor.

According to an aspect, there is provided an imprint lithography method, comprising: controlling a position and deformation of the imprint lithography template relative to the substrate to achieve a position and deformation substantially as intended; and, when the imprint lithography template is positioned and deformed substantially as intended, reducing a control bandwidth related to the deformation of the imprint lithography template. This ensures that high frequency variation in the deformation is not implemented. This may be advantageous, because a low bandwidth alignment sensor might not be able to detect changes in position that results from such high frequency variation, which might otherwise cause patterns to be applied inaccurately.

The control bandwidth is an implementation bandwidth related to the implementation of the deformation of the imprint lithography template (e.g. a control loop in which actuators for provided a deformation force form a part).

The bandwidth may be reduced to: less than 100 Hz; less than 50 Hz; less than 10 Hz; less than 5 Hz; and/or, more generically, a bandwidth that is in the detection bandwidth of an alignment sensor used in the alignment of the imprint lithography template arrangement with a target portion of the substrate.

The method may further comprise imprinting the imprint lithography template into a layer of imprintable medium provided on a substrate to form a pattern in that layer of imprintable medium; and wherein the controlling of the position and the deformation is undertaken: before the imprinting; or during the imprinting, and before the pattern is fixed into a substantially solid state; or before and during the imprinting, and before the pattern is fixed into a substantially solid state.

According to an aspect, there is provided an imprint lithography apparatus, comprising: an imprint lithography template arrangement for use in imprinting a pattern into a layer of imprintable medium provided on a substrate; one or more actuators for positioning and/or deforming the imprint lithography template arrangement; a substrate stage for holding the substrate; an alignment sensor for aligning the imprint lithography template arrangement relative to a target portion of the substrate, the alignment sensor having a first detection bandwidth; wherein the one or more actuators comprise, or is or are in connection with, a force sensor for measuring, directly or indirectly, a force applied by the one or more actuators, and wherein the force sensor has a second detection bandwidth, that second detection bandwidth being greater than the first detection bandwidth of the alignment sensor.

The apparatus may further comprises a control arrangement, the control arrangement being configured to receive an output from the force sensor, and also being configured to convert this output into a position (e.g. a relative or absolute position (e.g. relative to a fixed part of the apparatus, such as a metrology frame), or a change or shift in position) of the imprint lithography template arrangement.

The alignment sensor may have a detection bandwidth of: less than 10 Hz; or less than 5 Hz.

The or each force sensor has a detection bandwidth of: greater than 50 Hz; or greater than 100 Hz; or greater than 200 Hz.

Each actuator may comprise, or be in connection with, a force sensor.

The or each force sensor may be a position or current sensor.

A detection bandwidth is to be understood as a frequency at which changes (e.g. in position) can be detected, as opposed to an implementation bandwidth, which may be understood to be a frequency at which changes (e.g. in position) can be implemented. A control bandwidth may be understood as comprising a detection bandwidth and/or an implementation bandwidth, depending on the context in which the term is used.

According to an aspect, there is provided an method of aligning an imprint lithography template arrangement relative to a target portion of a substrate, the method comprising: using an alignment sensor to align the imprint lithography template arrangement relative to a target portion of the substrate, the alignment sensor having a first detection bandwidth; using one or more force sensors, constituting a part of, or being in connection with one or more actuators, to determine a force applied to the imprint lithography template arrangement by the one or more actuators, the force sensors having a second detection bandwidth, that second detection bandwidth being greater than the first detection bandwidth of the alignment sensor; and determining a position, or change in position, of the imprint lithography template arrangement from the determination of the force, and using that position, or change in position, in the alignment of the imprint lithography template arrangement.

The use of the alignment sensor and the use of the force sensor may be undertaken in series or parallel.

An alignment sensor may be used to determine absolute changes in position, (e.g. relative to a fixed point or part of an imprint lithography apparatus, such as a reference or metrology frame), whereas information from a force sensor may be used to determined a relative position, or change in position (e.g. of an imprint lithography template arrangement, such as an imprint lithography template).

According to an aspect, there is provided an imprint lithography apparatus, comprising: an imprint lithography template arrangement for use in imprinting a pattern into a layer of imprintable medium provided on a substrate; a substrate stage to hold the substrate; and a gas dispensation arrangement to provide a gaseous atmosphere in which the imprinting of the pattern is to take place, the gas dispensation arrangement configured to dispense gas in an asymmetric manner in the provision of the gaseous atmosphere.

The gas dispensation arrangement may be configured to dispense gas in an asymmetric manner in or into a region located in-between the imprint lithography template arrangement and the substrate holder and/or substrate.

The gas dispensation arrangement may comprise a plurality of outlets that are asymmetrically distributed, or asymmetrically distributable, around the imprint lithography template arrangement.

The gas dispensation arrangement may comprise a plurality of outlets distributed, or distributable, around the imprint lithography template arrangement, the gas dispensation arrangement configured to dispense gas at different pressures at different outlets, to thus dispense gas in an asymmetric manner in the provision of the gaseous atmosphere.

The gas dispensation arrangement may comprise a plurality of outlets distributed, or distributable, around the imprint lithography template arrangement, the gas dispensation arrangement configured to dispense gas at different times at different outlets, to thus dispense gas in an asymmetric manner in the provision of the gaseous atmosphere.

The gas dispensation arrangement may be configured to dispense helium.

According to an aspect, there is provided an imprint lithography method, comprising: providing a gaseous atmosphere in which imprinting of a pattern into a layer of imprintable medium provided on a substrate is to take place; wherein the gas constituting the gaseous atmosphere is dispensed in an asymmetric manner.

According to an aspect, there is provided an imprint lithography apparatus, comprising: an imprint lithography template arrangement for use in imprinting a pattern into a layer of imprintable medium provided on a substrate, the imprint lithography template arrangement comprising, at least in use, an imprint lithography template provided with a patterned region to provide the pattern; a substrate stage to hold the substrate; and a contamination barrier dividing the apparatus into at least two regions: i) a first, relatively unclean, region in which is located a movable element; and ii) a second, relatively clean, region in which is located the substrate stage and, if holding a substrate, the substrate itself, and the patterned region of the imprint lithography template.

The first region may be a generally upper region of the apparatus, and the second region may be a generally lower region of the apparatus.

At least a portion of a reverse side of the imprint lithography template, opposite to the side on which the patterned region is provided, may be located or locatable in the second region.

In the vicinity of the at least a portion of the reverse side of the imprint lithography template, the contamination barrier may be formed from a material substantially transparent to actinic radiation.

The contamination barrier may comprise a tray or container located between fixed parts of the imprint lithography apparatus, to catch contamination.

The contamination barrier may comprise a flexible member located between movable parts of the imprint lithography apparatus, and/or between a fixed part and a movable part of the imprint lithography apparatus.

At least a portion of the contamination barrier may substantially surround the imprint lithography template arrangement.

The contamination barrier may extend generally across the imprint lithography apparatus.

The movable element may be configured for use in conjunction with the imprint lithography template in providing a pattern in the layer of imprintable medium.

The movable element may comprise one or more selected from, or an actuator for one or more selected from, the following: a part of the imprint lithography template arrangement, such as an imprint lithography template holder and/or an imprint lithography template positioner; an imprint lithography template holder; an imprint lithography template positioner; a camera; a sensor; and/or a radiation source.

According to an aspect of the invention, there is provided an imprint lithography apparatus, comprising: an imprint compartment, in which is located an imprint lithography template arrangement for use in imprinting a pattern into a layer of imprintable medium provided on a substrate, and a substrate stage to hold the substrate; and a print head compartment in connection with the imprint compartment via a sealed or sealable access port, the print head compartment comprising an actuator to move a print head from the imprint compartment into the print head compartment, and/or to move a print head into the imprint compartment from the print head compartment.

The actuator may be arranged to move an arm, the arm arranged to hold the print head.

The actuator may be located below the arm.

The arm may be fully locatable within the print head compartment.

The print head compartment may comprise a gas shower located adjacent to the access port.

The print head compartment may comprise a further, sealable, access port to provide access to a print head located or locatable in the print head compartment.

At least in use, the imprint compartment may be maintained at a higher gas pressure than a gas pressure within the print head compartment.

According to an aspect, there is provided an imprint lithography apparatus, comprising: a substrate handling system to hold and/or move a substrate, onto which a layer of imprintable medium is to be provided; wherein the substrate handling system is configured to also function as an imprint lithography template handling system.

The substrate handling system may comprise: a substrate handler to load a substrate onto a substrate stage; and/or a substrate stage.

The substrate handling system may, in use, handle a dummy substrate, the dummy substrate comprising a standard substrate and, in connection with the standard substrate, an arrangement to accommodate an imprint lithography template, the arrangement located, in use, on an upper side of the standard substrate.

According to an aspect, there is provided a dummy substrate for use in handling an imprint lithography template, the dummy substrate having a standard substrate and, in connection with the standard substrate, an arrangement to accommodate an imprint lithography template, the arrangement being located, in use, on an upper side of the standard substrate.

The arrangement to accommodate an imprint lithography template may comprise an abutment surface, and a biasing element to bias the imprint lithography template into contact with the abutment surface.

The abutment surface and/or the biasing element may be arranged to contact a base region of the imprint lithography template (e.g. as opposed to a patterned region, or a mesa region on which the patterned region is provided).

According to an aspect, there is provided an imprint lithography method, comprising: in an imprint lithography apparatus, using a substrate handling system to handle, directly or indirectly, an imprint lithography template.

The substrate handling system may handle the imprint lithography template by handling a dummy substrate that is configured to accommodate the imprint lithography template.

The imprint lithography template may be loaded on the dummy substrate with a patterned region of the imprint lithography template directed towards the dummy substrate.

The features described above in relation to any one or more aspects of the invention may be used in addition to, in combination with, in replacement of, or as an alternative to one or more features described in relation to one or more other aspects of the invention. Definitions or elaborations provided in respect of one or more features of one aspect of the invention may be applicable to the same or similar features (in terms of name or function) of others aspects of the present invention.

An imprint lithography template arrangement may be, for example: an imprint lithography template holder, an imprint lithography template holder holding an imprint lithography template, the imprint lithography template itself, or a frame for holding or being in connection with an imprint lithography template holder and/or an imprint lithography template.

BRIEF DESCRIPTION OF THE DRAWINGS

Specific embodiments of the invention will be described with reference to the accompanying Figures, in which.

DETAILED DESCRIPTION

Figure 1A:
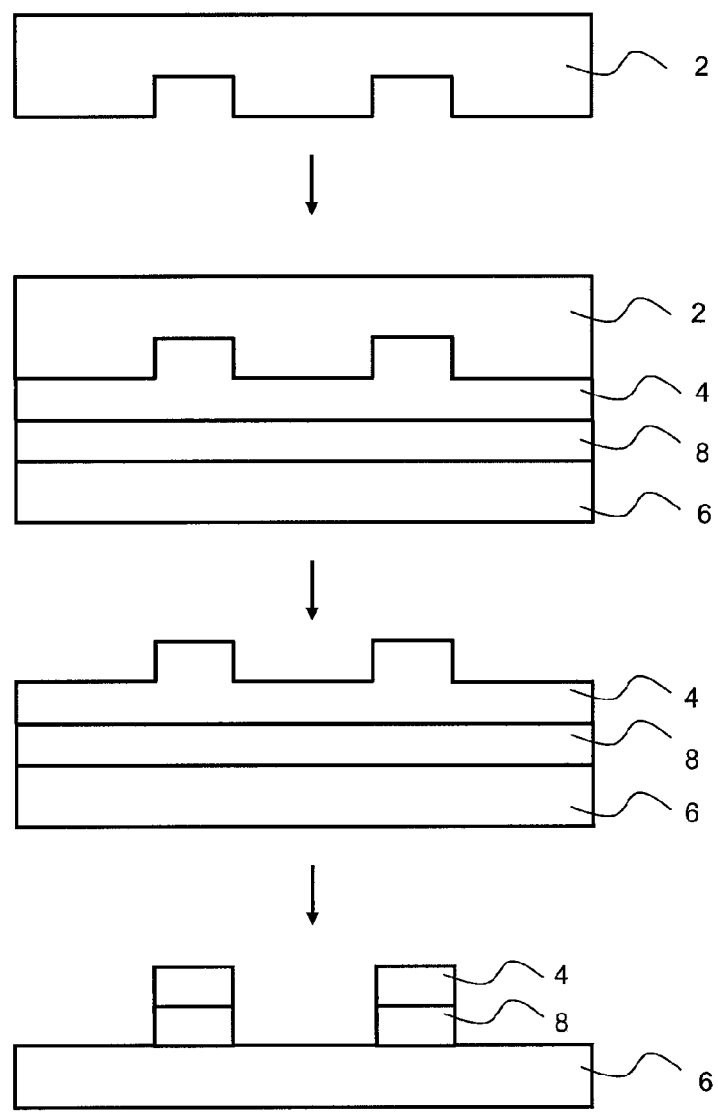
FIGS. 1a and 1b schematically depict examples of, respectively, hot imprint lithography, and UV imprint lithography.
Figure 1B:
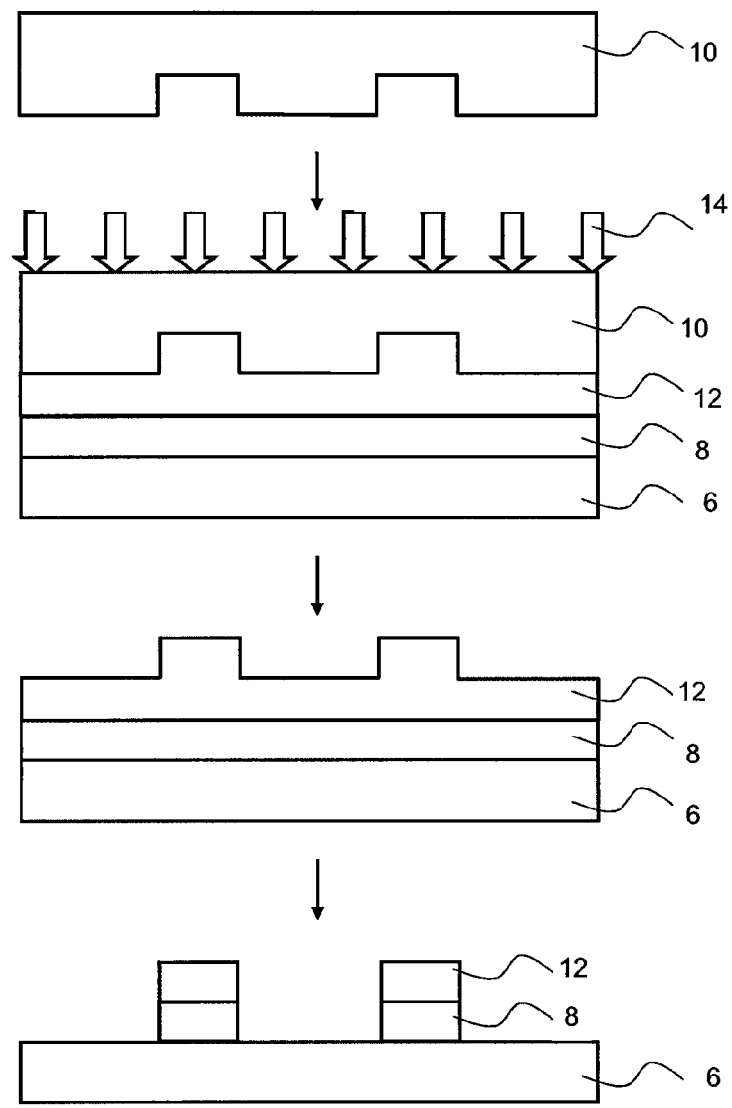

Examples of two known approaches to imprint lithography are schematically depicted in FIGS. 1a to 1b.

FIG. 1a shows an example of so-called hot imprint lithography (sometimes additionally or alternatively referred to as hot embossing). In a typical hot imprint lithography process or method, an imprint lithography template 2 is imprinted into a thermosetting or a thermoplastic imprintable medium 4, which has been provided on a surface of a substrate 6. The imprintable medium 4 may, for example, be or comprise resin. The imprintable medium 4 may be, for instance, spin coated and baked onto the substrate surface or, as in the example illustrated, onto a planarization and transfer layer 8 of the substrate 6. When a thermosetting polymer resin 4 is used, the resin 4 is heated to a temperature such that, upon contact with the imprint lithography template 2, the resin 4 is sufficiently flowable to flow into and/or around pattern features defined on the imprint lithography template 2. The temperature of the resin 4 is then increased to thermally cure (crosslink) the resin 4 so that it solidifies and irreversibly adopts a desired pattern (related, of course, to the pattern features of the imprint lithography template 2). The imprint lithography template 2 may then be removed and the patterned resin 4 cooled. In hot imprint lithography employing a layer of thermoplastic polymer resin, the thermoplastic resin is heated so that it is in a freely flowable state immediately prior to imprinting with the imprint lithography template. It may be necessary to heat thermoplastic resin to a temperature considerably above the glass transition temperature of the resin. The imprint lithography template is brought together with the flowable resin and then cooled to below its glass transition temperature with the imprint lithography template in place to harden the pattern. Thereafter, the template is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1b shows an example of UV imprint lithography, which involves the use of a transparent or translucent imprint lithography template 10 which is transmissive to UV radiation and a UV-curable liquid as imprintable medium 12 (the term "UV" is used here for convenience but should be interpreted as including any suitable actinic radiation for curing the imprintable medium). A UV curable liquid is often less viscous than the thermosetting and/or thermoplastic resin used in hot imprint lithography and consequently may flow much faster to fill imprint lithography template pattern features. A quartz template 10 is applied to a UV-curable resin as the imprintable medium 12 in a similar manner to the process of FIG. 1a. However, instead of using heat or temperature cycling as in hot imprint lithography, the pattern is frozen by curing the imprintable medium 12 with UV radiation 14 that is applied through the quartz imprint lithography template 10 onto the imprintable medium 12. After removal of the imprint lithography template 10, the imprintable medium 12 is etched (and/or undergoes other further processing) to, for example provide pattern features in the substrate 6. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Imprint Lithography Apparatus Configuration

Figure 2:
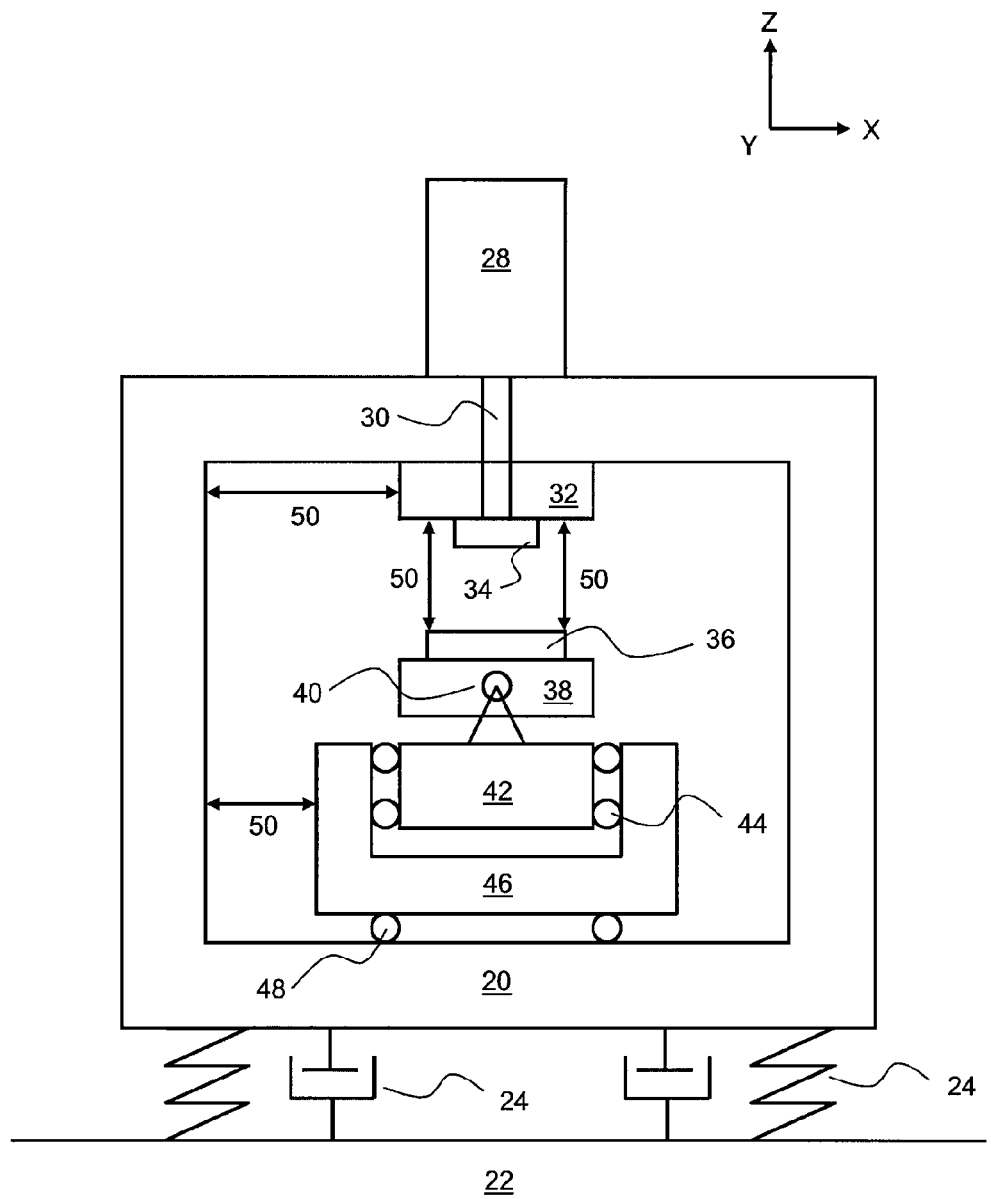
FIG. 2 schematically depicts a configuration of an imprint lithography apparatus.

FIG. 2 schematically depicts a configuration for an imprint lithography apparatus. The imprint lithography apparatus comprises a first frame 20, which may be to as a base frame. The first frame 20 is mounted on a floor 22 via one or more gas (e.g., air) mounts 24. The gas mounts 24 are used to inhibit or reduce vibrations passing from the floor 22 to the first frame 20.

Mounted to the first frame 20 is an alignment sensor 28. Extending from the alignment sensor 28 and through the first frame 20 is a conduit 30 to facilitate alignment. Mounted on an opposite side of the first frame 20 (in a region defined by the first frame 20), at an opposite end of the conduit 30, is an imprint lithography template holder 32. The imprint lithography template holder 32 holds in position an imprint lithography template 34. The alignment sensor 28 is used to align the imprint lithography template 34 with a substrate 36, or a target portion thereof.

The substrate 36 is located on (and may be held by) a first part of a substrate stage 38. The first part of the substrate stage 38 may be rotatable about x and y axes, parallel to the plane of the substrate 36, by way of one or more first actuators 40. The first actuator 40 is connected to a second part of the substrate stage 42. Movement of the second part of the substrate stage 42 along a z axis, perpendicular to a plane of the substrate, may be achieved by appropriate use of one or more second actuators 44. The second actuator 44 may be disposed, for example, between the second part of the substrate stage 42 and a surrounding third part of the substrate stage 46. Translational movement of the third part of the substrate stage 46 along the x and y axes, as well as rotation about the z-axis, may be achieved by appropriate use of one or more third actuators 48. The third actuator 48 is disposed in-between the third part of the substrate stage 46 and the first frame 20. The substrate stage as a whole is thus in connection with, and is thus coupled to, the first frame 20.

It will be appreciated from the above description, and FIG. 2, that the substrate 36 may be moved in or with 6 degrees of freedom: along the x, y and z axes, and rotated about the x, y and z axes.

In order to accurately move or position the substrate 36 relative to the imprint lithography template 34, one or more measurements 50 may be or are undertaken taken to determine, for example: the position of the imprint lithography template holder 32 or template 34 relative to the first frame 20; the position of the substrate 36 relative to the imprint lithography template holder 32 or template 34; and/or the position of the substrate stage (or, for example, a third, second, or first part thereof) relative to the first frame 20.

In some circumstances, where highly accurate application of patterns to the imprint lithography template is not required (e.g. where micrometer positional accuracy is required), the configuration of the imprint lithograph apparatus shown in FIG. 2 may be satisfactory. However, it is considered that imprint lithography will find application in fields where pattern features that are to be applied to a substrate, and the alignment between patterns or features thereof, will have or require a resolution of the order of nanometers, a few tens of nanometers, and perhaps even below 10, 5, 3, 2 or 1 nanometers. Corresponding positional and/or alignment accuracy is required, and the configuration shown in FIG. 2 may not be able to achieve this. For instance, deformation of the first frame 20 may affect the accuracy and/or consistency of positional measures, which can result in a degradation in patterning accuracy and/or overlay performance. Deformation of the first frame 20 can be caused by any of a number of factors, for example, a release force imparted on the first frame 20 when the imprint lithography template 34 is released from imprintable medium provided on the substrate 36 (referred to generically as release of the template 34 from the substrate 36), thermal disturbance, floor vibration, and/or movement of the substrate stage, or a part thereof.

It is desirable to provide a configuration of, or for, an imprint lithography apparatus which obviates or mitigates one or more of these, or other, problems.

One or more of the above mentioned, or other, problems can be obviated or mitigated in accordance with one or more configurations for an imprint lithography apparatus in accordance with an embodiment of the present invention.

In accordance with an embodiment of the present invention, there is provided an imprint lithography apparatus which comprises a first frame to be mounted on a floor. A second frame is also provided, and this second frame is mounted on the first frame by kinematic coupling. An alignment sensor is provided which is mounted on the second frame, and is used to align an imprint lithography template arrangement (e.g. an imprint lithography template, or an imprint lithography template holder, which may or may not hold an imprint lithography template) with a target portion of a substrate. One or more position sensors are also provided to measure the position of the imprint lithography template arrangement and/or a substrate stage relative to the second frame.

The use of a second frame (which may be referred to as a metrology frame, as opposed to the first frame, which may be referred to as a base frame) that is kinematically coupled to the first frame reduces the impact of any deformation of the first frame on the second frame, resulting in more accurate positional measurements.

In accordance with a related embodiment, there is provided an imprint lithography apparatus which comprises a first frame mounted on a floor. A second frame is mounted on the first frame via a vibration isolation system. The vibration isolation system prevents, or at least inhibits, the transmission of both low and high frequency vibrations from the floor, and from the first frame and to the second frame. The apparatus further comprises, at least in use, an imprint lithography template arrangement mounted on the second frame via a kinematic coupling. The kinematic coupling prevents or reduces deformation of the imprint lithography template arrangement being transmitted to the second frame. The apparatus further comprises an alignment sensor mounted on the second frame, to align the imprint template arrangement with a target portion of the substrate. One or more position sensors are also provided to measure the position of a substrate stage relative to the second frame.

The combined use of the vibration isolation system and kinematic coupling allows positional measurements to be undertaken more accurately and consistently, and therefore allows patterns to be applied to a substrate more accurately and more consistently. The mounting of the alignment sensor on the second frame (in this embodiment, or any other embodiment) may facilitate such accurate and consistent positional measurement, and thus accurate and consistent pattern application.

Embodiments of the present invention will now be described, by way of example only, with reference to FIGS. 3 and 4. For consistency, like features appearing in these Figures (or indeed earlier Figures) have been given the same reference numerals.

Figure 3:
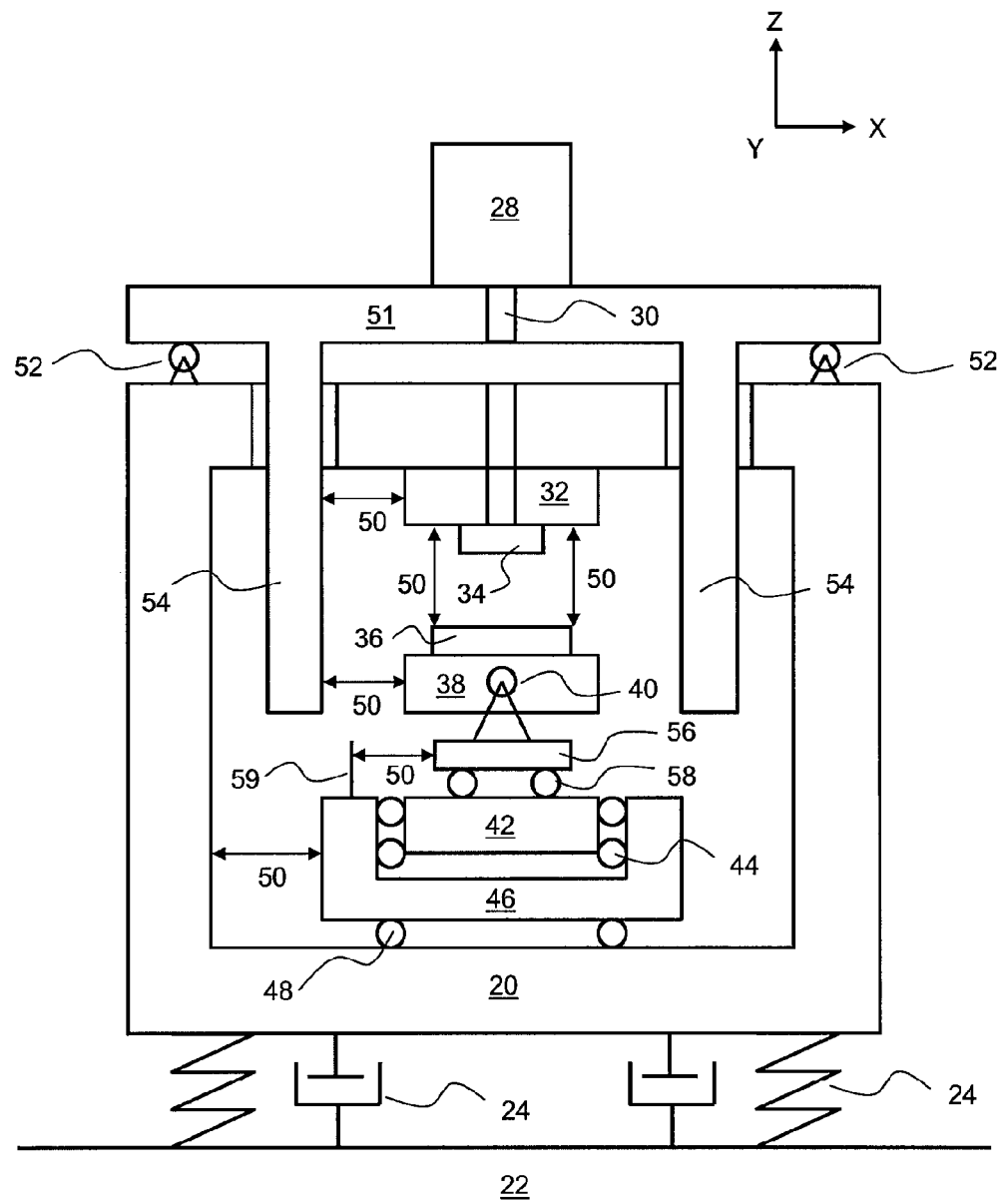
FIG. 3 schematically depicts a configuration of an imprint lithography apparatus in accordance with an embodiment of the present invention.

FIG. 3 shows an imprint lithography apparatus having many of the features shown with reference to FIG. 2. However, and in contrast, the imprint lithography apparatus of FIG. 3 now includes a second frame 51 mounted on the first frame 20 via one or more kinematic couplings 52.

At least a portion 54 of the second frame 51 extends from outside of the first frame 20 and into a region located within the first frame 20 (e.g. where the imprint lithography template 34 and/or holder 32 will be located), so that positional measurements for the substrate stage 38, 42, 46, and/or imprint lithography template 34 and/or holder 32 can be undertaken relative to, or using, that portion 54 of the second frame 51.

Additionally, in comparison with the configuration of FIG. 2, the substrate stage 38, 42, 46 may comprise a further part 56 which may be located, for instance, in-between the first part of the substrate stage 38 and the second part of the substrate stage 42. The further part 56 may, by appropriate actuator 58, provide additional and/or alternative functionality to control movement and/or position of the substrate 36. For example, the additional and/or alternative functionality may be or comprise short or long stroke movement. One or more reference surfaces or points 59 may be used in the measurement of the relative position between two movable substrate stages parts, for example the third or second part 42, 46 and the further part 56.

One or more position sensors may be mounted on the second frame 51, for example the portion 54 extending into (and perhaps through) the first frame 20, to facilitate measurement of the position of the substrate stage 38, 42, 46, 56 (or a part thereof) and the imprint lithography template holder 32 or the imprint lithography template 34. Furthermore, the alignment sensor 28 is mounted on the second frame 51, and not on the first frame 20, as was the case in FIG. 2.

Due to the kinematic coupling 52 between the second frame 51 and the first frame 20 in FIG. 3, deformation of the first frame 20 should not result in deformation of the second frame 50. Therefore, more accurate and more consistent positional measurements may be undertaken.

Displacement of the first frame 20 may still, nevertheless, result in displacement of the second frame 51, which can have an effect on the measurement of position. Additionally and/or alternatively, deformation of the second frame 51 may occur for reasons other than deformation of the first frame 20 to which the second frame 51 is mounted. For instance, deformation may result as a consequence of a thermal heat load on the second frame 51.

Deformation associated with a thermal heat load on the second frame 51 may be obviated or mitigated by using a heat shield, to shield the second frame 51 from such heat load. Alternatively or additionally, the second frame 51 may be formed at least partially from a material with a low coefficient of thermal expansion (e.g. less than or equal to 1 μm/m·K), and/or desirably high thermal conductance (e.g. greater than 20 W/(m·K), for example aluminum, having a thermal conductance of 200 W/(m·K)). A material with a sufficiently low coefficient of thermal expansion may be a ceramic material such as Zerodur™ or Invar™, or a ceramic material such as C/SiC, SiC, SiSiC or $Al_2O_3$. Alternatively or additionally, a cooling system (or, more generally, a thermal conditioning system) may be provided to cool the second frame 51.

Deformation of the second frame 51 as a result of, for example, displacement or vibration or the like of the first frame 20 may also be overcome or reduced. One way of overcoming or reducing this problem would be to reduce the displacement or vibration of the first frame 20 by appropriately mounting the first frame 20 to the floor 22. For instance, an appropriate mounting may be, as described above, one or more gas mounts 24, which may result in the at least partial inhibition of the transmission of both low and high frequency vibrations from the floor 22 to the first frame 20, and thus inhibit or reduce the transmission of vibrations to, the second frame 51. In an additional or alternative example, the second frame 51 may be constructed and arranged to have internal dynamical modes that are of a high frequency, for example typically 100 Hz or higher. (e.g. the second frame may be constructed and arranged to have a stiff and light design).

Figure 4:
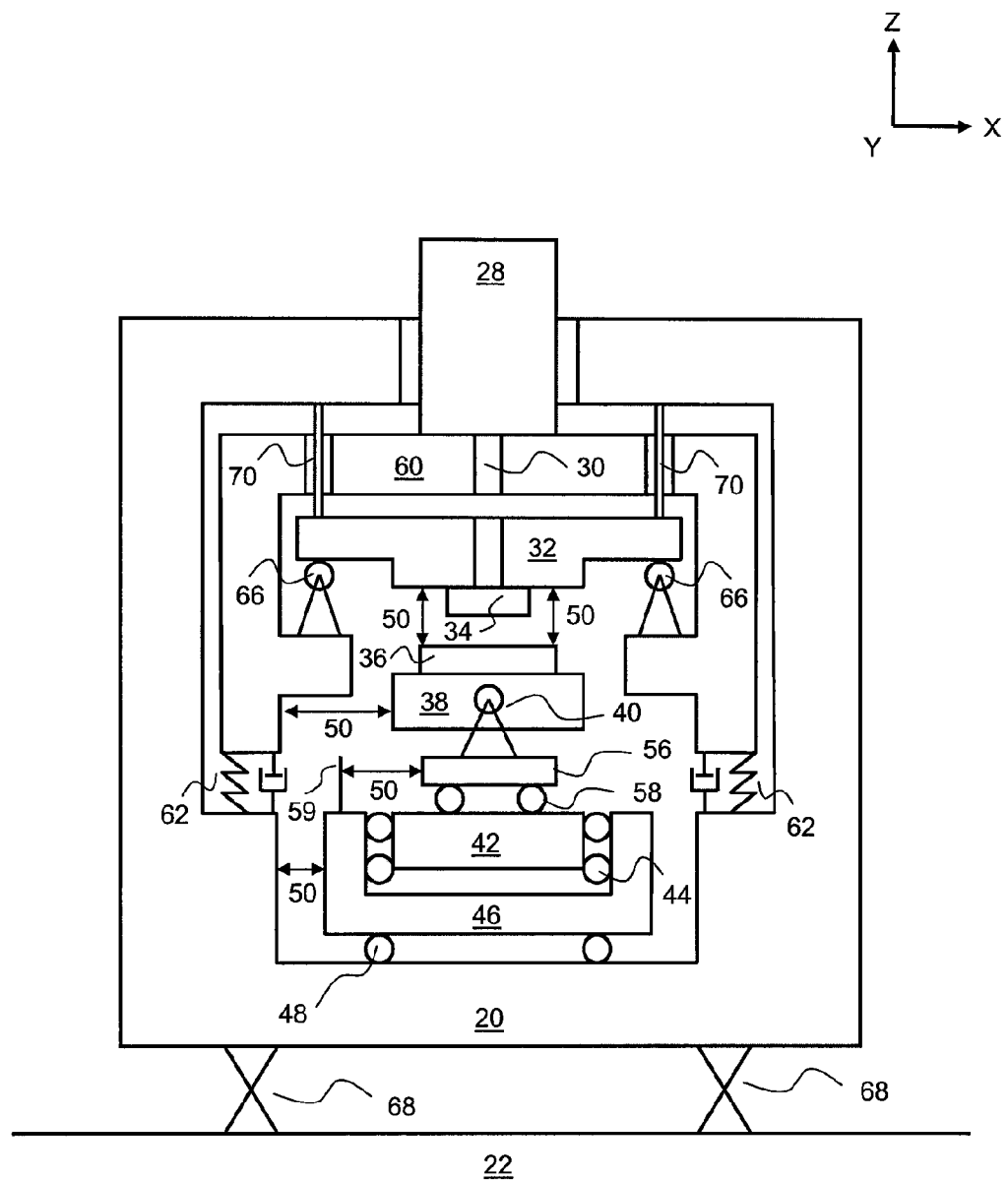
FIG. 4 schematically depicts a configuration of an imprint lithography apparatus in accordance with a further embodiment of the present invention.

FIG. 4 schematically depicts a configuration of an imprint lithography apparatus in accordance with a further embodiment of the present invention. Again, many of the features of the imprint lithography apparatus of FIG. 4 have already been shown in and/or described with reference to (at least in general) FIGS. 2 and 3. Those features have been given the same reference numerals in FIG. 4 for consistency.

FIG. 4 shares many of the features of the imprint lithography apparatus shown in FIG. 3. In contrast with the apparatus shown in FIG. 3, the apparatus shown in FIG. 4 has a second frame 60 that is mounted on the first frame 20 via one or more gas mounts 62. The second frame 60 is located substantially within (or entirely within) the first frame 20, and may, for example, be mounted on a lip or ledge or the like of the first frame 20.

In this embodiment, the imprint lithography template holder 32 is again mounted to the second frame 60, but is now mounted to the second frame via one or more kinematic couplings 66. The first frame 20 may, in this embodiment, be fixed to the floor 22 by one or more fixed mountings 68 (e.g. bolts or the like).

The configuration of the imprint lithography apparatus shown in FIG. 4 may be advantageous with respect to the configuration of the imprint lithography apparatus shown in FIG. 3. An advantage is that there is no requirement to make or take a measurement of the relative position between the imprint lithography template 34 or the imprint lithography template holder 32 and the second frame 60, because the imprint lithography template holder 32 (and, by appropriate holding, the imprint lithography template 34) is stably connected to the second frame 60 by the kinematic coupling 66. A further advantage of the arrangement as shown in FIG. 4 is that movement of the substrate stage 38, 42, 46, 56 will not directly excite (e.g. disturb via displacement or vibration) the second frame 60, because the second frame 60 is effectively isolated from vibrations or the like of the first frame 20 (to which the substrate stage is least indirectly connected) by the gas mount 62.

However, there may be a disadvantage associated with the arrangement shown in FIG. 4 (at least relative to the arrangement of FIG. 3). One disadvantage is that when the imprint lithography template 34 is released from imprintable medium provided on the substrate 36 (more generally referred to as release of the template 34 from the substrate 36), a release force will act on the second frame 60 and may displace and/or deform the second frame 60. This is undesirable, since measurements are taken relative to this second (in other words metrology) frame. A way of overcoming, or at least partially overcoming, this problem is shown in FIG. 4. One or more release compensation actuators 70 are connected between the first frame 20 and the imprint lithography template holder 32. The release compensation actuator 70 may be a Lorentz actuator, since a Lorentz actuator will not transfer deformations or displacements to the second frame. The release compensation actuator 70 may extend through the second frame 60 (for example, through one or more conduits or passages or the like). Furthermore, by ensuring that a point or points of connection of the one or more release compensation actuators is linked (e.g. in terms of a spatial or structural relationship) to a point of connection of the kinematic coupling 66 via which the imprint lithography template holder 32 is mounted to the second frame 60, deformation of the second frame 60 may be reduced or minimized. The point or points of connection of the one or more release compensation actuators 70 may be on opposite sides of the imprint lithography template holder 32 to the point or points of connection of the kinematic coupling 66 via which the imprint lithography template holder 32 is mounted to the second frame 60. In other words, release compensation actuator force should desirably be passed through or via one or more connection points of the kinematic coupling 66, so that the second frame 60 is not bent or otherwise deformed.

In one embodiment, not shown, three release compensation actuators may be used in order to compensate for not only release force, but movement of the force (i.e. the release force is dynamic). In an embodiment, measurement of the release force may be made, and/or measurement of a counter force provided by the release compensation actuator.

In the embodiment shown in FIG. 4, it may not be possible or practical to mount the first frame 20 to the floor 22 via a gas mount. This is because a gas mount is already present in the configuration, between the second frame 60 and the first frame 20. Gas mounts in series may cause instability, which is undesirable and may in fact lead to an increase in measured positional errors. Therefore, the first frame 20 may be fixed to the floor 22 in a relatively fixed and inflexible manner. This, however, means that the substrate stage 38, 42, 46, 56 is not isolated (in terms of vibrations or the like) from the floor 22. This may result in the position of the substrate being affected to such an extent as to result in degradation in the measurement of positional accuracy and, for example, poor overlay. This problem may be overcome by providing a substrate stage, or one or more parts of that substrate stage, which has an isolated short stroke actuator holding the substrate such that positional accuracy may be preserved, despite the fact that the first frame 20 is coupled to the floor 22 in a relatively strict manner. 'Isolated' may mean that the stage moves or is movable in a contactless manner (e.g. via magnetic force and/or electrostatic force). In practice, a 5 degrees of freedom Lorentz short stroke substrate stage may fulfill these requirements. A 5 degrees of freedom Lorentz short stroke substrate stage may not be necessary with the embodiment shown in FIG. 3, because in FIG. 3 the first frame is isolated from vibrations of the floor via the use of a gas mount.

FIGS. 3 and 4 depict schematic arrangements for the layout of an imprint lithography apparatus. It will be appreciated that the apparatus may have a different layout, for example a different configuration of substrate stage, while still embodying the principles of the invention.

In determining an appropriate configuration for an imprint lithography apparatus, it is useful to consider any movement requirements of different parts of that apparatus (e.g. degrees of freedom). In one instance, it is desirable to be able to provide long stroke movement along the x, y and z axes as shown in the Figures, either of the imprint lithography template arrangement, or the substrate, or both. Such long stroke movements may be used to coarsely position the template relative to the substrate, and may be inaccurate on a nanometer scale. At the same time, it is desirable to be able to provide accurate, short stroke movement along the x and y axes as shown in the Figures, and rotation about the x, y and z axes. Such movement may be required for finer, and final, alignment of the template relative to the substrate. Such movement may again be provided via either of the imprint lithography template arrangement, or the substrate, or both. Alignment of the imprint template relative to the substrate may be achieved by establishing a fixed positional relationship between the alignment sensor and the imprint template in the x and y directions. This means that x and y movement of the template may not be required, potentially simplifying the structure of the apparatus in the vicinity of the template. Such simplification in the apparatus may lead to a reduction in heating and/or vibration of the imprint template arrangement (i.e. an improved stability of the imprint template arrangement), which is desirable to, e.g., meet overlay requirements. Four system configurations become apparent:

1) The substrate stage is capable of translational long stroke movement along two axes parallel to a plane of the substrate (x and y axes), and along an axis perpendicular to that plane (z axis). The substrate stage is capable of rotational movement about the two axes that are parallel to the plane of the substrate (rotation about x and y axes). The imprint lithography template arrangement is capable of translational short stroke movement along the two axes parallel to the plane of the substrate (x and y axes), and the imprint lithography template arrangement is capable of rotational movement about the axis that is perpendicular to that plane (rotation about z axis).

2) The substrate stage is capable of translational long stroke movement along two axes parallel to a plane of the substrate (x and y axes), and along an axis perpendicular to that plane (z axis). The substrate stage is capable of rotational movement about the two axes that are parallel to the plane of the substrate (rotation about x and y axes), and about the axis that is perpendicular to that plane (rotation about z axis), and the substrate stage is capable of translational short stroke movement along the two axes parallel to the plane of the substrate (x and y axes). The substrate stage is a five degree of freedom short stroke substrate stage. For example, the substrate stage is a five degree of freedom isolated (e.g. spatially isolated or separated) short stroke substrate stage. The substrate stage may additionally comprise or be a three degree of freedom long stroke substrate stage.

3) The substrate stage is capable of translational long stroke movement along two axes parallel to a plane of the substrate (x and y axes). The substrate stage is capable of rotational movement about the two axes that are parallel to the plane of the substrate (rotation about x and y axes). The imprint lithography template arrangement is capable of long stroke movement along an axis perpendicular to the plane of the substrate (z axis). The imprint lithography template arrangement is capable of translational short stroke movement along the two axes parallel to the plane of the substrate (x and y axes), and the imprint lithography template arrangement is capable of rotational movement about the axis that is perpendicular to that plane (rotation about z axis).

4) The substrate stage is capable of translational long stroke movement along two axes parallel to a plane of the substrate (x and y axes). The substrate stage is capable of rotational movement about the two axes that are parallel to the plane of the substrate (rotation about x and y axes), and about the axis that is perpendicular to that plane (rotation about z axis), and the substrate stage is capable of translational short stroke movement along the two axes parallel to the plane of the substrate (x and y axes). The substrate stage is a five degree of freedom short stroke substrate stage. For example, the substrate stage is a five degree of freedom isolated (e.g. spatially isolated or separated) short stroke substrate stage. The imprint lithography template arrangement is capable of long stroke movement along an axis perpendicular to the plane of the substrate (z axis). The substrate stage may additionally comprise or be a three degree of freedom long stroke substrate stage.

Rotational movement will usually be of a short stroke nature.

In the embodiments described herein, the terms 'long stroke' and 'short stroke' have been used. 'Long stroke' may encompass or be defined by movement in the range of 1 µm up to 1 m or greater. 'Short stroke' may encompass or be defined by movement in the range of 0.1 nm or less up to about 1 µm, and/or rotational movement of 1 µrad or less up to 10 mrad.

The substrate stage described herein may be, may comprise, or may form a part of one or more of: a substrate holder; a positioner of the substrate; and/or a positioner of a substrate holder.

The first frame as described herein may be referred to as a base frame. A base frame is typically used as a force frame. Substrate stage (or the like) and process forces act against and/or are absorbed by the base frame. The second frame as described herein may be referred to as a metrology frame. A metrology frame is a frame against or from which positional measurements (or more accurate positional measurements) are undertaken. The metrology frame is thus often isolated, as far as possible, from external vibrations and distortions, and the like, to make the metrology frame, and the associated positional measurements, as stable as possible. A base frame provides a base upon which other apparatus may be mounted or connected, for example the metrology frame. The base frame may also be isolated from vibrations and distortions, but often not to the same extent as the metrology frame.

Movement of one or more parts of the apparatus has been described herein. 'Movement' may comprise the driving and/or guiding of such movement.

In the embodiments described herein, gas mounts have been described. The use of at least three gas mounts may be desirable, since frames are usually supported by three mounts of one type or another.

In the embodiments described herein, the term 'gas mounts' has been used. Instead, and more generically, the term 'vibration isolation system' may be used in place of 'gas mount'. A gas mount is an example of such a vibration isolation system. Another vibration isolation system may be or comprise rubber supports.

Limit Distortion of Second Frame During Release of Imprint Template

The use of a release compensation actuator (i.e. an actuator that provides a force, for example an opposing or compensatory force, during release of an imprint lithography template arrangement from a substrate), has already been discussed in relation to FIG. 4. In FIG. 4, the release compensation actuator was connected to the first (base) frame, and extended through the second (metrology) frame. In a more generic aspect, there is a provided an imprint lithography apparatus which comprises a base frame and a metrology frame. An imprint lithography template arrangement is in connection with the base frame or the metrology frame via one or more kinematic couplings and one or more release compensation actuators. In particular, this more general aspect is not limited to the one or more release compensation actuators extending through the metrology frame to the base frame.

Figure 5:
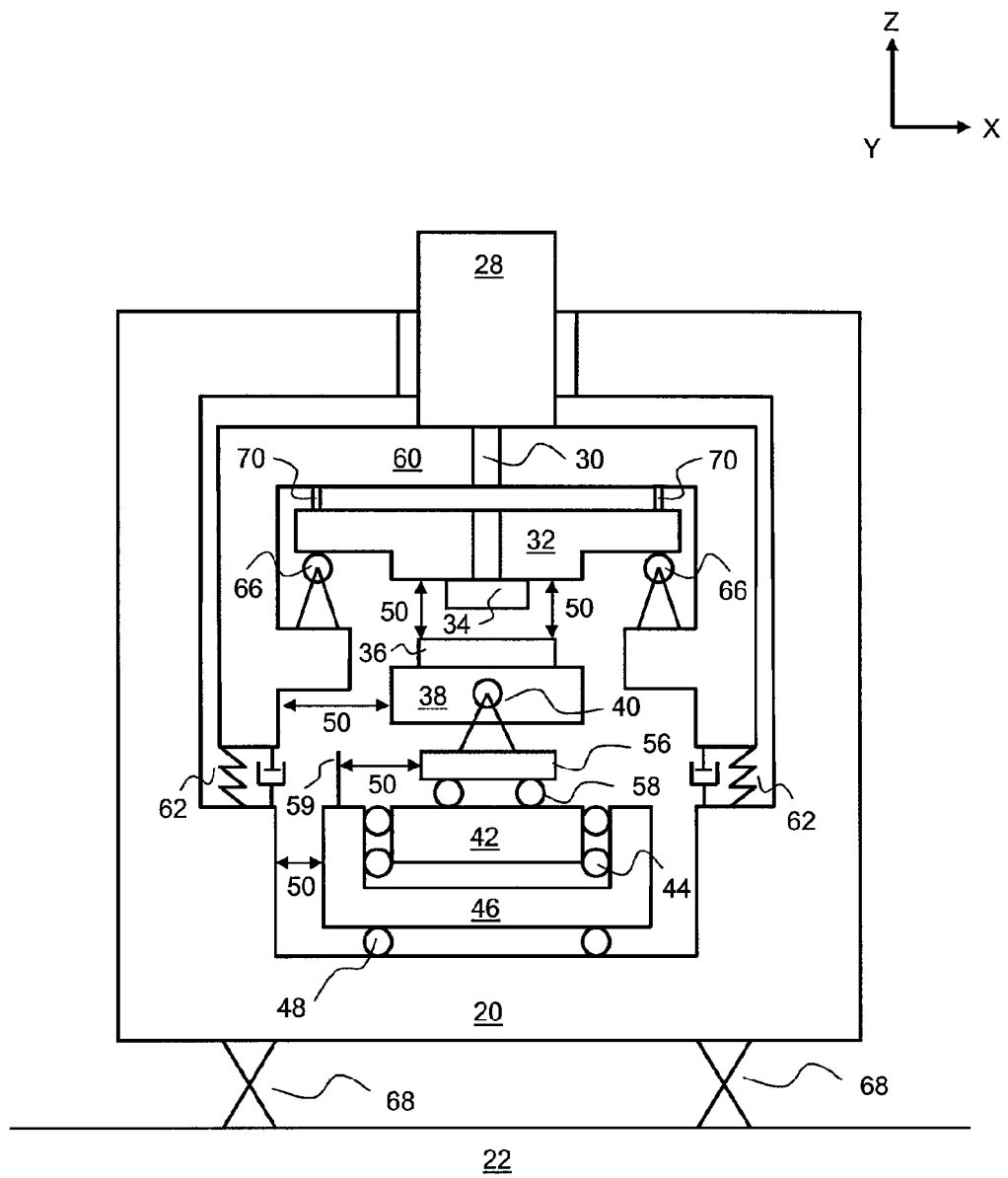
FIG. 5 schematically depicts a configuration of an imprint lithography apparatus in accordance with a further embodiment of the present invention.

FIG. 5 shows an example of this aspect. FIG. 5 shares and shows the vast majority of the features already shown in and referenced to FIG. 4. In contrast to FIG. 4, however, in FIG. 5 the release compensation actuator 70 extends between the imprint lithography template holder 32 and the metrology frame 60. The release compensation actuator 70 limits or prevents deformation or distortion of the metrology frame 60 when the imprint lithography template 34 is released from the substrate 36.

In FIG. 5, a point or points of connection of the one or more release compensation actuators 70 is or are located on opposite sides of the imprint lithography template arrangement (in this case, the imprint lithography template holder 32) to a point or points of connection of the kinematic coupling 66. This helps ensure that a release force on the imprint lithography template holder 32 that would otherwise have been passed through the kinematic couplings 66 to the metrology frame 60 may be more readily opposed and compensated for. An alternative and perhaps advantageous arrangement (not shown in the Figure) is one in which the one or more kinematic couplings are located in series with the one or more release compensation actuators. For example, a kinematic coupling and a release compensation actuator may be connected to one another and both, together, extend between the imprint lithography template arrangement and the metrology frame (or, the base frame, in other embodiments). This arrangement may be advantageous, as it reduces the number of connection points required for the kinematic coupling and the release compensation actuator, and also helps ensure that the kinematic coupling and release compensation actuator are in alignment with one another, thus allowing an opposing and/or compensatory force to the release force to be more easily and accurately provided.

Figure 6:
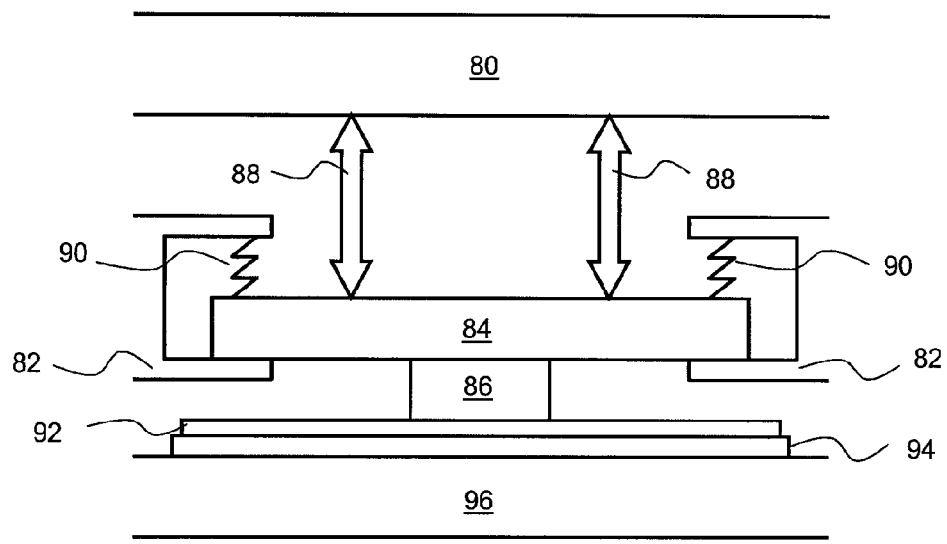
FIGS. 6 and 7 schematically depict an imprint lithography apparatus in a first configuration and a second configuration, respectively, in accordance with a further embodiment of the present invention.
Figure 7:
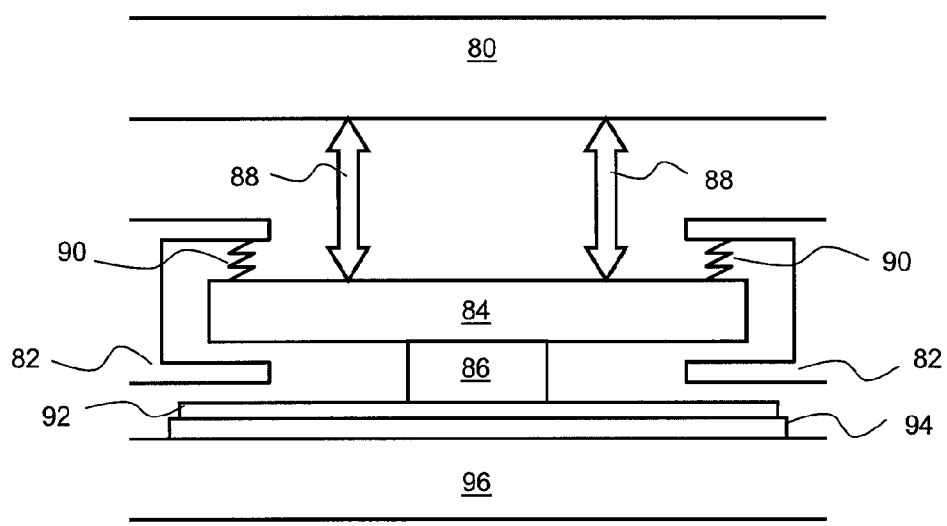

FIGS. 4 and 5 depict an apparatus for attempting to control and limit the force applied to the metrology frame during release of the imprint lithography template arrangement from the substrate. A variant might involve having the imprint lithography template arrangement not connected to the metrology frame during the release, so that the release force simply cannot be transmitted to or through the metrology frame. FIGS. 6 and 7 show how this might be implemented in practice.

FIG. 6 schematically depicts a base frame 80 and a metrology frame 82. The metrology frame 82 might be mounted on or connected to the base frame 80 by one or more kinematic couplings, and/or gas mounts, or the like (not shown). The apparatus further comprises an imprint lithography template arrangement in the form of an imprint lithography template holder 84 holding an imprint lithography template 86. One or more actuators 88 (e.g. Lorentz actuators) may connect (or be used to connect) the imprint lithography template arrangement (e.g. the imprint lithography template holder 84) to the base frame 80. The imprint lithography template holder is biased towards (i.e. into) connection (e.g. contact) with the metrology frame 82 by one or more springs 90 (e.g. highly compliant preloaded springs) which are connected (e.g., attached) to the metrology frame 82. In another embodiment, the actuator 88 may provide this biasing.

In FIG. 6, the imprint lithography template arrangement is shown as being in a first configuration, when the imprint lithography template arrangement is in connection with (e.g. in contact with) the metrology frame 82. When in this first configuration, the imprint lithography template arrangement (and in particular, the imprint lithography template 86 thereof) may be used to imprint a pattern into a layer of imprintable medium 92 provided on a substrate 94. The substrate 94 is held in position, and may be moved or posited, by a substrate stage 96. Because the imprint lithography template arrangement is in contact with the metrology frame, the position of the imprint lithography template arrangement may be accurately determined, allowing patterns to be accurately located and/or aligned relative to the substrate.

The pattern provided in the imprintable medium is then fixed (e.g. cured) by appropriate irradiation, heating, or the like. If the substrate 94 was released from the imprint lithography template 86 when in the configuration shown in FIG. 6, a release force would be imparted on the metrology frame 82. This may cause deformation, distortion and/or displacement of the metrology frame which can have an impact on positional measurement made using or relative to the metrology frame 82. This is undesirable, since this may adversely affect the positioning or locating of patterns, or subsequently applied patterns. FIG. 7 shows how this problem may be overcome.

In FIG. 7, and after the pattern has been fixed in the imprintable medium 92, the imprint lithography template arrangement is shown as having been moved to a second configuration. In the second configuration, the imprint lithography template arrangement is disconnected from the metrology frame 82 (i.e. is not in contact with the metrology frame 82, other than via the compliant springs 90 which will now be in an unloaded state), and is instead in connection with the base frame 80. This configuration helps ensure that a release force generated during release of the imprint lithography template arrangement from the substrate (and, for example compensated for by any release compensation actuators as described herein) will be imparted to the base frame 80, and not to the metrology frame 82.

The imprint lithography template arrangement may be moved in any appropriate way. In FIG. 7, the imprint lithography template arrangement is moved by appropriate movement of the substrate stage 96 that holds the substrate 94. For example, movement of the substrate may be moved towards the base frame 80, which will cause movement of the imprint lithography template arrangement towards the base frame 80. Movement of the imprint lithography template arrangement toward the base frame 80 at least partially overcomes the bias provided by the springs 90, thus moving the imprint lithography template arrangement out of connection with the metrology frame 82. The actuator 88 may then be used to hold the imprint lithography template arrangement, effectively connecting the imprint lithography template arrangement to the base frame 80 and keeping the imprint lithography template arrangement disconnected from the metrology frame 82. The substrate 94 (and the fixed patterns of imprintable medium carried by that substrate 94) will then be pulled away from the imprint lithography template 86 (sometimes referred to as peeling of the substrate 94) via appropriate movement of the substrate stage 96 away from the base frame 80 and the imprint lithography template 86.

During release, the imprint lithography template arrangement is not (rigidly) connected to the metrology frame 82. Thus, displacement and/or distortion of the metrology frame due to the force imparted during release is limited or avoided.

Movement of the imprint lithography template arrangement to disconnect it from the metrology frame, and the connection of the imprint lithography template arrangement to the base frame, may be undertaken in the same process and/or at the same time. For example the movement and connection may be undertaken by appropriate engagement of the one or more actuators and movement of the substrate stage at substantially the same time.

In a variation, there may be no need to provide an independent biasing element in the form of a spring or the like to bias the imprint lithography template arrangement into connection with the metrology frame. Instead, the aforementioned actuator may be capable of biasing the imprint lithography template arrangement into connection with the metrology frame. This may be undertaken in a first mode of operation, for example during a first time period before and/or during fixing of the pattern in the layer of imprintable medium. In a second, subsequent mode, the actuator may be controlled to retract the imprint lithography template arrangement to disconnect the arrangement from the metrology frame, and (at the same or at a later time) hold the arrangement in position to connect the imprint lithography template arrangement to the base frame.

Long Burls for Imprint Lithography Template Arrangement Clamp

In an imprint lithography apparatus or method, it is often desired to be able to clamp in position (or in other words hold) an imprint lithography template arrangement. A clamping configuration may be a releasable clamping configuration so that the clamping or holding is not permanent. Clamping may be necessary to, for example, hold in position an imprint lithography template holder that holds, or is arranged to hold, an imprint lithography template, or to hold in position an imprint lithography template in isolation. A clamp, as opposed to a permanent connection, may be advantageous so as to allow for interchanging of different imprint lithography template arrangements.

In one or more examples, the clamping configuration (which may comprise one or more clamps) may be, or form at least a part of, an imprint lithography template arrangement, for example an imprint lithography template holder suitable to hold an imprint lithography template.

Figure 8:
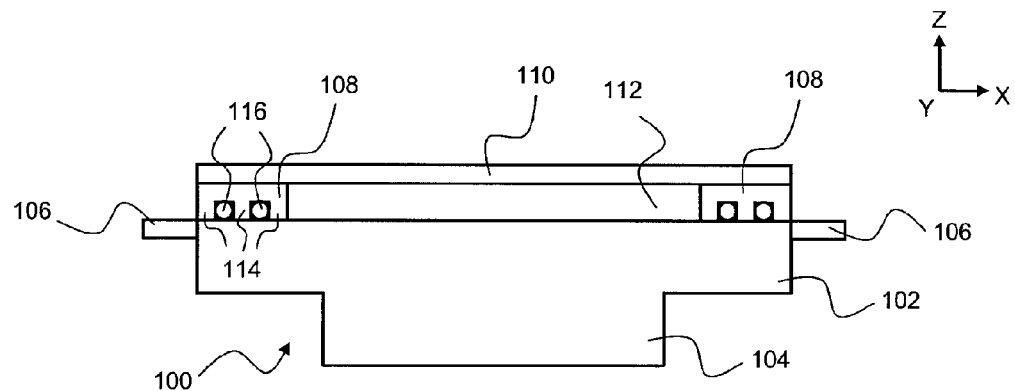
FIG. 8 schematically depicts a clamp for use in holding an imprint lithography template arrangement.

FIG. 8 schematically depicts an imprint lithography template arrangement and a clamping configuration. In this example, the imprint lithography template arrangement comprises an imprint lithography template 100. The imprint lithography template 100 comprises a base region 102 from which protrudes a mesa 104 on which one or more pattern features may be provided for use in imprinting a pattern into a layer of imprintable medium. The mesa 104 and base region 102 may be integrally formed.

One or more actuators 106 may be distributed around a periphery of the base region 102. The actuator 106 may be used to position and/or selectively deform the imprint lithography template 100.

A clamping configuration is, in this embodiment, located on a reverse or back side of the imprint lithography template 100, on an opposite side to the mesa 104. In this embodiment, the clamping configuration comprises a seal frame 108 that extends around a periphery of the reverse side of the imprint lithography template 100. The clamping configuration further comprises a cover 110 which extends across the frame 108, enclosing a space 112 between the cover 110, the seal frame 108, and the reverse side of the imprint lithography template 100. The cover 110 may be at least partially transparent to actinic radiation that may be used, in an imprint method, to fix a pattern provided in a layer of imprintable medium by the mesa 104 of the imprint lithography template 100.

The seal frame 108 is provided with a number of short burls 114 (e.g. less than 1 mm in length) which extend from the base region 102 and into direct physical contact with the reverse side of the imprint lithography template 100. The short burls 114 are stiff in the x, y, and z directions (i.e. along and perpendicular to the length of the burls 114)—the short burls 114 are not flexible in the x, y, and z directions (i.e. along and perpendicular to the length of the burls 114).

Located in spaces between the short burls 114 are seals 116 (e.g. o-ring seals or the like) which extend within the space between the burls 114, and around the seal frame 108 and thus around the periphery of the reverse side of the imprint lithography template 100. The short burls 114 and/or seal frame 108 may form a part of what is known in the art as a vacuum clamp, which may, also and/or accordingly be substantially inflexible in the x, y, and z directions.

In use, the space 112 is brought into a reduced pressure state relative to the pressure outside of the space 112 (i.e. relative to ambient pressure). The presence of the seal frame 108 and the combination of short burls 114 and seals 116 helps ensure that the reduced pressure state within the space 112 is maintained. The reduced pressure state within the space 112 results in a clamping force being applied to the imprint lithography template 100, holding the template 100 in position.

Although the clamping configuration shown in FIG. 8 may be used to hold an imprint lithography template arrangement, there are one or more disadvantages associated with the construction of that clamping configuration. As discussed above, the actuator 106 may be used to position or deform the imprint lithography template 100. Deformation might involve, for example, compression of the imprint lithography template 100. However, the short inflexible burls 114 in contact with the reverse side of the imprint lithography template 100 may provide a counteracting frictional force to any force applied by the actuator 106. The resulting interaction between the force applied by the actuator 106 and the counteracting frictional force applied by the short inflexible burls 114 may result in slip (possibly unexpected slip) and/or unpredictable distortion of the imprint lithography template 100 relative to the clamping configuration, which can make it difficult to accurately deform the imprint lithography template arrangement. An alternative or additional problem is that the seals 116 are, in comparison with the burls 114, relatively flexible.

Figure 9:
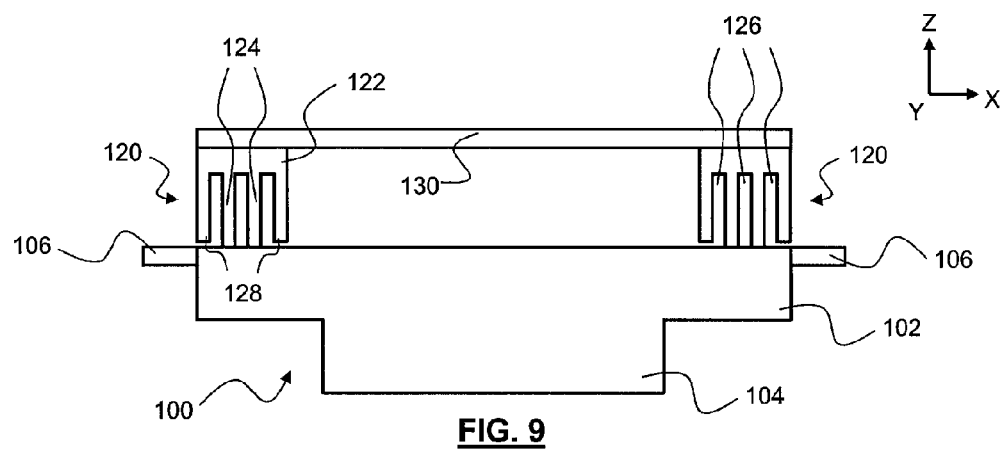
FIG. 9 schematically depicts a clamp for use in holding an imprint lithography template arrangement, in accordance with an embodiment of the present invention.

FIG. 9 schematically depicts a clamping configuration which may at least partially overcome one or more of the problems associated with the clamping configuration shown in FIG. 8. Referring to FIG. 9, the clamping configuration comprises one or more clamps 120. In one embodiment, a plurality of clamps may be provided, for example extending and/or distributed around a periphery of the imprint lithography template base region 102. In another example, and as shown in FIG. 9, a single clamp 120 may be constructed and arranged to extend around the periphery of the imprint lithography template base region 102. The clamp 120 may be formed from a ceramic such as: SiSiC, SiC, Al2O3, or a metal such as: steel, aluminium & Invar™ (FeNi36).

The clamp 120 comprises a base region 122. One or more burls 124 extend from a base region 122 and, in use, into contact with the imprint lithography template base region 102. A space 126 surrounds the burls 124. One or more seal walls 128 are provided that also extend from the base region 122, and which surround the space 126 that surrounds the burls 124. The burls 124 extend further from the base region 122 than the seal wall 128, such that the seal wall 128 does not come into contact with the imprint lithography template arrangement 100. Instead, the seal wall 128 has a length which results in a small gap being defined between the remote ends of the seal wall 128 and the imprint lithography template 100. For example, the burls 124 may extend 1-10 µm further from the base region 122 than the seal wall 108, or perhaps 3-5 µm further from the base region 122 then the seal wall 128. This will result in a gap between the remote end of the seal wall 128 and the imprint lithography template 100 of approximately 1-10 µm, or approximately 3-5 µm. The gap is such that, in use, the seal wall 128 is configured to provide an at least partial seal with the imprint lithography template 100 when the space 126 is arranged to be at a lower pressure than ambient pressure (i.e. a surrounding pressure, for example a pressure external to the space 126). Such a reduced pressure provides a force sufficient to clamp the clamping configuration to the imprint lithography template 100.

Additionally or alternatively, the gap between the seal wall 108 and the imprint lithography template 100 may reduce contamination, friction and/or distortion which might otherwise result from (e.g. movable) contact between the seal wall 108 and the imprint lithography template 100.

In this embodiment, the burls 124 are of a length and/or shape which results in the burls 124 being at least partially flexible in a direction parallel to a plane of the imprint lithography template 100 (for example, an x-y plane, or in other words orthogonal or perpendicular to the length of the burls 124). This at least partial flexibility in the aforementioned directions allows for predictable movement, non distortional expansion and/or compression of the imprint lithography template 100 without slip of the burls 124 relative to the imprint lithography template 100 resulting in increased positional accuracy and compression of the imprint lithography template 100. At the same time, the burls 124 are relatively stiff along their length (i.e. in the z-direction), fixing the degree of freedom in this direction, which may increase the accuracy with which changes in position and/or deformation of the imprint lithography template 100 can be made.

In order to achieve the aforementioned flexibility, each of the burls may be, for example, at least 1 mm long, at least 5 mm long, at least 5-10 mm long, at least 10 mm long, and/or less than 100 mm long.

In use, the space 126 surrounding the burls 124 may be at least partially reduced in pressure (relative to an external, ambient pressure). The small gap between the seal wall 128 and the imprint lithography template 100 is small enough to provide an at least partial seal, such that the reduced pressure space 126 provides a clamping force to the imprint lithography template 100. Due to the reduction in pressure, a seal wall may be referred to as a vacuum seal wall, and/or a seal may be referred to as a vacuum seal.

A cover 130 might optionally be provided, that cover 130 extending across the clamp 120. The cover 130 may be at least partially transparent to actinic radiation, which may be used, in an imprint method, to fix a pattern provided in a layer of imprintable medium by the mesa 104 of the imprint lithography template 100.

Figure 10:
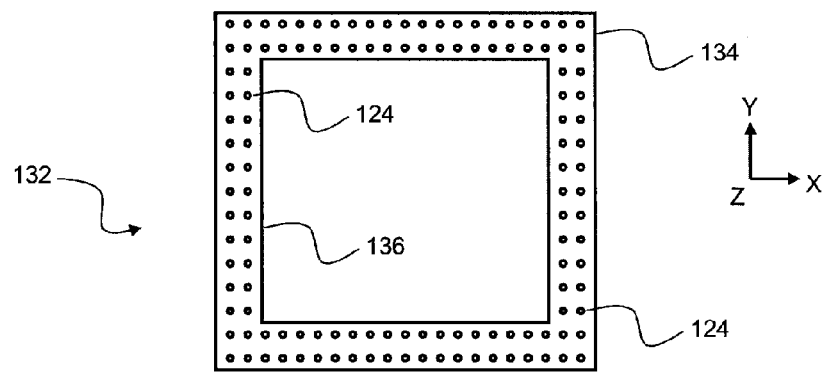
FIG. 10 schematically depicts an underside view of the clamp of FIG. 9.

FIG. 10 shows an underside view of the clamping configuration of FIG. 9. It can be seen that the clamping configuration 132 comprises a plurality of burls 124 constructed and arranged to be distributed around a periphery of an imprint lithography template. The clamping configuration 132 comprises an outer seal wall 134 that extends around an outer perimeter of a region containing the burls 124, and an inner seal wall 136 that extends around an inner perimeter of the region containing the burls 124.

Due to the previously described flexibility of the burls 124, compressive forces (and the resulting or associated magnification correction or the like) may be much more predictably and consistently provided. Furthermore, due to the flexibility, the frictional forces referred to above in relation to the arrangement of FIG. 8 may not be present, and the related slip of the burls relative to the imprint lithography template may not occur.

Figure 11:
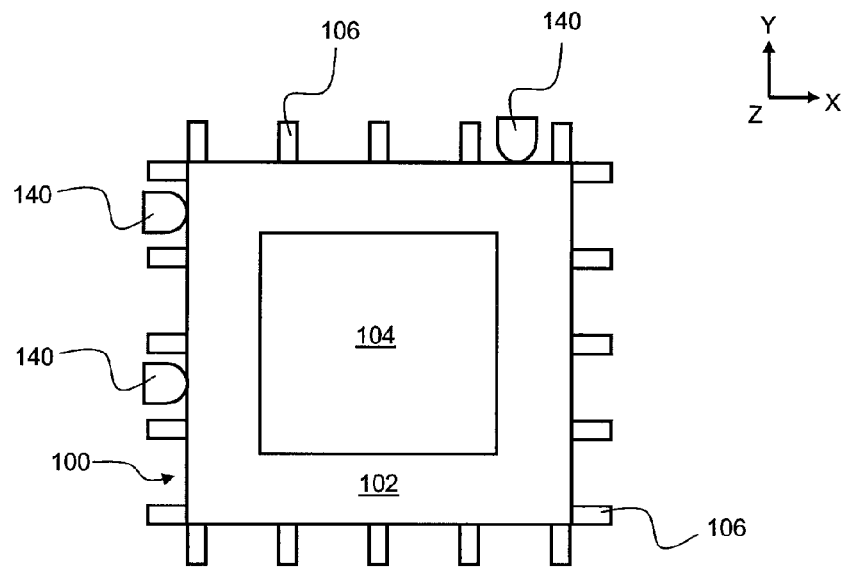
FIG. 11 schematically depicts an underside view of the imprint lithography template arrangement shown in FIGS. 8 and 9, with additional fixed abutment points.

Due to the inherent flexibility of these long burls, there may be a requirement to provide an additional mechanism to fix degrees of freedom of the imprint lithography template, for example in the x and y directions (and therefore rotation about the z axis). FIG. 11 shows an underside view of the imprint lithography template 100 shown in FIG. 9. Referring to FIG. 11, one or more actuators 106 to position or compress the imprint lithography template 100 are shown as being distributed around a periphery of the base region 102 of the imprint lithography template 100. In order to fix the degrees of freedom of the imprint lithography template 100 in the x, and y directions, and therefore rotation around about the z axis, fixed abutment points 140 are provided. Two of these abutment points 140 are located along one side of the imprint lithography template arrangement 100, and another (of the three) abutment points 140 is located along an adjacent side of the imprint lithography template 100. This arrangement of abutment points 140 helps ensure that the degrees of freedom of the imprint lithography template 100 in the x and y directions may be fixed, which may assist in the provision of accurate positioning and/or deformation of the imprint lithography template 100. This means that the clamping configurations described previously do not have to provide this fixation of the degrees of freedom, and this in turn allows the burls to be flexible in nature.

Substrate Release by Directional Peeling

Figure 12:
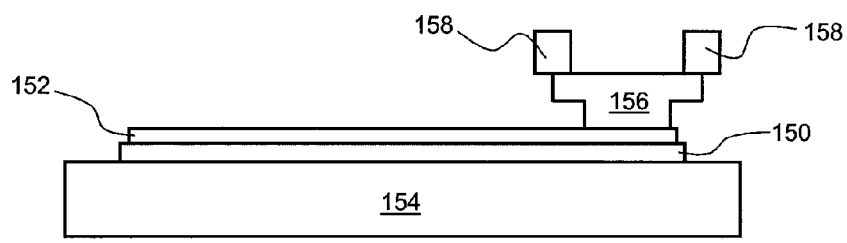
FIG. 12 schematically depicts an imprint lithography template relative to a substrate, prior to release of the template from the substrate.
Figure 13:
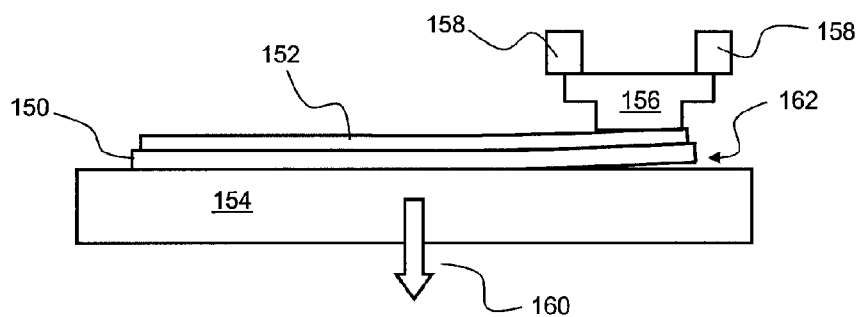
FIG. 13 schematically depicts an attempted release of the imprint lithography template from the substrate of FIG. 12.

After an imprint lithographic template has been imprinted into a layer of imprintable medium, a pattern provided in the layer of imprintable medium is fixed by the application of, for example, heat or actinic radiation. When the pattern is fixed the imprint lithography template is, at least to some extent, fixed to the substrate on which the imprintable medium is provided. In order to release the imprint lithography template from the substrate (which includes releasing the imprint lithography template from material provided on a substrate), a pulling force is applied to one or both of the imprint lithography template and the substrate. However, in some circumstances, the provision of such a pulling force may result in one or more problems being encountered. FIGS. 12 and 13 schematically how and why such problems may occur.

FIG. 12 is a side-on view of a substrate 150 provided with a layer of imprintable medium 152. The substrate 150 is held in position by a substrate stage 154. An imprint lithography template 156, held by an imprint lithography template holder 158, is in contact with and imprinted into the layer of imprintable medium 152. A pattern provided in the layer of imprintable medium 152 has been fixed, which has resulted in the imprint lithography template 156 being, at least to some extent, fixed to the substrate 150 via the layer of imprintable medium 152.

FIG. 13 shows that in order to release the imprint lithography template 156 from the substrate 150, a pulling force is applied to the substrate 150 in this case by appropriate (e.g., downwards) movement of the substrate stage 154. If the substrate 150 was held with sufficient force on and by the substrate stage 154, the substrate 150 and imprint lithography template 156 might be readily released from one another. However, the mechanism by which the substrate 150 is held on the substrate stage 154 (for example, vacuum clamping, or electrostatic clamping, or the like) may result in a holding or clamping force being non-uniformly distributed across the substrate 150. In some examples, this holding force might reduce in the radial direction, and is for example greater in magnitude towards the center of the substrate 150 than at a peripheral (e.g. edge) region of the substrate 150.

FIG. 13 shows that when an attempt is made to release the imprint lithography template 156 from a peripheral region of the substrate 150, a pulling force 160 provided by movement of the substrate stage 154 (together with any fixation force between the imprint lithography template 156 and imprintable medium 152) may exceed a holding force that would otherwise keep the substrate 150, or a peripheral region thereof, on the substrate stage 154. Because this holding force is exceeded, it can be seen in FIG. 13 that the peripheral region of the substrate 150 is pulled away from and out of contact 162 with the substrate stage 154. The pulling of the peripheral region of the substrate 150 away from the substrate stage 154 may be disadvantageous. For example, such pulling, which may result in bending of the substrate 150 and the layer of imprintable medium 152 provided thereon, can result in damage to the substrate 150 or layer of imprintable medium 152, or damage to a pattern provided in or on the layer of imprintable medium 152. It is therefore desirable to provide an apparatus and method to release an imprint lithography template from a substrate which obviates or mitigates one or more of these, or other, problems.

Figure 14:
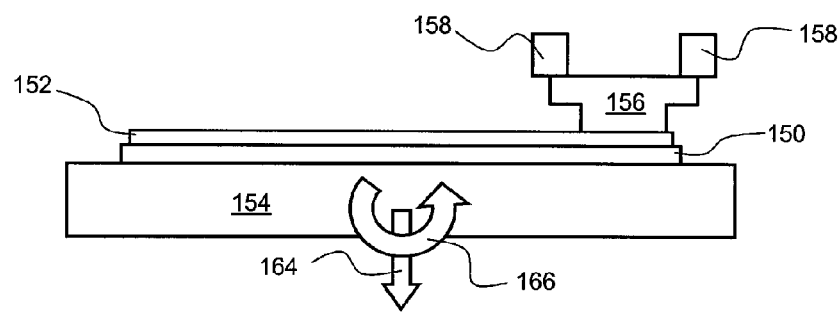
FIG. 14 schematically depicts principles associated with release of the imprint lithography template from the substrate of FIG. 12, in accordance with an embodiment of the present invention.

FIG. 14 shows the same substrate stage 154, substrate 150, layer of imprintable medium 152, imprint lithography template 156, and imprint lithography template holder 158 as shown in and described with reference to FIG. 13. However, and in contrast to the arrangement shown in and described reference to FIG. 13, FIG. 14 depicts principles associated with a different method to release the imprint lithography template 156 from the substrate 150.

The imprint lithography template 156 and substrate 150 may be released from one another by pulling the substrate 150 and the imprint lithography template 156 away from one another. In FIG. 14, this is denoted by arrow 164, which depicts a generally downward movement of the substrate stage 154 that holds the substrate 150. In other embodiments, the imprint lithography template 156 may be moved in an upwards direction by appropriate movement of the imprint lithography template holder 158. In other embodiments, the imprint lithography template 156 can be moved upwards and the substrate 150 moved downwards.

Referring back to FIG. 14, and distinguishing the release method from that discussed in relation to FIG. 13, in addition to pulling 164 of the substrate 150 away from the imprint lithography template 156, the release method also comprises rotating 166 one or both of the imprint lithography template 156 and/or the substrate 150 toward the other of the imprint lithography template 156 and/or a substrate 150. The rotation (e.g. direction and/or magnitude of any force associated with such rotation, often described as the rotational moment, or moment) is such that at a radial extremity of an interface between the imprint lithography template 156 and the substrate 150 (e.g. a contact area or region between the imprint lithography template 156 and the substrate 150 or the material provided thereon), there is a cumulative force acting on the substrate 150 that results in the substrate being held on the substrate stage (or, more particularly, that portion of the substrate 150 at that radial extremity being held on the substrate stage 154). The rotation may alternatively or additionally be described as being such that a pressing force is applied to the region of the substrate at the radial extremity of the interface. This pressing results in the radial extremity of the interface being pinned during release, which helps prevent that portion of the substrate 150 being pulled away from and out of contact with the substrate stage 154.

The pulling force 164 and rotating moment 166 may be undertaken in the same manoeuvre, or at the same time, and/or by the same apparatus, for example by appropriate movement of the imprint lithography template holder 158 and/or the substrate stage 154.

Figure 15:
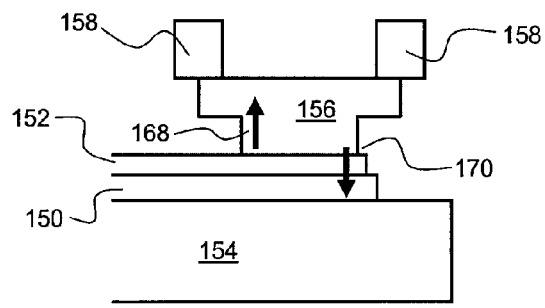
FIG. 15 schematically depicts forces involved in release of the imprint lithography template from the substrate of FIG. 12, in accordance with an embodiment of the present invention.

FIG. 15 schematically depicts (by way of arrows) some of the forces involved during release of the substrate in accordance with the above-described method. A pulling force 168 (or in other words a separating force) is applied which serves to release the imprint lithography template 156 from the substrate 150. At the same time, the rotation moment helps ensure that at a radial extremity 170 of the interface between the imprint lithography template 156 and the substrate 150, a pressing force is applied into the substrate 150, keeping that portion of the substrate 150 pinned to the substrate stage 154. Due to the rotation moment, the pulling force 168 is applied at an opposite side or end of the interface to the radial extremity, which causes the imprint lithography template 156 to be peeled from the substrate 150 (or the substrate 150 to be peeled from the imprint lithography template 156).

Figure 16:
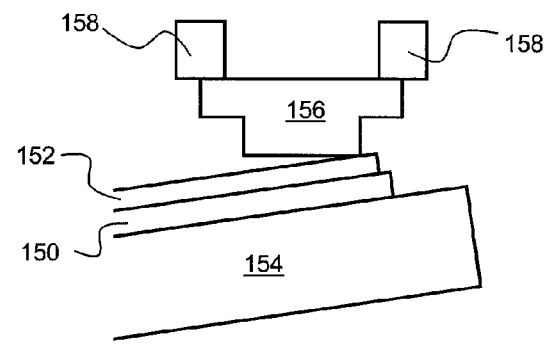
FIGS. 16 and 17 schematically depict rotation of the substrate and imprint lithography template, respectively, during the release of the imprint lithography template from the substrate of FIG. 12.

FIG. 16 shows the resultant release of the imprint lithography template 156 from the substrate 150. It can be seen that the rotation moment is such that the imprint lithography template 156 is effectively peeled from the substrate 150. The peeling is directional, in that the peeling is away from a center of the substrate, and toward the pinning of the substrate 150 at the radial extremity of the interface between the imprint lithography template 156 and the substrate 150.

Figure 17:
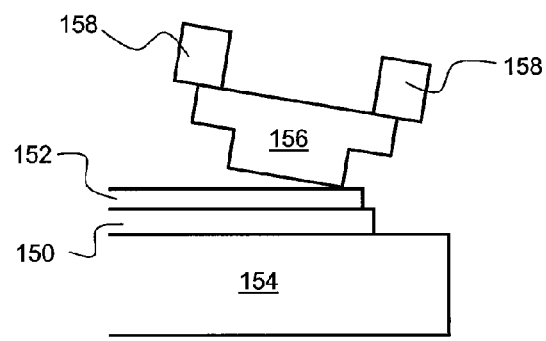

FIG. 17 schematically depicts a slightly different embodiment, where the imprint lithography template 156 is rotated during release, instead of the substrate 150 being rotated.

In another embodiment (not shown), both the substrate and the imprint lithography template could be rotated.

The pulling and rotational forces involved in the release of the imprint lithography template from the substrate may be defined mathematically. For example, a relationship between a pulling force, or a component thereof, acting through a center of the imprint lithography template (due to pulling of the imprint lithography template and/or pulling of the substrate), and a moment associated with the rotation may be defined as:

$$F < M/(b)$$

where F is the pulling force, or the component thereof, acting through the center of the imprint lithography template, M is the moment induced by the rotation and b is a radial distance from the center of the imprint lithography template (or, more specifically, the center of the interface between the imprint lithography template and the substrate) to the radial extremity of the interface.

If the above-mentioned conditions are met, the portion of the substrate at the radial extremity of the interface will be pinned, and will not be pulled away from and out of contact with the substrate stage 154. Little or no bending of the substrate will thus occur, which helps avoid or at least limit the damage described above when no rotation of the imprint lithography template or substrate takes place during release.

The above described method may be undertaken at any particular location on the substrate. However, the method may be particularly applicable to releasing of the imprint lithography template from the substrate when the imprint lithography template is engaged with a peripheral region of the substrate. At this region, and as described above, one or more holding or clamping forces applied to the substrate may be reduced in magnitude, for example in comparison with force applied to the substrate at a more central region of the substrate. The described method may thus allow imprinting to take place at a peripheral region of a substrate (since the method facilitates release at this region) and/or may negate the need to provide an improved (and potentially more complex or expensive) clamping method or apparatus for that peripheral region of the substrate.

In order to implement the above-mentioned method, one or both of the imprint lithography template holder and substrate stage are constructed and arranged to be movable in order to a) pull the substrate and the imprint lithography template away from one another, and b) rotate one or both of the imprint lithography template and substrate toward the other of the imprint lithography template and substrate, such that at a radial extremity of an interface between the imprint lithography template and substrate, there is a cumulative force acting on the substrate that results in the substrate being held on the substrate stage.

Same Amplifier for Control of Opposing Actuators

Figure 18:
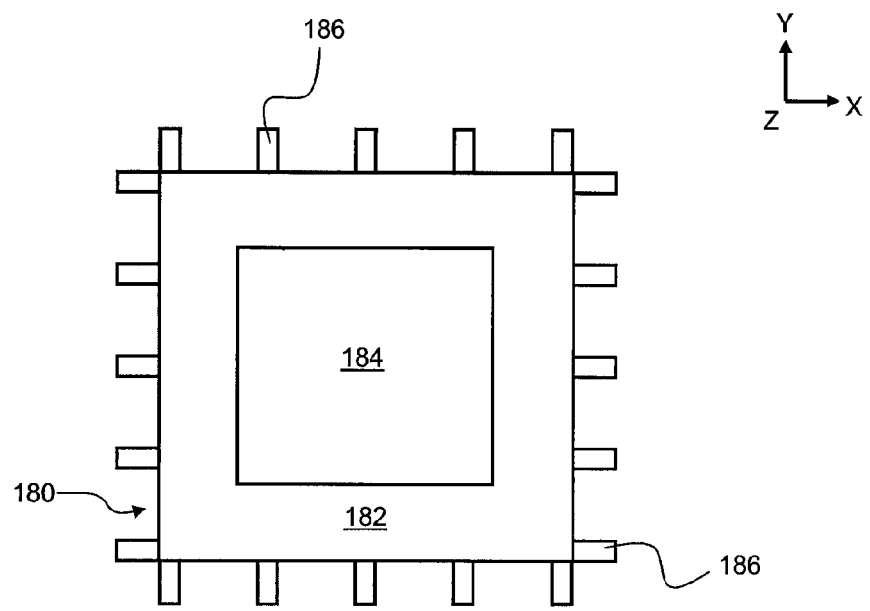
FIG. 18 schematically depicts an underside view of an imprint lithography template arrangement, including an actuation arrangement to position and/or deform an imprint lithography template of the imprint lithography template arrangement.

FIG. 18 schematically depicts an underside view of an imprint lithography template 180. The imprint lithography template 180 comprises a base region 182 from which extends a mesa region 184. The mesa region 184 is provided with one or more pattern features which may be imprinted into a layer of imprintable medium to form a corresponding pattern in that medium.

A number of actuators 186 are distributed along one or more sides of the imprint lithography template 180. The actuators may be used to position and/or deform the imprint lithography template 180. Positioning of the imprint lithography template 180 may be required to, for example, accurately locate or align a pattern provided in or on the layer of imprintable medium. Deformation of the imprint lithography template 180 may be required to, for example, correct for one or more magnification errors or the like. The actuators 186 may be, for example, piezoelectric actuators which, with appropriate control, allow for nanometer precision in the positioning and/or deformation of the imprint lithography template 180.

Figure 19:
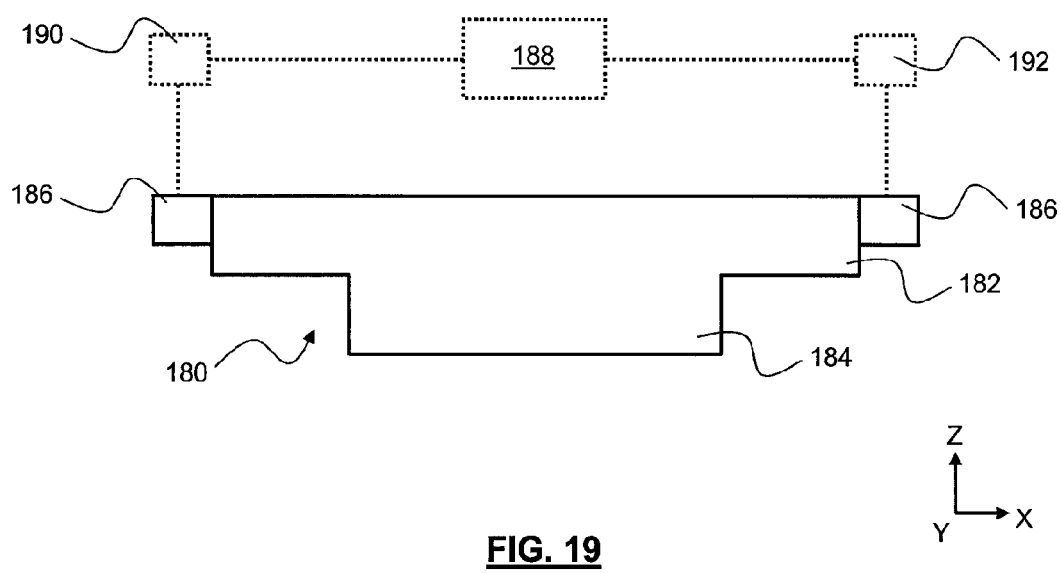
FIG. 19 schematically depicts a side view of the imprint lithography template arrangement of FIG. 18, together with a schematic depiction of connections between a signal amplifier and actuators of the actuation arrangement.

FIG. 19 schematically depicts a side-on view of the imprint lithography template 180 and actuators 186 of FIG. 18. Also included, in dotted outline, are components used in the control of signals (i.e. control signals) applicable to the actuators 186. The components are shown in dotted outline to indicate the fact that the components may not be located in the position shown in FIG. 19. The dotted outline therefore depicts schematic connections between the components and the actuators 186.

One of the components used in the control of signals applicable to (e.g. provided to, in use) the actuators 186 is a control unit 188. The control unit 188 provides the control signals that control the force applied by each actuator 186. Each actuator 186 has an associated signal amplifier 190, 192 to amplify a control signal provided by the control unit 188 and used to control the actuators 186.

If each of the signal amplifiers 190, 192 were 'perfect', then amplification of a control signal would be exactly as is intended. However, and in reality, the amplifiers 190, 192 are not perfect. For example, each signal amplifier 190, 192 introduces a noise component to the control signal during amplification of that signal. This noise will not be constant, but will vary over time, and most probably in a random manner. Such noise in the control signals may result in the actuators 186 delivering different forces to the imprint lithography template 180 at different times. For example, in one mode of operation, it may be desired that each actuator 186 provide a force of 20 N. At one point in time, due to the inherent noise of the signal amplifiers 190, 192, the applied force might be 20.002 N, and at another time, 19.997N. It will be appreciated that the actual values of force used in this example are somewhat incidental—it is the variation in these forces that is significant. Furthermore, because the amplification of control signals is undertaken by different amplifiers 190, 192 for different actuators 186, the variation in applied force may not (and most likely, will not) be consistent for groups of actuators, or all actuators 186 disposed along one or more sides of the imprint lithography template 180. The noise in the control signals caused by the amplification of the control signal by the different signal amplifiers 190, 192 can cause one or more problems.

In a first problem, if the total force applied to one side of the imprint lithography template 180 is not equal to the force applied to a second, opposite side of the imprint lithography template 180 (e.g. by opposed actuators), the imprint lithography template will not be positioned as intended but will be positioned at a slightly different, offset position. That position will be related to the difference in forces applied to the different sides of the imprint lithography template 180.

In a second, related, problem, the application of different forces to different sides of the imprint lithography template may result in the deformation, or the degree of deformation, of the imprint lithography template not being as intended. For example, the deformation might be too high or low in magnitude or direction.

Figure 20:
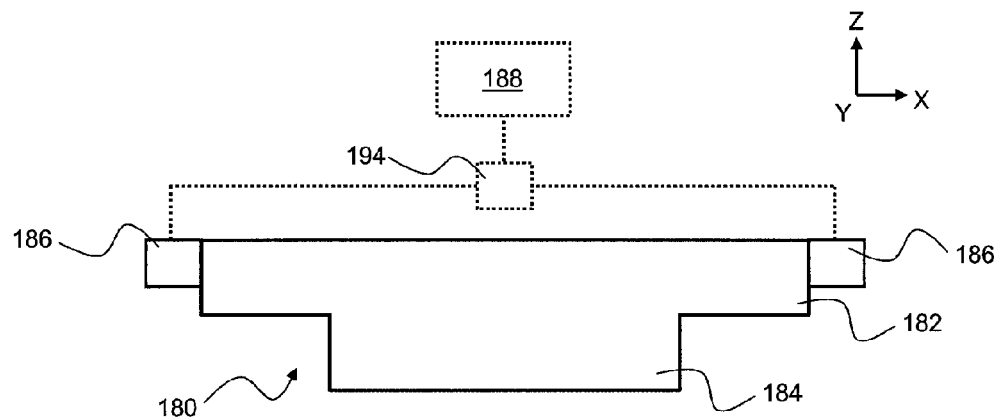
FIG. 20 schematically depicts a side-on view of the imprint lithography template arrangement of FIG. 18, together with a schematic depiction of connections between a signal amplifier and actuators of the actuation arrangement, in accordance with an embodiment of the present invention.

FIG. 20 shows how one or more problems of the above-mentioned control methodology and apparatus can be obviated or mitigated. FIG. 20 depicts substantially the same side-on view of the imprint lithography template 180 and actuators 186 of FIG. 19. FIG. 20 shows a plurality of actuators 186 located at a first position (e.g. side) of imprint lithography template 180, and a plurality of actuators 186 located at a second, opposite position (e.g., side) of the imprint lithography template 180. The same control unit 188 is also shown.

In contrast to the arrangement shown in FIG. 19, in FIG. 20 a single signal amplifier 194 is provided for amplifying a control signal applicable to an actuator 186 at a first position of the imprint lithography template 180, and an actuator at a second, opposite position of the imprint lithography template 180 (e.g. directly opposing actuators).

By providing a single signal amplifier that amplifies control signals applied to opposing actuators, any noise introduced by the signal amplifier is inherent in the control signals applied to both of the opposed actuators. This means that there will be no difference in the control signal applied to the opposing actuators, which means that the forces applied by both actuators should also be the same (assuming appropriately and substantially similar actuator characteristics for those actuators). Because the forces that are applied will be substantially the same, this means that the position of the imprint lithography template should be as intended.

The inherent noise may still result in the applied forces being the same, but of a magnitude not as intended. This may therefore still result in the deformation of the imprint lithography template not being as intended. However, because the forces applied to both sides of the imprint lithography template by the opposing actuators will be substantially the same, any correction in the applied force may be more readily applied.

In an embodiment, the signal amplifier will amplify the signal applied to actuators which are directly opposed (and not just simply on, e.g., opposite sides of the imprint lithography template) which may facilitate, or more readily facilitate the application of substantially equal forces to different opposing points (e.g., sides or points on those sides) of the imprint lithography template. A single signal amplifier may be associated with opposing pairs of actuators, opposing groups of actuators, or opposing actuators located along an entire side of an imprint lithography template. More than one amplifier may be provided, each amplifier being associated with opposing pairs of actuators, opposing groups of actuators, or opposing actuators located along an entire side of an imprint lithography template.

The actuators may be piezoelectric or Lorentz actuators, which introduce only a small amount of noise in the force that they provide for a given input signal (e.g. small in comparison with any noise generated by the signal amplifiers or of other controlling electronics).

The actuators discussed above will form an actuation arrangement to control the position (which includes orientation) and/or deformation (or degree of deformation) of an imprint lithography template. In one example this actuation arrangement may be in fixed connection with the imprint lithography template. In one example, the actuation arrangement may be in fixed connection with an imprint lithography template holder, which may be brought into connection with or contact with the imprint lithography template. In another example, the actuation arrangement may be locatable in-between an imprint lithography template holder and an imprint lithography template. It is likely that in most practical embodiments, the actuation arrangement will form a part of an imprint lithography template holder.

Increase Bandwidth of Positional and/or Deformation Control of Imprint Lithography Template Immediately Prior to Solidification of Imprintable Medium An imprint lithography template is usually imprinted into a layer of imprintable medium when that layer of imprintable medium is in a substantially liquid and/or flowable state. Such imprinting provides a pattern in that layer of imprintable medium. That pattern is then fixed (or in other words, frozen), for example by appropriate use of actinic radiation, or heat, or the like. Fixing of the pattern brings the imprintable medium into a fixed, substantially solid state. The imprintable medium will be in a fixed, substantially solid state at the end of a fixation process, for example at the end of an irradiation process with actinic radiation or at the end of a heating process, or the like. There will be a period of time during or over which the imprintable medium is not in its substantially liquid, flowable state, or a fixed, substantially solid state. Instead, over or during this intermediate period of time, the imprintable medium will be in an intermediate state where its stiffness (e.g. represented by the Young's modulus, E) is increasing rapidly over time.

Figure 21:
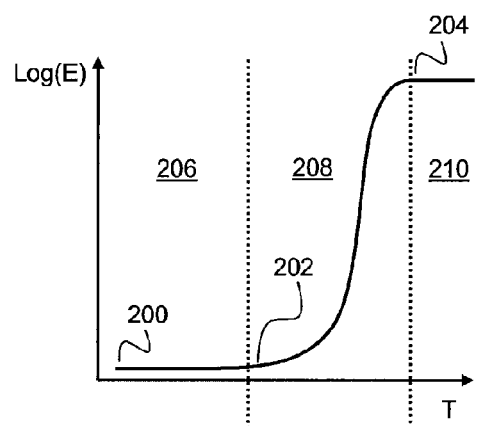
FIG. 21 is a graph schematically depicting a stiffness of imprintable medium over a period of time in which a fixation process is undertaken.

FIG. 21 is a graph schematically depicting a change in the stiffness of imprintable medium (represented by a log plot of Young's modulus E) over a period of time T.

At a first time 200, fixation of the imprintable medium begins, for example by exposure of the imprintable medium to actinic radiation. At a second, later time 202 the stiffness of the imprintable medium begins to increase rapidly, but not instantaneously. For example, the increase may be over a time period of less than a second, less than 500 milliseconds, less than 250 milliseconds, less than 100 milliseconds, or less than 50 milliseconds, or less than 10 milliseconds, or less than 5 milliseconds. The rate and duration of the increase will depend on a number of conditions, for example the type of imprintable medium, an intensity of actinic radiation, a temperature of a heat source, and the like. At a third time 204 the increase in stiffness will stop, and a maximum stiffness is reached. At this point, the imprintable medium has reached a fixed, substantially solid state.

The graph can be divided into three relatively distinct regions: a first region 206, when the imprintable medium is in an unfixed, substantially liquid and/or a flowable state; a second region 208, when the imprintable medium is in an intermediate state, increasing in stiffness between the unfixed, substantially liquid and/or flowable state 206, and a fixed substantially solid state; and a third region 210 in which the imprintable medium is in that fixed, substantially solid state.

Figure 22:
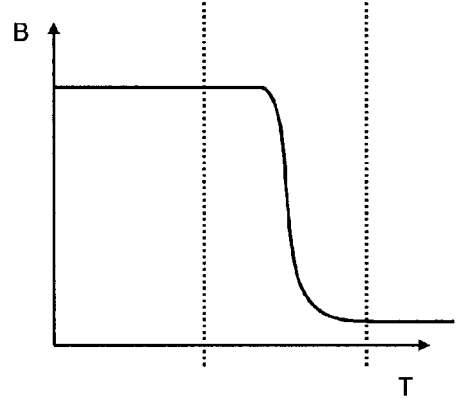
FIG. 22 is a graph schematically depicting a bandwidth of the control of the position and/or deformation of an imprint lithography template when imprinted into the imprintable medium, during the fixation process described in relation to FIG. 21.

FIG. 22 is a graph schematically depicting an exemplary bandwidth B of the control of the position (which includes orientation) or deformation of an imprint lithography template when imprinted into a layer of imprintable medium. The control bandwidth is depicted relative to the three temporal regions of the graph of FIG. 21.

FIGS. 21 and 22 are now referred to in combination. Relatively high bandwidth control of the position or deformation of the imprint lithography template relative to the substrate is undertaken when the imprintable medium is in a first, substantially liquid or flowable state 206. This relatively high bandwidth control continues into a time period in which the imprintable medium is in a second, intermediate state 208 (i.e. between substantially flowable and substantially fixed states). During this second, intermediate state 208, the bandwidth of the control is reduced to a relatively low bandwidth control as the stiffness of the imprintable medium increases and reaches the substantially fixed, solid state 210. The relatively low bandwidth control continues into the period for which the imprintable medium is in the substantially fixed, solid state 210.

Relatively high bandwidth control can be undertaken in the first (substantially fluid) and second (intermediate) states because, during the periods for which these states are in existence, the imprintable medium has not yet solidified. Thus, the high bandwidth control does not, or cannot, apply or induce high forces on or in the imprintable medium and/or on the substrate on which the imprintable medium is provided. However, as the stiffness of the imprintable medium increases, towards the substantially fixed state, the control bandwidth must reduce accordingly to low bandwidth control, to avoid the application or inducement of high forces in or on the imprintable medium and/or on the substrate itself. The avoidance of the application or inducement of high forces may be desirable for a number of reasons, for example to avoid damage to the layer of imprintable medium or displacement of the layer of imprintable medium and/or the substrate.

The transitional phase between high bandwidth control and low bandwidth control, and in particular during the intermediate state of the imprintable medium, is significant. This is because positional or deformation errors caused or induced during the period for which this state exists will or may be fixed into the layer of imprintable medium. Such errors may affect pattern placement or overlay.

According to an embodiment of the present invention, tighter (e.g. more accurate or stricter) position and/or deformation control of the imprint lithography template relative to the substrate is undertaken during the period for which the imprintable medium is in the intermediate state, i.e. between liquid and solid states. This tighter (e.g. more accurate or stricter) positional and/or deformation control is achieved by increasing the bandwidth of the control from a first, high level, to a second, higher level, just before the imprintable medium is fixed, i.e. when the imprintable medium is in the intermediate state, and before the control is reduced to a relatively low bandwidth. Such control methodology may help ensure that any pattern applied to the imprintable medium is positioned (which includes oriented) or deformed (e.g. has a magnification correction) more accurately or consistently than might otherwise have been achievable.

Figure 23:
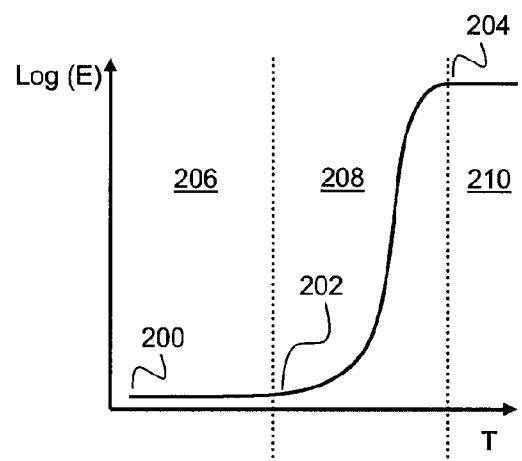
FIG. 23 is a graph schematically depicting a stiffness of imprintable medium over a period of time in which a fixation process is undertaken.
Figure 24:
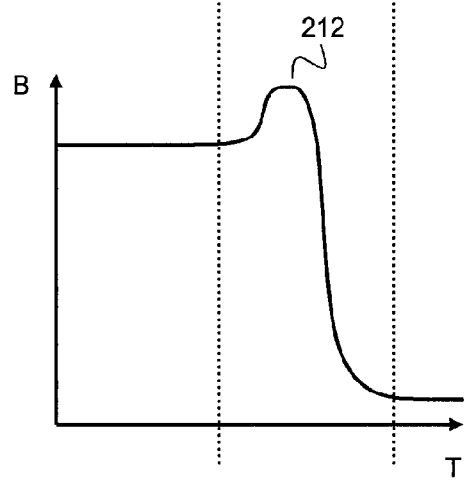
FIG. 24 is a graph schematically depicting a bandwidth of the control of the position and/or deformation of an imprint lithography template when imprinted into the imprintable medium, during the fixation process described in relation to FIG. 23, in accordance with an embodiment of the present invention.

FIG. 23 shows the same graph as shown in and described reference to FIG. 21. FIG. 24 shows the bandwidth of control of the position and/or deformation of the imprint lithography template relative to the substrate during the time periods discussed in relation to FIG. 21, and thus FIG. 23. In FIG. 24, the control bandwidth is similar to that shown in and described in reference to FIG. 22. However, in FIG. 24, and during the period for which the imprintable medium is in an intermediate state 208 (neither substantially flowable/fluid 206 nor substantially fixed 210), an even higher bandwidth control 212 is undertaken, after an initial period of high bandwidth control, and prior to the bandwidth being reduced to the relatively low level. Controlling the position or deformation of the imprint lithography template relative to the substrate may perhaps more generically be described as comprising:

i) undertaking relatively high bandwidth control at a first level when the imprintable medium is in an unfixed, substantially liquid and/or flowable state 206, followed by ii) undertaking higher bandwidth control at a second level, higher than the first level, when the imprintable medium is in an intermediate state 208, in-between the unfixed, substantially liquid and/or flowable state 206, and a fixed, substantially solid state 210, followed by iii) undertaking relatively low bandwidth control when the imprintable medium is in a fixed, substantially solid state 210.

A transition between the higher bandwidth control at the second level and the relatively low bandwidth control may (or desirably will) occur when the imprintable medium is in an intermediate state 208.

A transition between the higher and higher bandwidth control may occur when the imprintable medium is in an intermediate state 208.

The control of the position and/or deformation of the imprint lithography template relative to the substrate as referred to above may be implemented by the control of one or more servomechanisms used in the positioning or deformation of the imprint lithography template relative to the substrate.

A possible consequence of the higher (e.g. second) level of bandwidth control may be potential instability of, for example, servomechanisms or the like that are used to implement the described control. Settings of the higher (second level) bandwidth control may be tuned or selected to be below certain thresholds or the like. The tuning or selection may be such that any instability will arise (or will be more likely to arise) at or after a time which exceeds the period of time for which the higher level bandwidth control is implemented. This may obviate or mitigate any problems that might otherwise be associated with such instability.

The control of the position or deformation of the imprint lithography template relative to the substrate may involve the control of the position or deformation of the imprint lithography template, the substrate, or a combination (in series and/or in parallel) of the position and/or deformation of the imprint lithography template and the substrate.

When imprinting patterns into a layer of imprintable medium, it is often desirable to be able to accurately align these patterns with previously provided, or deposited, or processed patterns underlying that layer of imprintable medium (often referred to as overlay, or an overlay requirement). This is often a significant requirement that needs to be met in order to successfully construct or manufacture devices using a lithographic process. Therefore, the control referred to above may comprise, or be involved in aligning, or maintaining alignment of, the imprint lithography template arrangement relative to a target portion of the substrate, for example in order to meet, or more accurately meet, those overlay requirements or the like.

Figure 25:
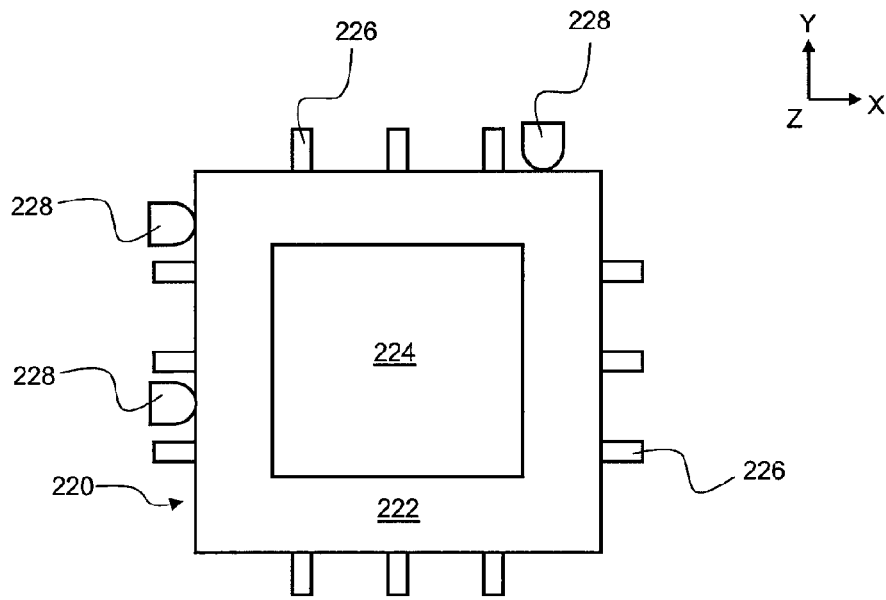
FIG. 25 schematically depicts an underside view of an imprint lithography template arrangement, including an actuation arrangement to position and/or deform an imprint lithography template of the imprint lithography template arrangement.

Reduction of Magnification Forces Applied to Imprint Lithography Template that are Imparted onto Positional Supports FIG. 25 schematically depicts an underside view of an imprint lithography template 220. The imprint lithography template 220 comprises a base region 222 from which extends a mesa region 224. The mesa region 224 is provided with one or more patterns for use in imprinting a corresponding pattern into a layer of imprintable medium. Surrounding the imprint lithography template 220 is a plurality of actuators 226 which may provide suitable force to position and/or deform the imprint lithography template 220. Fixed abutment points 228 are also provided, which may alternatively be described as positional supports. The abutment points 228 are provided to fix three degrees of freedom of the imprint lithography template 220. The three degrees of freedom are translation along a first axis parallel to a plane of the imprint lithography template 220 (i.e. along the x-axis), translation along a second axis, perpendicular to the first axis and parallel to the plane of the imprint lithography template 220 (i.e. along the y-axis), and rotation about a third axis, perpendicular to the first and second axis (i.e. about the z-axis).

The actuators 226 and abutment points 228 form part of an actuation arrangement.

In use, it may be desired to deform the imprint lithography template 220, for example to compress the imprint lithography template 220 to implement a magnification correction or the like. A typical compression of the imprint lithography template 220 may be 5 ppm (parts per million) of the length of the template 220. Such compression might involve, for example, the application of a deformation force of up to 200 N per side of the imprint lithography template 220.

The stiffness of the imprint lithography template 220 may typically be $4 \times 10^8$ N/m. The stiffness of the fixed abutment points 228 may be of the order of $2 \times 10^8$ N/m. However, and in contrast, the stiffness of a contact point, or area or region between the imprint lithography template 220 and the fixed abutment points 228 may be much lower stiffness, and for example be in the range of $2-3 \times 10^7$ N/m. This much lower contact stiffness dominates the stiffness for the arrangement as a whole, and may be a point of weakness when trying to accurately position an imprint lithography template.

Suppose that the imprint lithography template positional accuracy should be better than 0.2 nm. The corresponding force disturbance (e.g. noise in the force) provided by the actuators 226 should be less than 4 mN. It has already been described that the applied compression force could be up to 200 N and so the signal to noise ration of the actuator 226 should be better than $5 \times 10^4$. Providing an actuator with such a signal to noise ratio is far from trivial. It is desirable to avoid the requirement of an actuator with such a high signal to noise ratio.

In accordance with an embodiment of the present invention, a controller (not shown) used to control a force provided by the one or more actuators 226 is configured to help ensure that the provided force is such that a cumulative force acting along the first axis, second axis and about the third axis, all as mentioned above (i.e. along the x and y axis, and about the z-axis), is minimal. This may alternatively or additionally be described as ensuring that the (e.g. compression) forces acting on the imprint lithography template 220 are substantially in equilibrium. Of course, different pairs of opposing actuators 226 may still provide different overall forces, to allow for appropriate deformation of the imprint lithography template 220.

Reduction in the forces being applied to the fixed abutment points 228, and for example, between or through the contact points between the fixed abutment points 228 and the imprint lithography template 220, allows for more design freedom for the actuators 226 that provide that force. This is because the relatively low stiffness of the contact points between the fixed abutment points 228 and the imprint lithography template 220 is of less importance when the force acting on those points is reduced, and this allows the signal to noise ratio of the actuators 226 to be lower, and thus more readily achievable, for instance using piezoelectric or Lorentz actuators.

'Minimal' in this context may be defined by the force being applied to (which includes through) one, more or all fixed abutment points 226 as being less than 5% of a total force applied to the imprint lithography template 220, less than 4%, less than 3%, less than 2%, less than 1%, substantially 1%, or substantially 0% of a total force applied to the imprint lithography template 220. Desirably, the force being applied to (which includes through) one, more or all fixed abutment points 226 is equal to or less than 2% of a total force applied to the imprint lithography template 220. The force can be controlled to be minimal by appropriate cumulative (or holistic) consideration of the control of the actuators 226.

Figure 26:
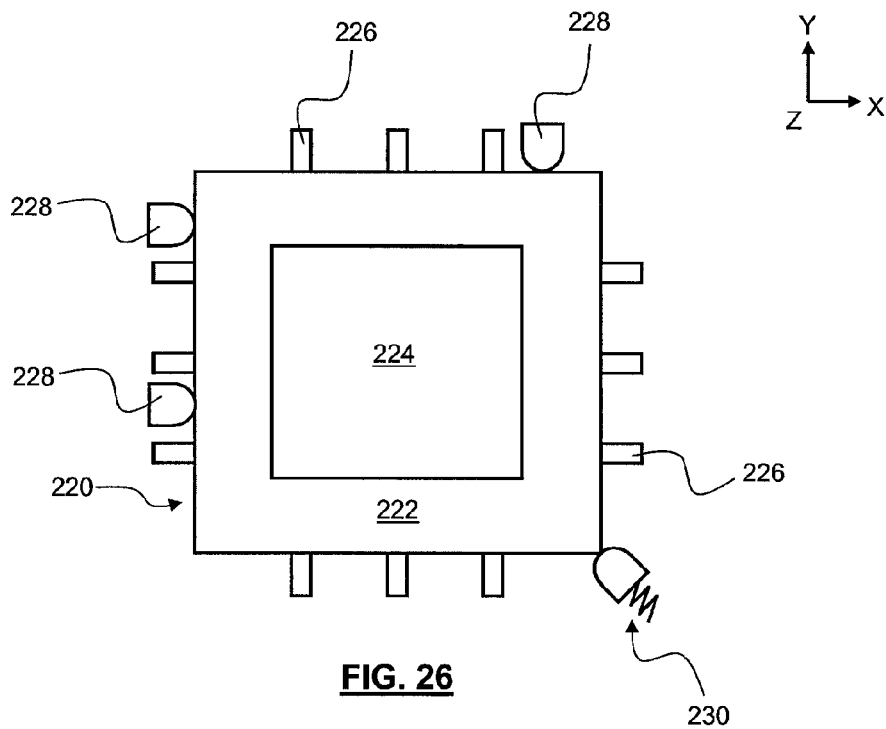
FIG. 26 schematically depicts an underside view of an imprint lithography template arrangement, including an actuation arrangement to position and/or deform an imprint lithography template of the imprint lithography template arrangement in accordance with an embodiment of the present invention.

Since the cumulative forces acting along the first axis, second axis, and about the third axis, are minimal, there may be a need to bias the imprint lithography template 220 in to contact with the fixed abutment points in order to fix the degrees of freedom, as mentioned above. FIG. 26 schematically depicts a pre-loaded biasing member 230. The biasing member 230 may comprise of an abutment surface or face, attached to a spring or other biasing element.

Alternatively or additionally, the biasing of the imprint lithography template in to contact with the fixed abutment points can be achieved by there being a non-zero deformation force (i.e. where the 'minimal' forces referred to above are non-zero), or an additional positional actuator may be provided.

As discussed above, there may be a non-zero compression force acting on the fixed abutment points 228. This force may be, for example, 1% of the total compression forces that are provided to the imprint lithography template 220. From the values given above, it can be shown that the signal to noise ratio of each actuator 226 becomes equal to $5 \times 10^2$. However, it may be that the compression or deformation of the imprint lithography template 220 should be greater than 1 nm. A deformation accuracy may be 0.2 nm or lower. In this case, the compression or deformation force disturbance (i.e. noise in the provided force) should be smaller than 40 mN. The signal to noise ratio then becomes $5 \times 10^3$. This is readily achievable, and far less than the signal to noise ratio discussed above.

In general, an embodiment of the invention separates template deformation and positioning, which reduces the chances of noise in the deformation forces having an impact on positioning.

An imprint lithography template may have one of a number of different shapes. However, proposed and existing imprint lithography templates are typically rectangular (which includes square). In order to fix three degrees of freedom referred to above, three fixed abutment points may be required. Two fixed abutment points will be locatable along one side of the imprint lithography template, and another fixed abutment point will be located along an adjacent side of the imprint lithography template.

The actuators discussed above will form an actuation arrangement to control the position (which includes orientation) and/or deformation (or degree of deformation) of an imprint lithography template. In one example this actuation arrangement may be in fixed connection with the imprint lithography template. In one example, the actuation arrangement may be fixed connection with an imprint lithography template holder, which may be brought into connection with or contact with the imprint lithography template. In another example, the actuation arrangement may be locatable in-between an imprint lithography template holder and an imprint lithography template. It is likely that in most practical embodiments, the actuation arrangement will form a part of an imprint lithography template holder.

Figure 27:
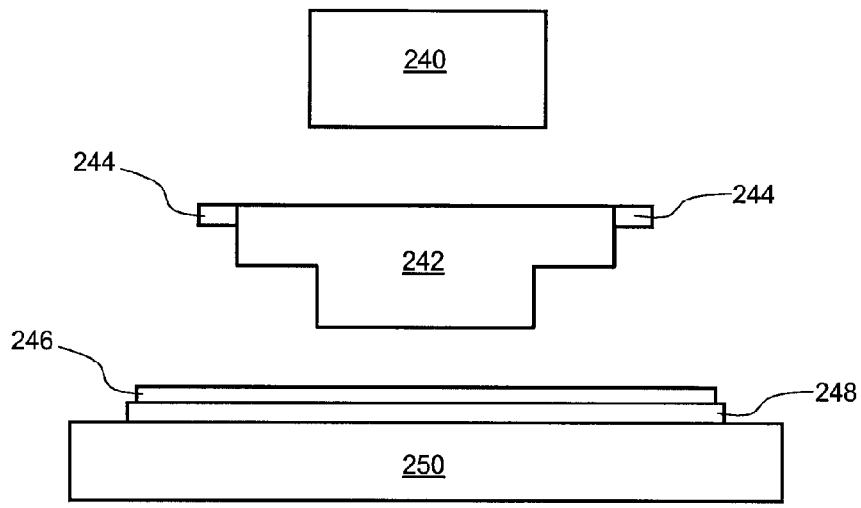
FIG. 27 schematically depicts an apparatus used in an imprint lithography method.

Sensing of Template Compression Forces Applied to Imprint Lithography Template to Improve Positioning FIG. 27 schematically depicts a side-on view of an imprint lithography apparatus. The apparatus comprises an alignment sensor 240. An imprint lithography template 242 is also provided, in combination with one or more actuators 244 for use in positioning and/or deforming the imprint lithography template 242. A layer of imprintable medium 246 is provided on a substrate 248. The substrate 248 is held on a substrate stage 250.

The alignment sensor 240 may be used to align the imprint lithography template 242 relative to a target portion of the substrate 248 (which includes the imprintable medium 246 provided thereon), for example before and/or during an imprint process.

There is a problem associated with the use of the apparatus shown in FIG. 27. The actuator 244 may be used to deform, by compression, the imprint lithography template 242. Such deformation might also result in a slight change in position. The actuator 244 may have a control bandwidth in excess of 100 Hz, which means that a change in an applied compressive force, and unintended change in position, can be implemented at this frequency. However, the alignment sensor 240 has a detection bandwidth (i.e. a frequency at which change can be detected) of typically less than 10 Hz or even less than 5 Hz. Because the alignment sensor has a lower detection bandwidth than the (implementation) control bandwidth of the actuator 244, high frequency positional change resulting from the change in compressive force applied by the actuator 244 may not be detectable by the alignment sensor 240. Since the alignment sensor 240 cannot detect these changes (or at least all of these changes), change in the position of the imprint lithography template 242 which is not detected by the alignment sensor 240 will or may not be taken into account during an imprint. This can result in a pattern being inaccurately applied during an imprint lithography process. It is desirable to limit or avoid this problem.

Figure 28:
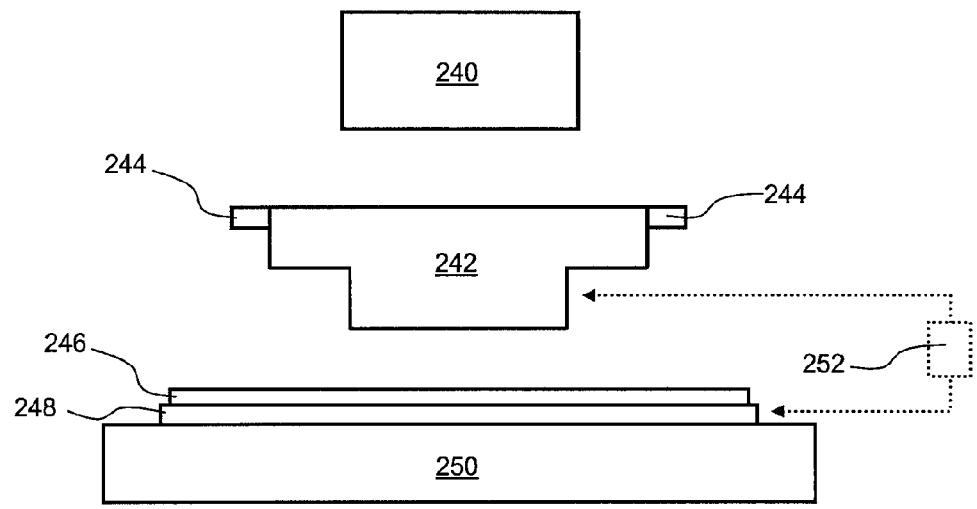
FIG. 28 schematically depicts an apparatus used in an imprint lithography method, in accordance with an embodiment of the present invention.

FIG. 28 schematically depicts an imprint lithography apparatus substantially as shown in and described with reference to FIG. 27. However, in addition to the apparatus shown in FIG. 27, in FIG. 28 a relative position sensor 252 is shown. The relative position sensor 252 is constructed and arranged to measure a relative position between the imprint lithography template 242 and the substrate 248. The relative position sensor 252 has a detection bandwidth which is greater than the detection bandwidth of the alignment sensor 240. The relative position sensor 252 can therefore be used to account for any shortcomings in the performance of the alignment sensor 240, and in particular the low detection bandwidth of the alignment sensor 240.

Whereas the alignment sensor 240 may provide an absolute positional measurement, relative to, for example, a metrology frame of the apparatus (not shown), or between a reference mark on the substrate 248 and a reference mark on the imprint lithography template 242, or the like, the relative position sensor 252 can provide relative positional measurements, which can be used in the positioning of the imprint lithography template 242 relative to the substrate 248. In combination, the imprint lithography template 242 may be more accurately aligned (i.e. positioned relative) to the substrate 248 than with use of the alignment sensor 240 alone.

As discussed above, the alignment sensor may have a typical detection bandwidth of less than 10 Hz, or even less than 5 Hz, for example a few Hertz. In contrast, the relative position sensor may have a detection bandwidth of greater than 50 Hz, greater than 100 Hz, or greater than 200 Hz.

Although not shown in FIG. 28, additional measurement functionality may be provided in the form of one or more force sensors which may constitute part of, or be in connection with, the actuator 244. The force sensor may be used to measure, directly or indirectly, the force applied by the actuator 244. The force sensor may, again, have a detection bandwidth greater than that of the alignment sensor 240 discussed previously. The force sensor could be, for example, a position sensor, or a current sensor, or any other form of sensor which can be used to determine a force applied to the imprint lithography template 242. A controller of the apparatus may be used to convert the force applied to the imprint lithography template 242 by a respective actuator 244 into a position of the imprint lithography template 242 (e.g. a relative position), and this may be used in the determination of an absolute position, and/or the positioning, of the imprint lithography template 242 relative to the substrate 248.

In an additional or alternative embodiment, one or more of the above, or other, problems may be obviated or mitigated by reducing the control bandwidth relating to the deformation of the imprint lithography template.

In this additional or alternative embodiment, a method may comprise controlling a position and deformation of the imprint lithography template relative to a substrate (e.g. a target portion of the substrate) in order to achieve a position and deformation substantially as intended. When the imprint lithography template is positioned and deformed substantially as intended, a control bandwidth associated with the deformation of the imprint lithography template may be reduced. By reducing the control bandwidth related to the deformation of the imprint lithography template, the alignment sensor may more readily detect change in position of the imprint lithography template caused by change in compressive force applied by the actuator used in the deformation of the imprint lithography template. Thus, the control bandwidth in this embodiment may be an implementation bandwidth related to the implementation of a deformation of the imprint lithography template (e.g. via a signal applied to the actuator, or a controller of the actuator).

The control bandwidth may be reduced to less than 100 Hz, less than 50 Hz, less than 10 Hz, less than 5 Hz, and/or more generically, to a bandwidth that is in the detection range of an alignment sensor used in the alignment of the imprint lithography template with a target portion of the substrate.

The reduction in the control bandwidth related to the deformation of the imprint lithography template may be implemented before the imprint lithography template is implemented into the imprintable medium, during the imprint, or both before and during the imprint.

Figure 29:
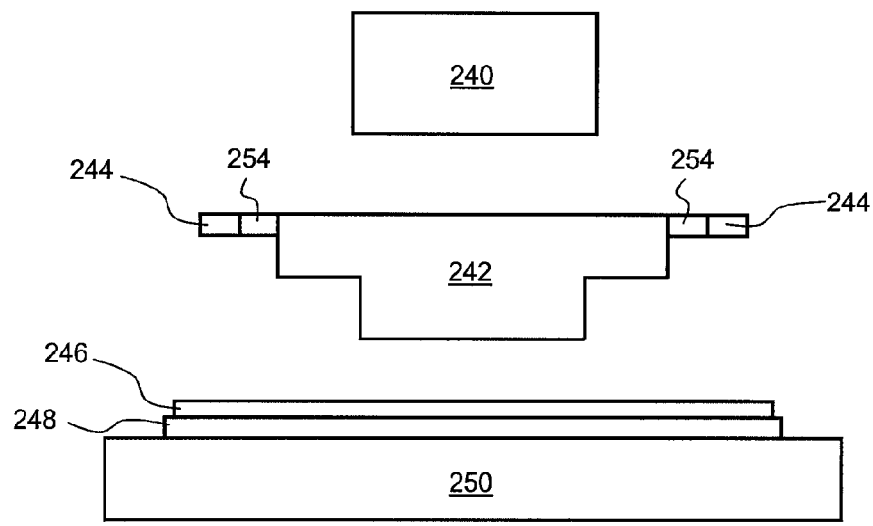
FIG. 29 schematically depicts an apparatus used in an imprint lithography method, in accordance with a further embodiment of the present invention.

The use of a force sensor has already been discussed above. In an additional or alternative embodiment of the present invention, the use of a force sensor may be used as an alternative to, or in addition to, one or more concepts previously described. FIG. 29 schematically depicts substantially the same imprint lithography apparatus as shown in and described with reference to FIG. 27. However, and in contrast with the apparatus shown in FIG. 27, FIG. 29 shows the incorporation of one or more force sensors 254 constituting a part of, or at least being in connection with, the actuator 244.

As discussed above, the force sensor 254 may have a detection bandwidth that is greater than the detection bandwidth of the alignment sensor 240. This facilitates accurate (or more accurate) positional measurement and/or positional control of the imprint lithography template which the alignment sensor 240 alone could possibly not provide (due to its relatively low detection bandwidth).

The apparatus may further comprise a control arrangement (not shown) configured to receive an output from the force sensor 254, and further configured to convert this output into a position of the imprint lithography template 242. This position could be a relative or absolute position of the imprint lithography template, or a change or shift in such a position. In practice, it is likely that the position will be a relative position or shift in such relative position, whereas the alignment sensor may provide an absolute positional measurement.

The force sensor may have a detection bandwidth of greater than 50 Hz, greater than 100 Hz, or greater than 200 Hz. This is in comparison with the alignment sensor, which may have a detection bandwidth of less than 10 Hz, or less than 5 Hz.

Each actuator 244 may comprise, or be in connection with a force sensor 244. Each force sensor 254 may be a position sensor, or a current sensor, or any other form of sensor which can be used to determine a force applied to the imprint lithography template 242.

The determination of a position, or change in position of the imprint lithography template 242 via the force sensor 254 may be undertaken in parallel or in series with a positional measurement undertaken with or by the alignment sensor 240. In practice, it is likely that the measurements will be undertaken in parallel so that there are no times when only a low bandwidth detection measurement is undertaken, where positional inaccuracies could occur.

Dispensing of Gas in an Asymmetric Manner

In an imprint lithography method, an imprint lithography template is brought in to contact with an imprintable medium. That imprintable medium may be provided in the form of a plurality of droplets. Once the droplets have been provided on a substrate, the droplets spread out until a continuous layer is formed. In a first phase, the droplets can spread out freely, driven by the equilibrium of surface tension forces and viscous drag forces until the droplets touch each other. When the droplets begin to touch each other, gas present in or forming a gaseous atmosphere in which the imprint lithography method takes place (e.g. air) is trapped between the droplets, the substrate, and imprint lithography template. These trapped pockets of gas are sometimes referred to as inclusions or gas inclusions. In a second phase, these gas inclusions dissolve. The gas inclusions dissolve by diffusion of the gas in the inclusion through and/or into one or more of the imprintable medium itself, the substrate and/or the imprint lithography template. Ideally, all of the gas inclusions should dissolve as quickly as possible, so that a next step in the imprint lithography process can take place as soon as possible. If the gas inclusions do not dissolve at all, the inclusions may form defects in an applied pattern.

A problem that may be encountered when undertaking an imprint lithography method in air (e.g. when the gaseous atmosphere comprises air) is that the air may take a prolonged period of time to diffuse into the imprint lithography template and/or substrate and/or the imprintable medium. In an attempt to at least partially overcome this problem, a gas other than air may be used to form the gaseous atmosphere in which the imprinting of a pattern is to take place. The gas used to form the gaseous atmosphere is specifically chosen for its ability to quickly (or at least more quickly than air) diffuse into one or more of the imprint lithography template, the substrate, and/or the imprintable medium itself. The faster diffusion results in a faster imprint lithography method. A gas that has been proposed for use in this manner is helium due to its ability to diffuse more easily than air into an imprint lithography template (e.g. a template formed from quartz or fused silica).

Figure 30:
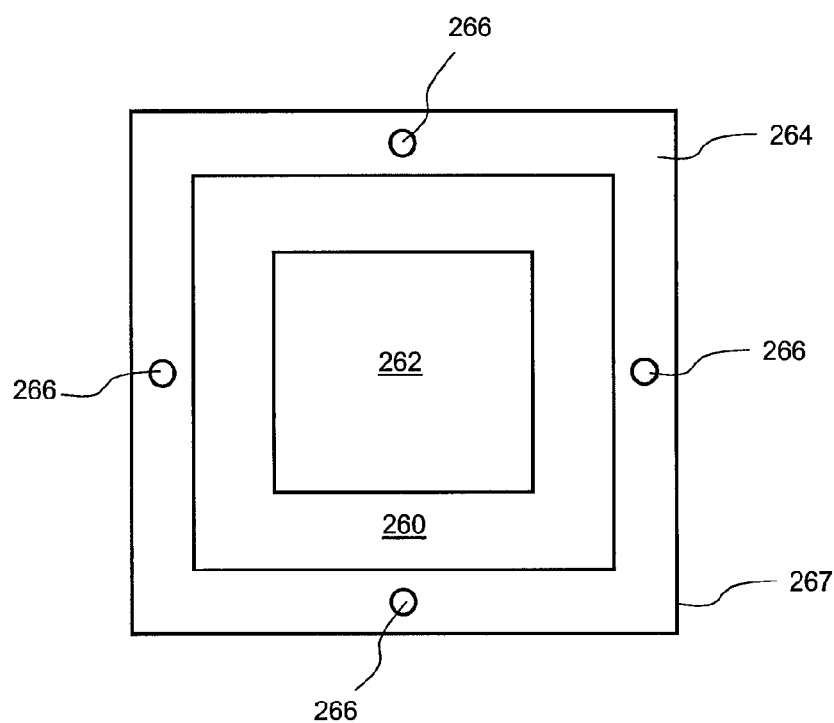
FIG. 30 schematically depicts part of an imprint lithography apparatus, including a gas dispensing arrangement, in accordance with an embodiment of the present invention.

FIG. 30 schematically depicts an under side view of an imprint lithography template arrangement for use in imprinting a pattern into a layer of imprintable medium provided on a substrate (the substrate not being shown in the Figure). In this example, the imprint lithography template arrangement comprises an imprint lithography template. The imprint lithography template comprises a base region 260 from which protrudes a mesa 262 on which one or more pattern features may be provided for use in imprinting a pattern into a layer of imprintable medium provided on a substrate. The mesa 262 and base region 260 may be integrally formed.

Surrounding the imprint lithography template is a gas dispensation arrangement 264 to provide a gaseous atmosphere in which atmosphere the imprinting of a pattern is to take place. The gas dispensation arrangement 264 may, for example, form part of, or be attached to, an imprint lithography template holder used in the holding (and the movement and the like) of the imprint lithography template. In another example, the gas dispensation arrangement 264 may be separate from the imprint lithography template holder. The gas dispensation arrangement 264 comprises one or more gas outlets 266 distributed around the imprint lithography template. In another embodiment, the one or more gas outlets 266 may be distributable around the imprint lithography template, for example by appropriate movement or the like of the outlet. In an embodiment, the gas outlets 266 are distributed symmetrically about a center of the imprint lithography template, for example relative to a center of the mesa 262 of the imprint lithography template. For instance, outlets 266 on opposite sides of the mesa 262 are located directly opposite one another, and are aligned with the center of the mesa 262.

The gas dispensation arrangement 264 may further comprise a skirt or the like 267 which may, in use, at least partially surround or envelop or the like a region located between the imprint lithography template and the substrate, to retain, or at least promote the retention of, the gas dispensed by the gas dispensation arrangement 264.

In use, gas (for example helium) will be dispensed from the outlets 266 to purge air or the like from a region located in-between the imprint lithography template arrangement and the substrate holder and/or a substrate held thereon. The intention is that, by doing this, helium will form the gaseous atmosphere in which imprint takes place, and not air. However, due to the symmetric distribution of the gas outlets 266 about the imprint lithography template, air in the middle of the imprint lithography template (e.g. in the middle of the mesa 262) may not be readily purged (e.g. removed). This is because the gas pressure is provided in a symmetric manner. The air becomes trapped, because the gas pressure provided by the gas dispensation arrangement 264 is the same all the way around the center of the mesa 262 (e.g. the gas pressure is applied equally and symmetrically from all four sides of the gas dispensation arrangement 264, relative to the center of the mesa 262). If the air becomes trapped, any inclusions comprising air will take longer to dissolve than inclusions containing helium. This may slow down the imprint lithography process.

According to an embodiment, a problem discussed above may be at least partially overcome by dispensing gas in an asymmetric manner. Dispensing gas in asymmetric manner reduces or eliminates the possibility of the gas pressure surrounding the center of the imprint lithography template arrangement being the same. Due to the asymmetry, any gas or the like (e.g. air) that is to be displaced by the gas introduced by the gas dispensation arrangement (e.g. helium) may more readily escape or be displaced from the center of the imprint lithography template arrangement.

Figure 31:
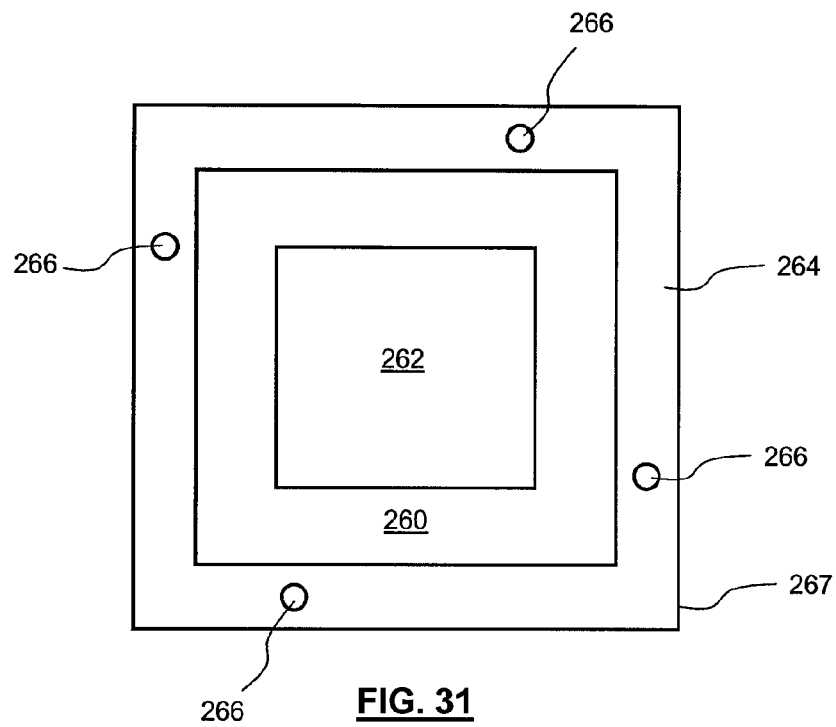
FIG. 31 schematically depicts part of an imprint lithography apparatus, including a gas dispensing arrangement, in accordance with an embodiment of the present invention.
Figure 32:
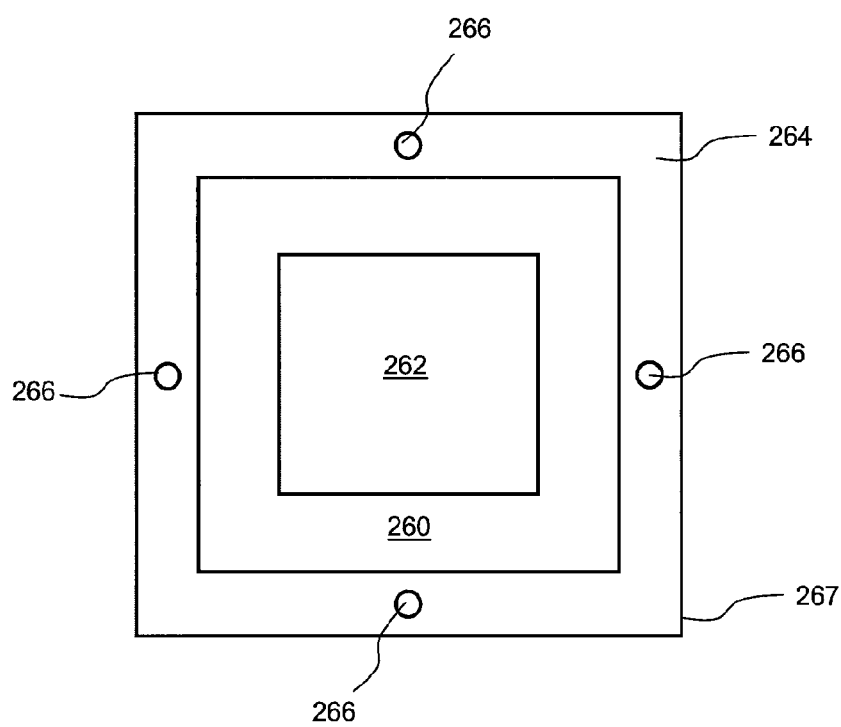
FIG. 32 schematically depicts part of an imprint lithography apparatus, including a gas dispensing arrangement, in accordance with an embodiment of the present invention.

FIGS. 31 and 32 will be used to describe embodiments of the present invention. Features appearing in FIGS. 31 and 32, and already shown in and described with reference to FIG. 30, are given the same reference numerals for clarity and consistency.

FIG. 31 shows that in order to dispense gas in an asymmetric manner, the gas outlets 266 may be distributed (if the gas outlets 266 are fixed in position) or distributable (if the gas outlets 266 are movable) in an asymmetric manner, relative to the center of the imprint lithography template (e.g. the mesa 262 thereof). For instance, it can be seen that gas outlets 266 on opposite sides of the gas dispensation arrangement 264 are not located directly opposite one another, and/or are not aligned with the center of the imprint lithography template.

Gas may be dispensed or introduced in an asymmetric manner by appropriately asymmetrically distributed gas outlets 266, as for example already shown in and described with reference to FIG. 31. Alternatively and/or additionally, the asymmetric manner of the gas dispensation may be achieved in one of a number of different ways, even if the gas outlets 266 are symmetrically distributed about the imprint lithography template.

FIG. 32 shows a situation where the gas outlets are distributed symmetrically about the mesa 262 of the imprint lithography template. When the gas outlets 266 are distributed in this symmetrical manner, the asymmetrical nature of the gas dispensation may be achieved using two (at least) different approaches. In the first approach, the gas dispensation arrangement 264 may be configured to dispense gas at different pressures at different outlets 266, to thus dispense gas in an asymmetric manner. In a second, alternative or additional approach, the gas dispensation arrangement 264 may be configured (e.g. appropriately controlled) to dispense gas at different times at different outlets, to thus dispense gas in an asymmetric manner.

Using one or more of the embodiments shown in and described with reference to FIGS. 31 and 32, or combination thereof, gas that should be purged from the center of the imprint template arrangement (e.g. air), and which would otherwise be trapped or more readily trapped in inclusions, may be purged more readily and replaced with gas provided by the gas dispensation arrangement (e.g. helium). This results in a reduction in the time taken for any gas inclusions (e.g. at the center of the imprint template arrangement) to dissolve, thus decreasing the time taken to implement an imprint lithography method.

Contamination Barrier Separating a Relatively Dirty Region from a Relatively Clean Region It is desirable to limit the amount of contamination generated in a lithographic apparatus (optical or imprint based) in order to limit the effect that any such contamination might have on the application of patterns to a substrate. Contamination may be externally generated, for example in the form of dust or particulate matter that might enter the apparatus. However, contamination may also be generated internally, within a lithographic apparatus. Contamination may be generated internally, for example, by the movement or the like of an actuator or a part of the apparatus that the actuator controls, for example a clamp, a positioner, a holder, a camera and the like.

In optical lithography, the effect of internally generated contamination may be reduced by having any (or most) movable elements that may generate such contamination be located below the level of the substrate. Generated contamination will generally fall, under the influence of gravity and/or any provided gas down flow, below the level of the substrate, thus reducing or eliminating the possibility of the contamination falling onto the substrate. In optical lithography, this may be readily achievable since it may be readily possible to design and construct an optical lithographic apparatus where most, if not all, of the moving parts are located below the level of the substrate. However, in imprint lithography, this may not readily achievable, due to the need to provide one or more movable elements used in an imprint lithography process, or one or more actuators for those movable elements, above the level of the substrate. Such movable elements and/or actuators may also be located at or above the level of an imprint lithography template used to imprint patters onto the substrate. Such movable elements may, for example, comprise a part of the imprint lithography template arrangement, an imprint lithography template holder, an imprint lithography template positioner (which may be, or constitute part of, an imprint lithography template holder), a camera, a sensor, or a radiation source. In general, one or more movable elements may be provided which are configured for use in conjunction with the imprint lithography template in providing a pattern in a layer of imprintable medium.

As discussed above, movable elements located above the level of the substrate, and in some examples above the level of the imprint lithography template, may generate contamination that will fall, under gravity, on to the imprint lithography template (and in particular, the patterned region of that template) and/or the substrate. It is desirable to reduce or eliminate the contamination of the substrate and/or the imprint lithography template from a source of contamination in the form of a movable element and/or an actuator therefor.

According to an embodiment of the present invention, a problem described above may be at least partially obviated or mitigated by providing a contamination barrier that divides the lithographic apparatus into at least two regions (e.g. the at least two different regions are separated by the contamination barrier). The two regions comprise a first, relatively unclean, region in which is located one or more movable elements. The one or more movable elements will most likely be configured for use in conjunction with an imprint lithography template for use in providing a pattern in a layer of imprintable medium (e.g. imaging, moving, deforming or the like of the template). A second, relatively clean, region, separated from the first, relatively unclean, region, contains the substrate stage, and, if holding a substrate, the substrate itself, and a patterned region of the imprint lithography template (which may be provided on a mesa of the imprint lithography template). The purpose of the contamination barrier is to help prevent contamination generated by a movable element in the first region from passing into the second region, where contamination of the substrate, substrate holder, and/or patterned region of the imprint lithography template could otherwise take place. The first region will, usually, be a generally upper region of the imprint lithography apparatus, and the second region will, usually, be a generally lower region of the imprint lithography apparatus. It is desirable to keep a lower region of the imprint lithography apparatus clean (or as clean as possible) since this is the region in which the substrate will be located, and also, in use, the imprint lithography template, both critical components in the imprinting of patterns. The upper region will, as described above for imprint lithography, usually contain one or more movable elements for use in conjunction with an imprinting process or method.

Figure 33:
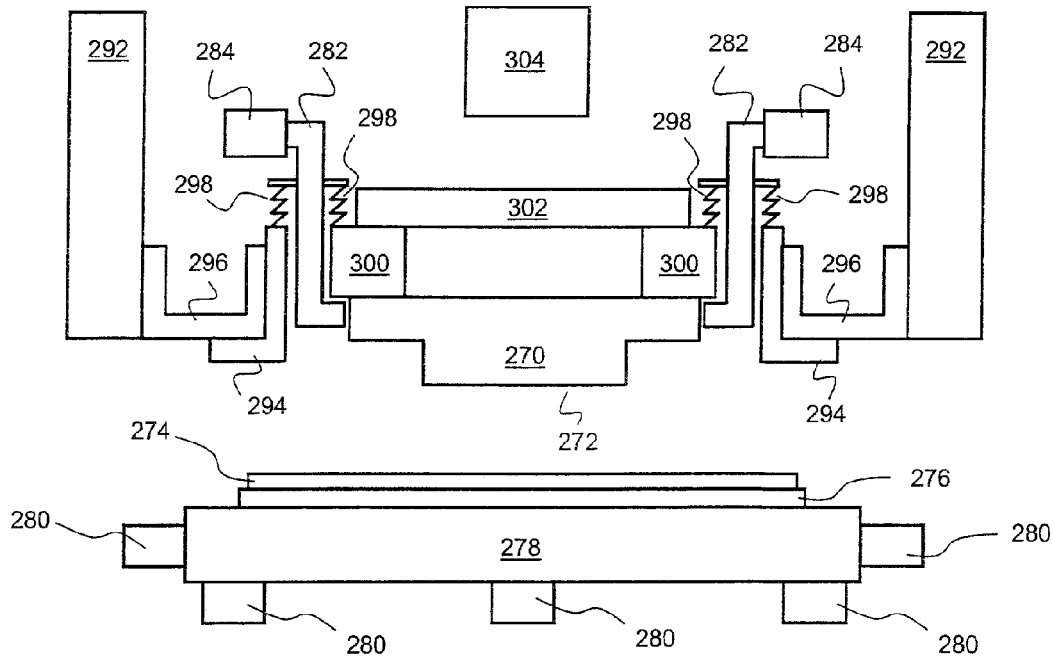
FIG. 33 schematically depicts part of an imprint lithography apparatus, including a contamination barrier, in accordance with an embodiment of the present invention.

FIG. 33 shows an imprint lithography apparatus in accordance with an embodiment of the present invention. The imprint lithograph apparatus comprises an imprint lithography template 270 provided with a patterned region 272 for use in imprinting a pattern into a layer of imprintable medium 274 provided on a substrate 276. The apparatus further comprises a substrate stage 278 to hold and/or move the substrate 276. The substrate stage 278 may be moved, positioned or the like using one or more actuators 280 located under, adjacent or around the substrate stage 278, and below the level of the substrate 276. Since the actuators 280 are located below the level of the substrate 276, contamination generated by the actuators 280 will generally thus fall under gravity, and any downwardly directed gas flow, below the level of the substrate 276 and will thus not contaminate the substrate 276 or the imprintable medium 274 provided thereon.

An imprint lithography template holder 282 is also provided which is actuated by one or more actuators 284. The actuators 284 and imprint lithography template holder 282 are both located above the substrate 276, and may also be located above the patterned region 272 of the imprint lithography template 270. Thus, contamination generated by movement of the actuator 284 and/or imprint lithography template holder 282 may fall in a downward direction and into contact with the substrate 276, imprintable medium 274 and/or patterned region 272 of the imprint lithography template 270. In order to help prevent such contamination from making such contact, a contamination barrier is provided which divides (i.e. separates) the imprint lithography apparatus into at least two regions.

Figure 34:
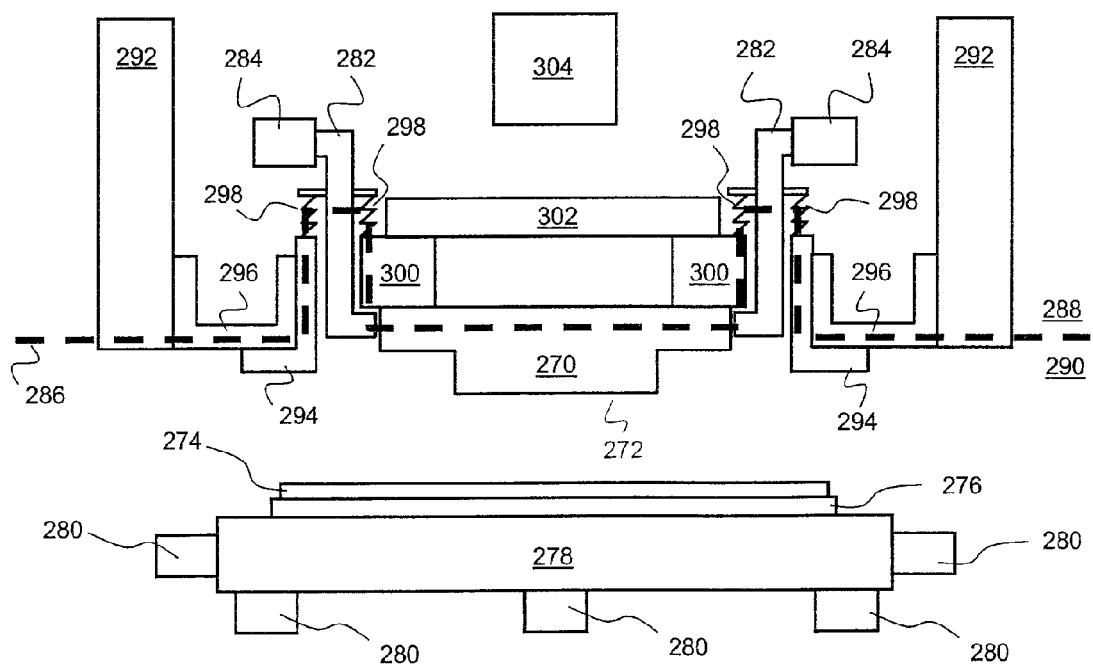
FIG. 34 shows the same part of the imprint lithography apparatus of FIG. 34, and additionally includes a schematic depiction of regions defined by, and separated by, the contamination barrier.

FIG. 34 shows the same apparatus as shown in FIG. 33 but, in addition, also shows the separation 286 (or in other words division or delineation) provided by the contamination barrier between a first, relatively unclean, region 288 and a second, relatively clean, region 290.

FIGS. 33 and 34 will now be referred to in combination. The first region 288 is a generally upper region of the imprint lithography apparatus and the second region is a generally lower region of the imprint lithography apparatus. Located in the first region 288 are the actuators 284 for the imprint lithography template holder 282. Located in the second region is the patterned region 272 of the imprint lithography template 270, the substrate 276, and the layer of imprintable medium 274 provided on that substrate. Dividing or separating the two regions 288, 290 is the contamination barrier.

Located between fixed parts of the imprint lithography apparatus (for example parts of a base frame 292 or the like, and another, for example, secondary frame 294 or the like) is/are one or more trays or containers 296 which form a part of the contamination barrier. The trays or containers 296 are provided to catch contamination generated by movement of, for example, the actuators 284, and thus help prevent contamination generated by the actuators 284 from reaching the second, relatively clean region 290.

Parts of the contamination barrier located in-between movable parts of the imprint lithography apparatus, or between a fixed part and a movable part of the imprint lithography apparatus, may be formed from one or more flexible members, to allow for movement of the movable parts of the apparatus. For instance, such flexible members 298 may be located between a part of the imprint lithography template holder 282 that is movable, and one or more relatively fixed structures, for example the secondary frame 294 and/or another fixed structure 300. The flexible members may be, for example, expandable, contractible, and/or elastic in nature, or the like, in order to accommodate movement of the movable part of the imprint lithography apparatus.

Together, the trays or containers 296 and the flexible members 298 (together with parts of the apparatus to which these components are attached) form a barrier that extends around the imprint lithography template 270, and generally across at least a portion of the imprint lithography apparatus, thus defining, dividing or at least separating the two regions 288, 290.

FIGS. 33 and 34 depict a further advantageous feature, wherein at least a portion of the reverse side of the imprint lithography template 270 may be located or locatable (for example when the imprint lithography template 270 is loaded into an imprint lithography apparatus) in the second region 290. This may be achieved by the appropriate configuration of the contamination barrier. For example, as shown in the Figures, in the vicinity of at least a portion of the reverse side of the imprint lithography template 270, the contamination barrier may include (or at least a part of the contamination barrier may be formed from) material 302 that effectively separates the portion of the reverse side of the imprint lithography template 270 from the first, relatively unclean, region. The material might be substantially transparent to actinic radiation. The actinic radiation may be provided by a radiation source 304, and may be used to fix or freeze a pattern provided in the layer of imprintable medium 274 during imprinting, even when the contamination barrier is present.

By configuring the contamination barrier in the manner described above, the contamination barrier extends more or less continuously across the imprint lithography apparatus and above a position in which the imprint lithography template 270 would be, in use, loaded. This means that even when the imprint lithography template 270 is not loaded in the imprint lithography apparatus, the integrity of the contamination barrier is maintained, and the division, or separation, or delineation between the two regions 288, 290 is correspondingly maintained.

In other embodiments (not shown) the contamination barrier across the imprint lithography apparatus may be maintained in a different manner, for example without the use of the material transparent to actinic radiation. For example the contamination barrier might be maintained or maintainable by one or more movable components, which are for instance moved into a barrier position when no imprint lithography template is present in the imprint lithography apparatus.

Contamination may need to be extracted from the imprint lithography apparatus. The contamination may be extracted, for example, by an outlet in connection with the first region to limit or avoid contamination being drawn into the second region. The contamination may be removed by use of an appropriate gas flow, or a reduced extraction pressure. In an embodiment, the contamination extraction could be achieved by removal of the one or more trays or containers from the imprint lithography apparatus, for example through the aforementioned outlet in connection with the first region.

The presence of the contamination barrier limits or reduces the amount of contamination that may be passed through to a lower region of the imprint lithography apparatus in which the substrate stage and/or patterned region of the imprint lithography apparatus are, in use, present. This barrier thus limits the chance of one or more of these components becoming contaminated. The avoidance or limitation of such contamination may improve the accuracy, or consistency, or yield of pattern application, and is therefore clearly desirable.

Moving a Print Head into and Out of an Imprint Compartment

An imprint lithography apparatus may comprise one or more print heads. The print heads provide imprintable medium onto a substrate. The print heads are located or locatable within the imprint lithographic apparatus, because the imprintable medium should be provided on the substrate (or on certain target portions thereof), just before an imprint takes place.

For maintenance, replacement or inspection of such a print head, the imprint lithographic apparatus would be opened, and for example exposed to an external environment. This can be a time-consuming and frustrating task for an operator of the imprint lithography apparatus, and perhaps more importantly, provide an opportunity for contamination from the external environment to enter the imprint lithography apparatus. It is desirable to reduce the manual involvement of the operator, for example to reduce cost, wasted time, and to avoid the risk of human error affecting the imprint lithography apparatus. It is also desirable to limit the amount of contamination that can enter the imprint lithography apparatus, since such contamination can adversely affect the imprinting of patterns.

According to an embodiment, one or more of the above-mentioned problems can be obviated or mitigated. According to an embodiment, an imprint lithography apparatus comprises an imprint compartment, in which imprinting takes place, and in which is located an imprint lithography template arrangement for use in imprinting a pattern into a layer of imprintable medium provided on a substrate. A substrate stage is also provided to hold (and, for example, move) the substrate. A (for example, separate and distinct) print head compartment is also provided. The print head compartment is in connection with the imprint compartment via a sealed or sealable access port. The print head compartment comprises an actuator to move a print head from the imprint compartment and into the print head compartment, and/or to move a print head into the imprint compartment from the print head compartment. This apparatus has one or more advantages, as will be discussed in more detail below in relation to FIGS. 35 and 36 which show such an imprint lithography apparatus in first and second configurations, respectively.

Figure 35:
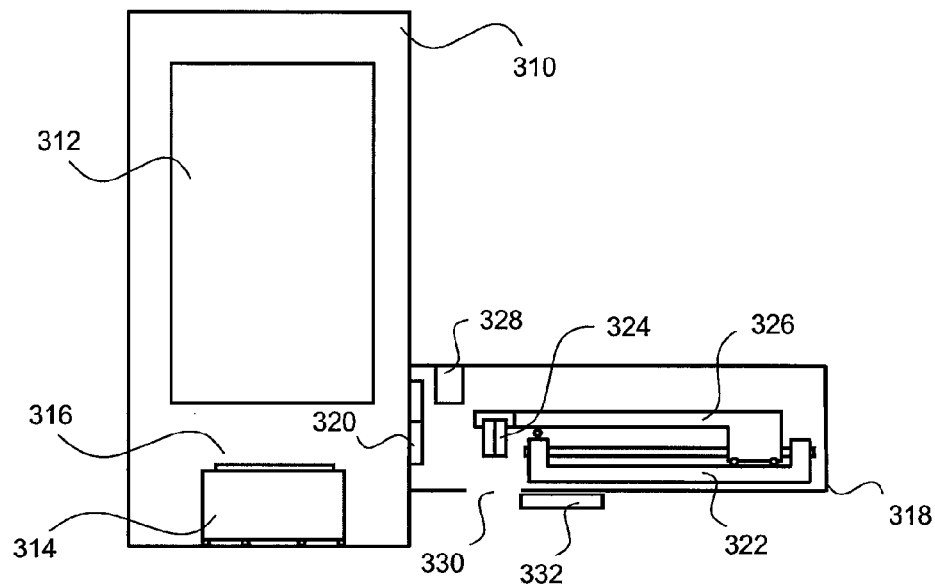
FIG. 35 schematically depicts an imprint lithography apparatus, comprising a print head compartment, in accordance with an embodiment of the present invention, and in a first configuration.

FIG. 35 shows an imprint lithography apparatus in accordance with an embodiment of the present invention, the apparatus being in a first configuration. The imprint lithography apparatus comprises an imprint compartment 310. Located in that imprint compartment 310 is apparatus 312 for use in imprinting a pattern into a layer of imprintable medium provided on a substrate 316. That apparatus 312 may comprise, for example, an imprint lithography template arrangement (e.g. an imprint lithography template holder and/or an imprint lithography template). The imprint compartment 310 further comprises a substrate stage 314 to hold, in use, a substrate 316 on which imprintable medium is provided, or is to be provided, by a print head.

The imprint lithography apparatus further comprises a print head compartment 318. The print head compartment 318 is located outside of the imprint compartment 310. The print head compartment 318 is in connection with the imprint compartment 310 via a sealed or sealable access port 320.

Figure 36:
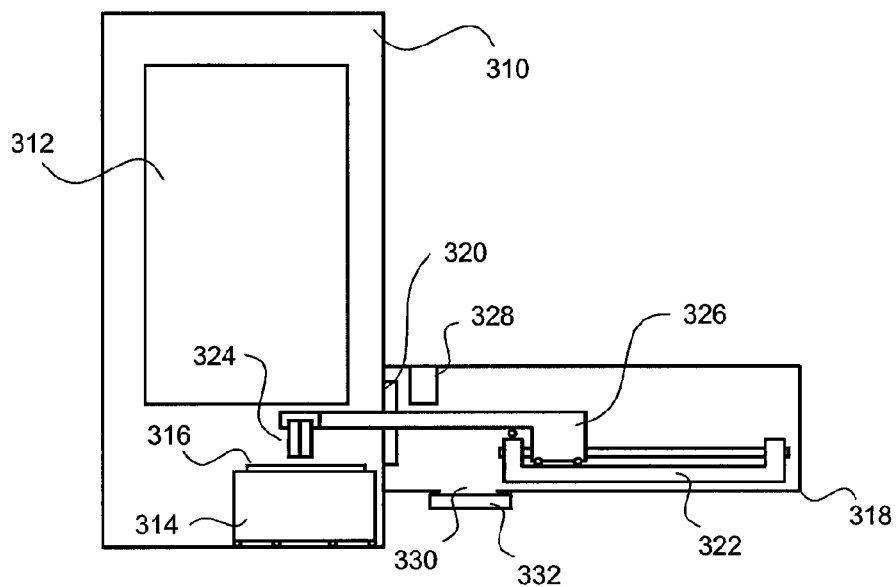
FIG. 36 schematically depicts the imprint lithography apparatus of FIG. 35, in a second configuration.

The print head compartment 318 comprises an actuator 322 to move a print head 324 into the imprint compartment 310 from the print head compartment 318, via the access port 320. The actuator is also used to move the print head 324 from the imprint compartment 310 and into the print head compartment 318, again via the access port 320. FIG. 35 shows the imprint lithography apparatus in a first configuration, where the print head 324 is located in the print head compartment 318. FIG. 36 shows the imprint lithography apparatus in a second configuration, where the print head 324 has been moved out of the print head compartment 318 and into the imprint compartment 310, for example in order to provide imprintable medium or the like on the substrate 316. FIGS. 35 and 36 will be referred to in combination.

The use of an actuator 322 to move the print head 324 into and out of the imprint compartment 310 allows such movement to be automated. This limits or negates the need for an operator to manually undertake this task. Furthermore, and perhaps more importantly, since the print head 324 is moved into and out of the imprint compartment 310 via a sealed or sealable access port 320, contamination entering the imprint compartment 310 is limited.

The actuator 322 is in connection with and is arranged to move an arm 326. The arm 326 is arranged to hold the print head 324 (via an appropriate electrostatic, magnetic, or mechanical holding configuration, or the like). Appropriate movement and/or positioning of the arm 326 will allow appropriate positioning of the print head 324, and/or movement of the print head 324 within the imprint compartment 310, for example to move the print head to an appropriate location for imprinting imprintable medium on to a target portion of the substrate. In use, and as can be seen in FIG. 36, the sealed or sealable access port 320 provides a seal around the arm 326 when the arm extends through the access port 320. Such sealing limits or prevents contamination from entering the imprint compartment 310 when the arm extends through the access port 320.

The actuator 322 is shown as being located beneath the arm 326. Contamination generated by the actuator will usually, under the force of gravity, fall downwards. Since the actuator 322 is located beneath the arm 326, the amount of contamination that can fall from the actuator 322 and on to the arm 326 is limited. Furthermore, the general provision of the actuator 322 outside of the imprint compartment 310 helps ensure that contamination generated by operation of the actuator 322 is kept within the print head compartment 318, as opposed to entering and contaminating the imprint compartment 310.

As shown in FIG. 35, the arm 326 may be fully locatable (e.g. retractable by the actuator 322) within the print head compartment 318. This allows the access port 320 to be fully closed, when, for example imprinting takes place, reducing the entry of contamination into the imprint compartment 318. This also allows the print head compartment 318 to be a separate, independent module which may be manufactured, sold and distributed separately from the imprint compartment 310. A print head compartment may be retrofitted to an imprint compartment.

The imprint lithography apparatus may further comprise a gas shower 328 located within the print head compartment 318, and located adjacent to the access port 320. The gas shower 328 may be constantly in use, or may only be used (e.g. arranged to provide an air flow, or a flow of another gas) when the print head 324 is being moved into and/or out of the print head compartment 310. The use of the gas shower 328 provides an additional level of contamination reduction within the imprint compartment 310. This is because the gas shower will dislodge particulate contamination and the like from the print head 324 and/or the portion of the arm 326 that passes within a region of gas flow provided by the gas shower 328, thus preventing, or reducing the risk of contamination entering into the imprint compartment 310.

The print head compartment 318 may comprise a further, sealable, access port. The access port comprises an opening 330 which may be selectively closed via a door 332 or the like. The further access port provides access, for example, to the print head 324, for example for inspection, replacement and/or maintenance or the like.

At least in use, the imprint compartment 310 may be maintained at a higher gas pressure than a gas pressure with the print head compartment 318. This relative over pressure in the imprint compartment 310 should prevent most, if not all, gas born contamination passing from the print head compartment 318 to the imprint compartment 310, and thus provides a further level of contamination reduction or suppression.

In an embodiment not shown, the print head compartment may include a store for one or more print heads. The actuator discussed above, or another actuator, may be configured to transfer a print head from the arm to the store, and/or from the store to the arm, to be able to selectively control which print head is movable into the imprint compartment. This may be advantageous for maintenance purposes or the like, or when a different print head is required, for example a print head that can provide a different resolution of printing or the like.

In an embodiment not shown, the imprint lithography apparatus may comprise more than one print head compartment. Using more than one print head compartment, one or more print heads may be located in a first print head compartment for servicing, inspection or the like, while at the same time another print head compartment could be in a configuration such that a print head has been moved into the imprint compartment for use in providing imprintable material onto a substrate. Such an arrangement may reduce the time for which the imprint lithography apparatus as a whole is unusable for imprinting, and thereby may be used to increase throughput of the apparatus.

Handling, at Least Indirectly, of an Imprint Lithography Template Using a Substrate Handling System In an imprint lithography apparatus and method, a substrate is held, and moved around the imprint lithography apparatus (i.e. the substrate is handled). Furthermore, and distinct from, for example, optical lithography, the patterning device itself (e.g. an imprint lithography template) may be moved around (e.g. in and out of) an imprint chamber in which imprinting is to take place. Such movement may be required to provide a different imprint lithography template, for example a template with a different pattern. It is currently proposed to provide an imprint lithography apparatus which comprises a substrate handling system, to handle substrates, and also an imprint lithography template handling system, to handle imprint lithography templates. The provision of separate, distinct handling systems for the substrate and imprint lithography template, respectively, may increase the footprint of the imprint lithography apparatus, and/or the cost of the imprint lithography apparatus.

According to an embodiment, one or more of the problems referred to above may be obviated or mitigated. According to an embodiment, there is provided an imprint lithography apparatus and/or method in which the substrate handling system to handle a substrate (e.g. hold and/or move the substrate) is configured to also function as an imprint lithography template handling system (i.e. the substrate handling system is, in use, also used as an imprint lithography template handling system). By using the substrate handling system in this manner, there may be no need for a separate, distinct imprint lithography template handling system. This may result in a reduction in cost and/or a footprint of imprint lithography apparatus, for example in comparison with an imprint lithography apparatus in which there is provided a separate, distinct imprint lithography template handling system.

FIGS. 37a to 37d, and FIGS. 38a to 38d, will be used to describe an imprint lithography apparatus and method in accordance with an embodiment of the present invention. The same features appearing in different Figures have been given the same reference numerals, for consistency and clarity.

Figure 37A:
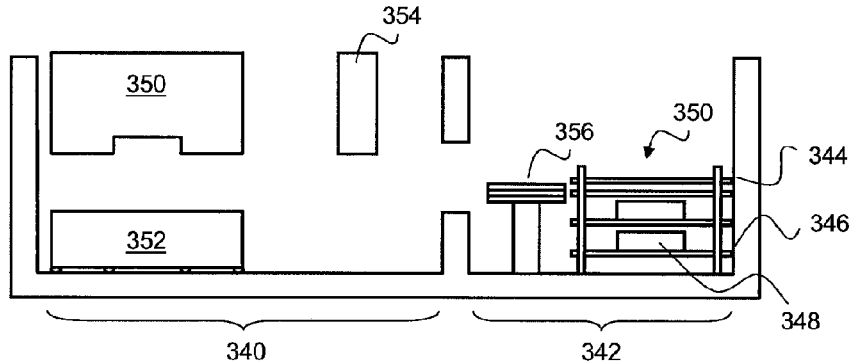
FIGS. 37a, 37b, 37c and 37d schematically depict an imprint lithography apparatus and method, in which a substrate handling system is used to handle an imprint lithography template, in accordance with an embodiment of the present invention.

FIG. 37a schematically depicts an imprint lithography apparatus. The apparatus is divided into two compartments: an imprint compartment 340, where imprinting takes place; and a storage compartment 342, where storage of one or more substrates 344 and/or one or more dummy substrates 346 takes place. A dummy substrate 346 is capable of accommodating an imprint lithography template 348. The substrate 344 and dummy substrate 346 may be stored on one or more storage racks 350 or the like.

Located in the imprint compartment 340 is an imprint lithography template holder 350 to hold one or more imprint lithography templates 348. Also located in the imprint compartment 340 is a component of a substrate handling system in the form of a substrate stage 352. The substrate stage may be movable within the imprint compartment 340. The imprint compartment 340 also comprises a print head 354 to provide imprintable medium on a substrate 344 onto which patterns are to be imprinted.

Another component of the substrate handling system is a substrate handler 356, which may comprise one or more robotic arms or the like. The substrate handler 356 may be located in the imprint compartment 340 or the storage compartment 342. In this embodiment, the substrate handler 356 is located in the storage compartment 342.

The substrate handling system 352, 356 is provided to handle the substrate 344 and the dummy substrate 346, moving them around the imprint lithography apparatus. Ordinarily, a substrate handling system would be used solely for the handling of substrate 344 onto which a pattern is to be imprinted, or on which a pattern has been imprinted. However, in accordance with an embodiment of the present invention, the substrate handling system 352, 356 is also used to handle dummy substrate 346. Dummy substrate 346 is arranged to accommodate (e.g. hold, or retain in position) an imprint lithography template 348. Thus, the substrate handling system 352, 356 may therefore be used to handle (in this embodiment, indirectly) imprint lithography template 348, thus avoiding the need to provide a separate imprint lithography template handling system.

Figure 37B:
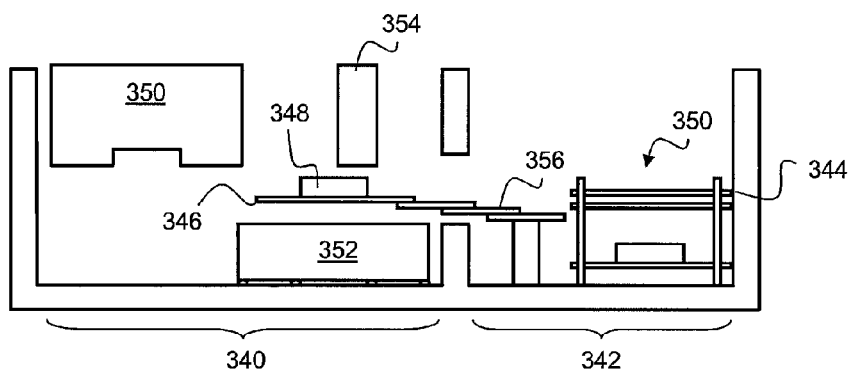

FIG. 37b shows that the substrate handler 356 has been used to move a dummy substrate 346, with an imprint lithography template 348 accommodated thereon, from the storage rack 350 and into the imprint compartment 340. The substrate stage 352 has been moved into the vicinity of the substrate handler 356 so that the substrate handler 356 may load the dummy substrate 346 onto the substrate stage 352.

Figure 37C:
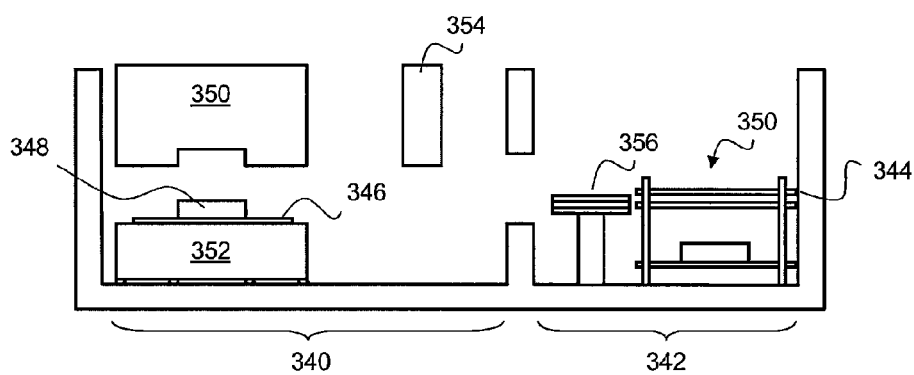

FIG. 37c shows that that the substrate stage 352 may then be moved into alignment, or approximate alignment, with the imprint lithography template holder 350.

Figure 37D:
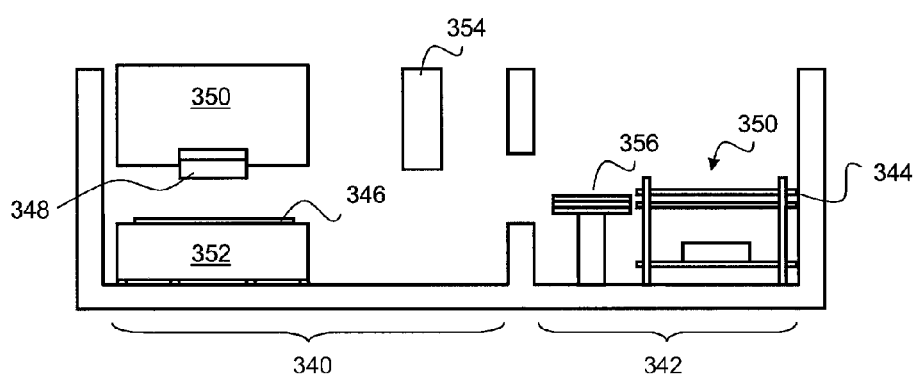

FIG. 37d shows that by appropriate movement of one or both of the substrate stage 352 and the imprint lithography template holder 350, the imprint lithography template 348 accommodated by the dummy substrate 346 is brought into engagement with the imprint lithography template holder 350. Appropriate actuation of the imprint lithography template holder 350 may then be used to hold the imprint lithography template 348, allowing the dummy substrate 348 to be separated from the imprint lithography template 348.

FIGS. 37a to 37d thus show how a substrate handling system 352, 356 may be used to handle an imprint lithography template 348 (for example, in an indirect manner).

Figure 38A:
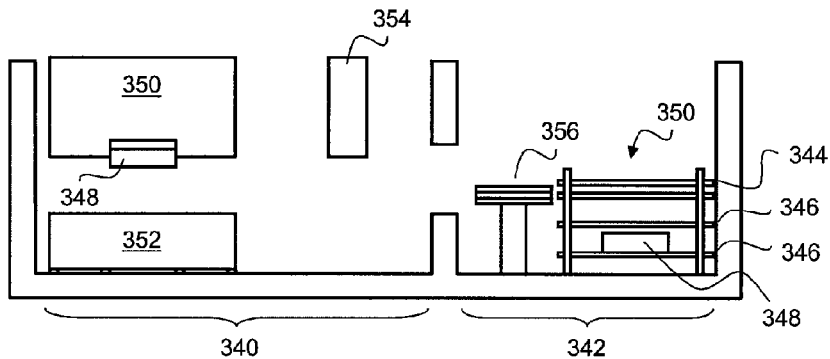
FIGS. 38a, 38b, 38c and 38d schematically depict the imprint lithography apparatus and method shown in and described with reference to FIGS. 37a-37d, in which a substrate handling system is used to handle a substrate.

After the imprint lithography template 348 has been held by the imprint lithography template holder 350, and the dummy substrate 348 separated from the imprint lithography template 348, the dummy substrate 346 may be, for example, moved back in to the storage compartment 342. This may be undertaken by appropriate movement of the substrate stage 352 (on which the dummy substrate 346 is held) and appropriate use of the substrate handler 356. Such operation of the imprint lithography apparatus results in the apparatus being in a configuration substantially as shown in FIG. 38a. In FIG. 38a, it can be seen that a dummy substrate 346 is now located in the storage rack 350, but that the dummy substrate is not accommodating an imprint lithography template (since the template 348 is now being held by the imprint lithography template holder 350).

Figure 38B:
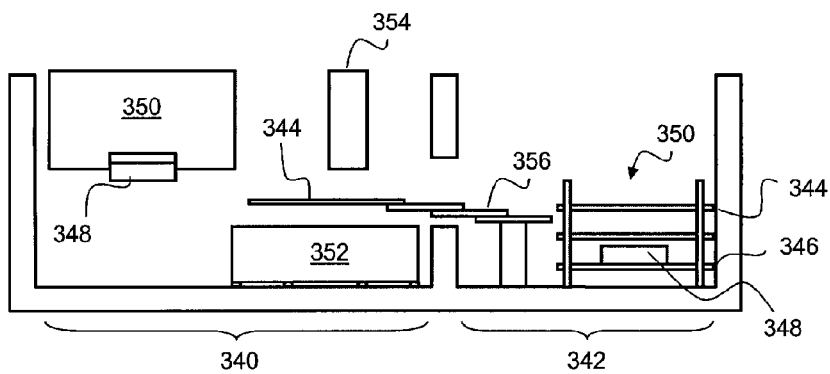

FIG. 38b shows how the substrate handler 356 may, subsequently, be used to handle a substrate 344, moving the substrate 344 from the storage rack 350 and into the imprint compartment 340 for loading onto the substrate stage 352.

Figure 38C:
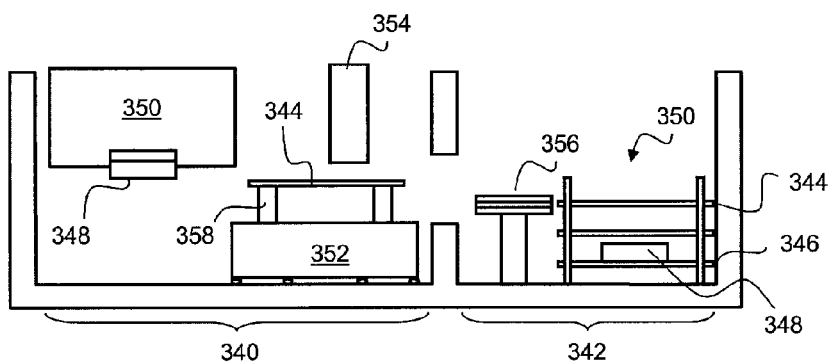

FIG. 38c shows that, when loaded on the substrate stage 352, one or more supports 358, or the substrate stage 352 itself, may be moved to move the substrate 344 into proximity with the print head 354. Imprintable medium 360 may then be deposited on the substrate 344 by or via the print head 354.

Figure 38D:
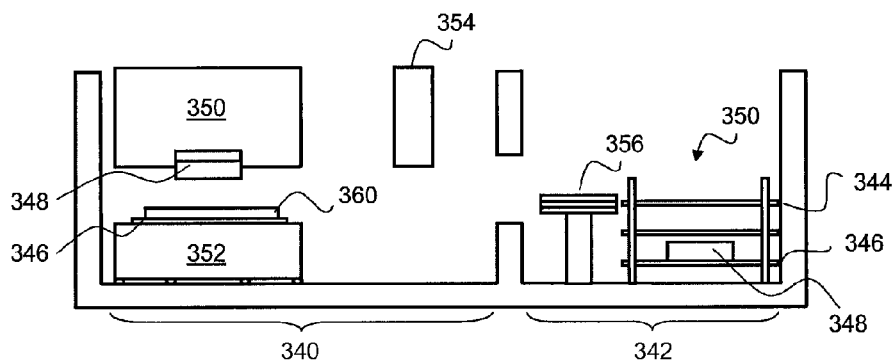

FIG. 38d shows that, after imprintable medium 360 has been provided on the substrate 344, the substrate stage 352 may be moved into approximate alignment with the imprint lithography template holder 350, and/or the imprint lithography template 348 held by the imprint lithography template holder 350. Imprinting of patterns into the imprintable medium 360 provided on the substrate 352 may then take place, for example in a known manner.

Figure 39:
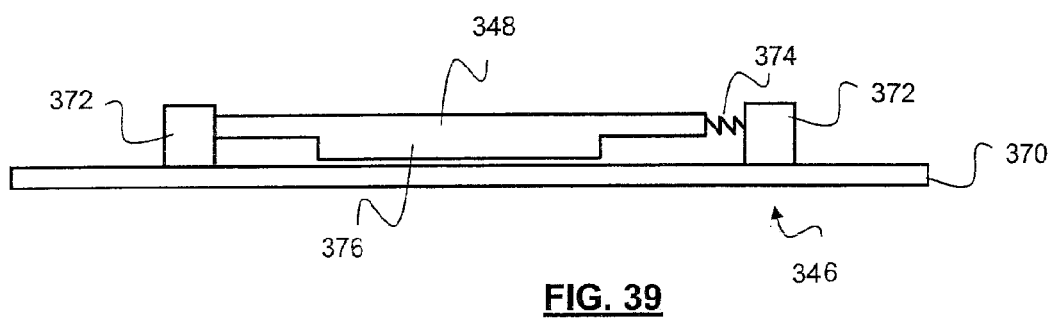
FIG. 39 schematically depicts an example of a dummy substrate to support an imprint lithography template.

FIG. 39 schematically depicts an example of the dummy substrate 346 referred to above. The dummy substrate 346 comprises a standard substrate 370. In this context, the term 'standard' means that the substrate 370 can be handled with a conventional, unmodified, substrate handling system. For example, the footprint (e.g. the area and/or dimension(s) and/or general shape) of the substrate 370 will, for example, match that of a standard wafer or the like that the substrate handling system is primarily designed to handle.

The standard substrate 370 is provided with an arrangement to accommodate an imprint lithography template 348, thus allowing the imprint lithography template 348 to be handled by appropriate handling of the standard substrate 370. The arrangement comprises one or more abutment surfaces 372 that, in use, are located on an upper side of the substrate 370, and which substantially extend along one, more, or all sides of the imprint lithography template 348, thus preventing substantial movement of the template 348. For instance, the abutment surfaces 372 may form a frame or the like that, in use, surrounds the imprint lithography template 348.

One or more biasing elements 374 (e.g. one or more springs or the like) may extend from one or more of the abutment surfaces 372 and into, in use, contact with the imprint lithography template 348. The biasing element 374 biases the imprint lithography template 348 into, for example, contact with another abutment surface 372 or a biasing element provided in relation thereto, in order to prevent movement, or substantial movement, of the imprint lithography template 348 during handling, or storage, or the like. The biasing element 374 is desirably arranged to come into contact with a base region of the imprint lithography template 348, as opposed to the potentially more delicate and sensitive mesa region 376 on which one or more pattern features are provided for use in imprinting a pattern into a layer of imprintable medium.

FIG. 39 shows that, typically, the imprint lithography template 348 will be loaded on the dummy substrate with the mesa region 376 (on which the pattern features or patterned region will be provided) directed towards the dummy substrate 346, or, more specifically, a face of the standard substrate 370 constituting a part of that dummy substrate 346. This provides protection for the patterned region provided on the mesa region 376, and may also facilitate more straightforward handling of the imprint lithography template 348, and/or subsequent holding of the imprint lithography template 348 by an imprint lithography template holder.

In the embodiments described herein, the term positioning and/or deformation of an imprint lithography template arrangement has been described. Positioning, for example, may include holding of the imprint lithography template arrangement. Deformation of, for example, an imprint lithography template held by a template holder, could be undertaken directly (e.g. by direct deformation of the template) or indirectly (e.g. by deformation of the holder, which causes deformation of the template).

The position (which includes orientation) and/or deformation (or degree of deformation) of the imprint lithography template may be generically referred to as a, or the, configuration of the imprint lithography template.

One or more of the features described above in relation to an embodiment of the present invention may additionally or alternatively be used in combination with, or in replacement of, features described in relation to another embodiment as appropriate.

The present invention relates to imprint lithography apparatus suitable for carrying out or implementing an imprint lithography method or process. The imprint lithography apparatus and/or method may be used for the manufacture of devices, such as electronic devices and integrated circuits, or the apparatus and/or method may be used for other applications, such as the manufacture of integrated optical systems, guidance and detection patterns for magnetic domain memories, flat-panel displays, liquid-crystal displays (LCDs), thin film magnetic heads, organic light emitting diodes, etc. An imprint lithography template used by, or forming a part of the imprint lithography apparatus may comprise pattern features having one or more dimensions of the order of micrometers or nanometers.

In this specification, the term "substrate" is meant to include any surface layers forming part of the substrate, or being provided on another substrate, such as planarisation layers or anti-reflection coating layers.

In use, an imprint lithography template may be held by an imprint lithography template holder. The imprint lithography template holder may hold the imprint lithography template using one of a number of different mechanisms, for example using electrostatic and/or magnetic force, mechanical force (e.g. via the use of one or more piezoelectric elements or the like) and/or by vacuum force. The imprint lithography template may be moved by appropriate movement of the imprint lithography template holder. In use, a substrate may be held by a substrate holder. The substrate holder may hold the substrate using one of a number of different mechanisms, for example using an electrostatic and/or magnetic force, mechanical force (e.g. a clamp or the like) and/or by vacuum force. The substrate may be moved by appropriate movement of the substrate holder.

In the above embodiments, a single imprint lithography template, a single imprint lithography template holder, a single substrate holder and a single substrate is provided, and for example in a single chamber or the like. In other embodiments, more than one imprint lithography template, more than one imprint lithography template holder, more than one substrate holder, and/or more than one substrate may be provided in one or more chambers, for example in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint lithography template holders and/or templates. In an embodiment, there is provided an apparatus configured to use one imprint lithography template holder and/or one imprint lithography template per substrate holder. In an embodiment, there is provided an apparatus configured to use more than one imprint lithography template holder and/or imprint lithography template per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint lithography template. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Further embodiments according to the invention are provided in below numbered clauses:

1. An imprint lithography apparatus, comprising:
    a first frame to be mounted on a floor;
    a second frame mounted on the first frame via a kinematic coupling;
    an alignment sensor mounted on the second frame, to align an imprint lithography template arrangement with a target portion of a substrate; and
    a position sensor to measure a position of the imprint lithography template arrangement and/or a substrate stage relative to the second frame.
2. The apparatus of clause 1, wherein the first frame is to be mounted on the floor by a vibration isolation system.
3. The apparatus of clause 1 or clause 2, wherein a portion of the second frame extends from outside of the first frame, and into a region located within the first frame, so that the measurement of position may be undertaken relative to or using that portion of the second frame.
4. An imprint lithography apparatus, comprising:
    a first frame to be mounted on a floor;
    a second frame mounted on the first frame via a vibration isolation system;
    an imprint lithography template arrangement configured, at least in use, to be mounted on the second frame via a kinematic coupling;
    an alignment sensor mounted on the second frame, to align the imprint lithography template arrangement with a target portion of a substrate; and
    a position sensor to measure a position of a substrate stage relative to the second frame.
5. The apparatus of clause 4, wherein the second frame is located substantially within the first frame.
6. The apparatus of clause 4 or clause 5, further comprising a release compensation actuator connected between the first frame and the imprint lithography template arrangement.
7. The apparatus of clause 6, wherein a point of connection of the release compensation actuator is linked to a point of connection of the kinematic coupling via which the imprint lithography template arrangement is mounted to the second frame.

8. The apparatus of clause 7, wherein the point of connection of the release compensation actuator is on an opposite side of the imprint lithography template arrangement to the point of connection of the kinematic coupling via which the imprint lithography template arrangement is mounted to the second frame.

9. The apparatus of any of clauses 6 to 8, wherein the release compensation actuator extends through the second frame.

10. The apparatus of any preceding clause, wherein the substrate stage is a five degree of freedom short stroke substrate stage.

11. The apparatus of any preceding clause, wherein the substrate stage is capable of translational long stroke movement along two axes parallel to a plane of the substrate (x and y axes), and along an axis perpendicular to that plane (z axis).

12. The apparatus of clause 11, wherein the substrate stage is capable of rotational movement about the two axes that are parallel to the plane of the substrate (rotation about x and y axes).

13. The apparatus of clause 11, wherein the substrate stage is capable of rotational movement about the two axes that are parallel to the plane of the substrate (rotation about x and y axes), and about the axis that is perpendicular to that plane (rotation about z axis), and the substrate stage is capable of translational short stroke movement along the two axes parallel to the plane of the substrate (x and y axes).

14. The apparatus of clause 12, wherein the imprint lithography template arrangement is capable of translational short stroke movement along the two axes parallel to the plane of the substrate (x and y axes), and the imprint lithography template arrangement is capable of rotational movement about the axis that is perpendicular to that plane (rotation about z axis).

15. The apparatus of any of clauses 1 to 10, wherein the substrate stage is capable of translational long stroke movement along two axes parallel to a plane of the substrate (x and y axes).

16. The apparatus of clause 15, wherein the substrate stage is capable of rotational movement about the two axes that are parallel to the plane of the substrate (rotation about x and y axes).

17. The apparatus of clause 15, wherein the substrate stage is capable of rotational movement about the two axes that are parallel to the plane of the substrate (rotation about x and y axes), and about the axis that is perpendicular to that plane (rotation about z axis), and the substrate stage is capable of translational short stroke movement along the two axes parallel to the plane of the substrate (x and y axes).

18. The apparatus of clause 16 or clause 17, wherein the imprint lithography template arrangement is capable of long stroke movement along an axis perpendicular to the plane of the substrate (z axis).

19. The apparatus of clause 18, when dependent on clause 16, wherein the imprint lithography template arrangement is capable of translational short stroke movement along the two axes parallel to the plane of the substrate (x and y axes), and the imprint lithography template arrangement is capable of rotational movement about the axis that is perpendicular to that plane (rotation about z axis).

20. The apparatus of any preceding clause, further comprising a heat shield to shield the second frame.

21. The apparatus of any preceding clause, wherein the second frame is formed from a material with a low coefficient of thermal expansion and/or a high thermal conductance.

22. The apparatus of any preceding clause, further comprising a cooling or thermal conditioning system to cool or thermally condition the second frame.

23. The apparatus of any preceding clause, wherein the second frame is constructed and/or arranged to have internal dynamical modes that are of a high frequency.

24. The apparatus of any preceding clause, wherein the substrate stage is coupled to the first frame.

25. The apparatus of any preceding clause, wherein the substrate stage is, or comprises, or forms a part of one or more selected from the following:
   a substrate holder;
   a positioner of the substrate;
   a positioner of a substrate holder.

26. The apparatus of any preceding clause, wherein the first frame is a base frame, and/or wherein the second frame is a metrology frame.

27. An imprint lithography apparatus, comprising:
   a base frame;
   a metrology frame;
   an imprint lithography template arrangement in connection with the base frame or the metrology frame via a kinematic coupling and a release compensation actuator.

28. The apparatus of clause 27, wherein the kinematic coupling is located in series with the release compensation actuator.

29. The apparatus of clause 27, wherein a point of connection of the release compensation actuator is on an opposite side of the imprint lithography template arrangement to a point of connection of the kinematic coupling.

30. An imprint lithography method for using an imprint lithography apparatus, the apparatus comprising a base frame, a metrology frame, and an imprint lithography template arrangement, the method comprising:
   using the imprint lithography arrangement to imprint a pattern into a layer of imprintable medium provided on a substrate, when the imprint lithography arrangement is in connection with the metrology frame;
   fixing the pattern provided in the imprintable medium;
   moving the imprint lithography template arrangement to disconnect the imprint lithography arrangement from the metrology frame, and connecting the imprint lithography template arrangement to the base frame; and
   releasing the imprint lithography template arrangement from the substrate.

31. The method of clause 30, comprising moving the imprint lithography template arrangement by movement of a substrate stage that holds the substrate.

32. The method of clause 30 or clause 31, wherein releasing the imprint lithography template arrangement comprises holding the imprint lithography template arrangement using an actuator in connection with the base frame, and pulling the substrate away from the imprint lithography template arrangement via movement of the substrate stage that holds the substrate.

33. The method of any of clauses 30 to 32, wherein the imprint lithography template arrangement is biased toward connection with the metrology frame, the movement of the imprint lithography template arrangement overcoming the bias.

34. The method of clauses 32 and 33, wherein the actuator is capable of biasing the imprint lithography template arrangement toward connection with the metrology frame.

35. An imprint lithography apparatus, comprising:
   a base frame;
   a metrology frame connected to the base frame; and an imprint lithography template arrangement, the imprint lithography template arrangement being movable between a first configuration and a second configuration, the first configuration defined by the imprint lithography template arrangement being connected to the metrology frame, and the second configuration defined by the imprint lithography template arrangement being disconnected from the metrology frame and connected to the base frame.

36. An imprint lithography template arrangement clamping configuration, the clamping configuration including a clamp that comprises:
   a base region;
   a burl extending from the base region, and arranged in use to come into contact with the imprint lithography template arrangement, the burl at least partially flexible in a direction parallel to a plane of the imprint lithography template arrangement, to allow for movement, expansion or compression of the imprint lithography template arrangement, without slip of the burl relative to the imprint lithography template arrangement;
   a space that surrounds the burl;
   a seal wall extending from the base region and surrounding the space that surrounds the burl, the burl extending further from the base region than the seal wall, the seal wall configured to provide, in use, an at least partial seal with the imprint lithography template arrangement, when the space is at a lower pressure than ambient pressure.

37. The clamping configuration of clause 36, wherein the burl is:
   at least 1 mm long;
   at least 5 mm long;
   at least 5-10 mm long;
   at least 10 mm long;
   and/or is less than 100 mm long.

38. The clamping configuration of clause 36 or clause 37, wherein the burl extends:
   1-10 μm further from the base region than the seal wall; or
   3-5 μm further from the base region than the seal wall.

39. The clamping configuration of any of clauses 36 to 38, wherein the clamp comprises a plurality of burls, constructed and arranged to be distributable around a periphery of the imprint lithography template arrangement.

40. The clamping configuration of any of clauses 36 to 39, wherein the seal wall comprises:
   an outer seal wall that extends around an outer perimeter of a region containing the burl or burls; and
   an inner seal wall that extends around an inner perimeter of the region containing the burl or burls.

41. The clamping configuration of any of clauses 36 to 40, comprising a plurality of the clamps, constructed and arranged so as to be disposable around a periphery of the imprint lithography template arrangement.

42. The clamping configuration of any of clauses 36 to 41, wherein the clamp or clamping configuration is, or forms a part of, another imprint lithography template arrangement.

43. A method of releasing an imprint lithography template from a substrate that is held on a substrate stage, the method comprising:
   pulling the substrate and the imprint lithography template away from one another; and
   applying a rotation moment to the imprint lithography template, the substrate, or both, toward the other, such that at a radial extremity of an interface between the imprint lithography template and the substrate, there is a cumulative force acting on the substrate that results in the substrate being held on the substrate stage.

44. The method of clause 44, wherein a relationship between a pulling force, or a component thereof, acting through a center of the imprint lithography template, and a moment associated with the rotation is defined as:

$$F < M/b$$

where F is the pulling force, or the component thereof, acting through the center of the imprint lithography template, M is the moment induced by the rotation, and b is a radial distance from the center of the imprint lithography template to the radial extremity of the interface between the imprint lithography template and the substrate.

45. The method of clause 43 or clause 44, wherein the method is undertaken at a peripheral region of the substrate.

46. An imprint lithography apparatus comprising:
   an imprint lithography template holder to hold an imprint lithography template;
   a substrate stage to hold a substrate;
   wherein, during release of an imprint lithography template from a substrate, the imprint lithography template holder, the substrate stage, or both, is constructed and arranged to be movable to:
   pull the substrate and the imprint lithography template away from one another; and
   apply a rotation moment to the imprint lithography template, the substrate, or both, toward the other, such that at a radial extremity of an interface between the imprint lithography template and the substrate, there is a cumulative force acting on the substrate that results in the substrate being held on the substrate stage.

47. An actuation arrangement to position and/or deform an imprint lithography template arrangement, the arrangement comprising:
   a first actuator, locatable, in use, at a first position of the imprint lithography template arrangement;
   a second actuator, locatable, in use, at a second, opposite position of the imprint lithography template arrangement; and
   a signal amplifier to amplify a control signal applicable to both the first actuator and the second actuator.

48. The actuation arrangement of clause 47, wherein the first actuator is locatable directly opposite the second actuator.

49. The actuation arrangement of clause 47 or clause 48, wherein the actuation arrangement comprises:
   a plurality of first actuators, locatable, in use, on a first side of the imprint lithography template arrangement;
   a plurality of second actuators, locatable, in use, on a second, opposite side of the imprint lithography template arrangement; and
   a signal amplifier to amplify a control signal applicable to directly opposing actuators of the pluralities, or to amplify a control signal applicable to groups of actuators locatable on opposite sides of the imprint lithography template arrangement.

50. The actuation arrangement of any of clauses 47 to 49, wherein each actuator is a piezoelectric actuator or a Lorentz actuator.

51. The actuation arrangement of any of clauses 47 to 50, wherein the actuation arrangement forms a part an imprint lithography template holder.

52. An imprint lithography method, comprising:
   imprinting an imprint lithography template into a layer of imprintable medium provided on a substrate to form a pattern in that layer of imprintable medium;

controlling a position or deformation of the imprint lithography template relative to the substrate when the imprint lithography template is imprinted into the imprintable medium; and fixing the pattern provided in the layer of imprintable medium, wherein controlling the position or deformation of the imprint lithography template relative to the substrate comprises:

undertaking relatively high bandwidth control at a first level when the imprintable medium is in an unfixed, substantially liquid and/or flowable state, then undertaking higher bandwidth control at a second level, higher than the first level, when the imprintable medium is in an intermediate state, in-between the unfixed, substantially liquid and/or flowable state, and a fixed, substantially solid state, and then undertaking relatively low bandwidth control when the imprintable medium is in a fixed, substantially solid state.

53. The method of clause 52, wherein controlling a position or deformation of the imprint lithography template relative to the substrate comprises control of a servomechanism.

54. The method of clause 52 or clause 53, wherein controlling a position of the imprint lithography template relative to the substrate when the imprint lithography template is imprinted into the imprintable medium comprises aligning, or maintaining alignment of, the imprint lithography template arrangement relative to a target portion the substrate.

55. An actuation arrangement to position and/or deform an imprint lithography template arrangement, the arrangement comprising:

an actuator, locatable, in use, around the imprint lithography template arrangement;

fixed abutment points to fix three degrees of freedom of the imprint lithography template arrangement, the three degrees of freedom being translation along a first axis parallel to a plane of the imprint lithography template arrangement, translation along a second axis, perpendicular to the first axis and parallel to the plane of the imprint lithography template arrangement, and rotation about a third axis, perpendicular to the first and second axes; and a controller to control a force provided by the actuator to the imprint lithography template arrangement, the controller configured to ensure that the provided force is such that a cumulative force acting along the first axis, second axis, and about the third axis, is minimal.

56. The actuation arrangement of clause 55, further comprising a biasing member, arranged to bias, in use, the imprint lithography template arrangement into contact with the fixed abutment points.

57. The actuation arrangement of clause 55 or clause 56, wherein the cumulative force is minimal in that that a force applied to one, more or all fixed abutment points, is:

less than 5% of a total force applied to the imprint lithography template arrangement; or less than 4% of a total force applied to the imprint lithography template arrangement; or less than 3% of a total force applied to the imprint lithography template arrangement; or less than 2% of a total force applied to the imprint lithography template arrangement; or less than 1% of a total force applied to the imprint lithography template arrangement; or substantially 1% of a total force applied to the imprint lithography template arrangement; or substantially 0% of a total force applied to the imprint lithography template arrangement.

58. The actuation arrangement of any of clauses 55 to 57, wherein the imprint lithography template arrangement is substantially rectangular, and wherein the actuation arrangement comprises three fixed abutment points arranged such that:

two fixed abutment points are locatable along one side of the imprint lithography template arrangement; and one fixed abutment point is locatable along an adjacent side of the imprint lithography template arrangement.

59. The actuation arrangement of any of clauses 55 to 58, wherein the controller is configured to ensure that the provided force is such that the cumulative force acting along the first axis, second axis, and about the third axis, is minimal during a deformation control mode.

60. The actuation arrangement of any of clauses 55 to 59, wherein the actuation arrangement forms a part of an imprint lithography template holder.

61. A method of controlling a position and/or deformation of an imprint lithography template arrangement, the method comprising fixing three degrees of freedom of the imprint lithography template arrangement, the three degrees of freedom being translation along a first axis parallel to a plane of the imprint lithography template arrangement, translation along a second axis, perpendicular to the first axis and parallel to the plane of the imprint lithography template arrangement, and rotation about a third axis, perpendicular to the first and second axes; and controlling a force provided to the imprint lithography template arrangement to control a position or deformation of the imprint lithography template arrangement, ensuring that the provided force is such that a cumulative force acting along the first axis, second axis, and about the third axis, is minimal.

62. An imprint lithography apparatus, comprising:

an imprint lithography template arrangement for use in imprinting a pattern into a layer of imprintable medium provided on a substrate;

an actuator to position and/or deform the imprint lithography template arrangement;

a substrate stage to hold the substrate;

an alignment sensor to align the imprint lithography template arrangement relative to a target portion of the substrate, the alignment sensor having a first detection bandwidth;

a relative position sensor to measure a relative position between the imprint lithography template arrangement and the substrate, the relative position sensor having a second detection bandwidth greater than the first detection bandwidth of the alignment sensor.

63. The apparatus of clause 62, wherein the alignment sensor has a detection bandwidth of:

less than 10 Hz; or less than 5 Hz.

64. The apparatus of clause 62 or clause 63, wherein the relative position sensor has a detection bandwidth of:

greater than 100 Hz; or greater than 200 Hz.

65. The apparatus of any of clauses 62 to 64, wherein the actuator comprises, or is in connection with, a force sensor to measure, directly or indirectly, a force applied by the actuator.

66. The apparatus of clause 65, wherein the force sensor has a third detection bandwidth, that third detection bandwidth being greater than the first detection bandwidth of the alignment sensor.

67. The apparatus of clause 65 or clause 66, wherein the force sensor is a position or current sensor.

68. An imprint lithography method, comprising:
controlling a position and deformation of the imprint lithography template relative to the substrate to achieve a position and deformation substantially as intended; and
when the imprint lithography template is positioned and deformed substantially as intended, reducing a control bandwidth related to the deformation of the imprint lithography template.

69. The method of clause 68, wherein the control bandwidth is an implementation bandwidth related to the implementation of the deformation of the imprint lithography template.

70. The method of clause 68 or clause 69, wherein the bandwidth is reduced to:
less than 100 Hz;
less than 50 Hz;
less than 10 Hz;
less than 5 Hz;
a few Hertz; and/or
a bandwidth that is in the detection bandwidth of an alignment sensor used in the alignment of the imprint lithography template arrangement with a target portion of the substrate.

71. The method of any of clauses 68 to 70, further comprising imprinting the imprint lithography template into a layer of imprintable medium provided on a substrate to form a pattern in that layer of imprintable medium, and wherein the controlling of the position and the deformation is undertaken:
before the imprinting; or
during the imprinting, and before the pattern is fixed into a substantially solid state; or
before and during the imprinting, and before the pattern is fixed into a substantially solid state.

72. An imprint lithography apparatus, comprising:
an imprint lithography template arrangement for use in imprinting a pattern into a layer of imprintable medium provided on a substrate;
an actuator to position and/or deform the imprint lithography template arrangement, the actuator comprising, or is in connection with, a force sensor to measure, directly or indirectly, a force applied by the actuator, the force sensor having a first detection bandwidth;
a substrate stage to hold the substrate;
an alignment sensor to align the imprint lithography template arrangement relative to a target portion of the substrate, the alignment sensor having a second detection bandwidth, wherein the first detection bandwidth is greater than the second detection bandwidth.

73. The apparatus of clause 72, further comprising a control arrangement configured to receive an output from the force sensor, and configured to convert the output into a position of the imprint lithography template arrangement.

74. The apparatus of clause 72 or clause 73, wherein second detection bandwidth is:
less than 10 Hz; or
less than 5 Hz.

75. The apparatus of any of clauses 72 to 74, wherein the first detection bandwidth is:
greater than 50 Hz; or
greater than 100 Hz; or
greater than 200 Hz.

76. The apparatus of any of clauses 72 to 75, wherein each of a plurality of actuators comprises, or is in connection with, a force sensor.

77. The apparatus of any of clauses 72 to 76, wherein the or each force sensor is a position or current sensor.

78. A method of aligning an imprint lithography template arrangement relative to a target portion of a substrate, the method comprising:
using an alignment sensor to align the imprint lithography template arrangement relative to a target portion of the substrate, the alignment sensor having a first detection bandwidth;
using a force sensor, constituting a part of, or being in connection with an actuator, to determine a force applied to the imprint lithography template arrangement by the actuator, the force sensor having a second detection bandwidth, that second detection bandwidth being greater than the first detection bandwidth of the alignment sensor; and
determining a position, or change in position, of the imprint lithography template arrangement from the determination of the force, and using that position, or change in position, in the alignment of the imprint lithography template arrangement.

79. An imprint lithography apparatus, comprising:
an imprint lithography template arrangement for use in imprinting a pattern into a layer of imprintable medium provided on a substrate;
a substrate stage to hold the substrate; and
a gas dispensation arrangement to provide a gaseous atmosphere in which the imprinting of the pattern is to take place, the gas dispensation arrangement configured to dispense gas in an asymmetric manner in the provision of the gaseous atmosphere.

80. The apparatus of clause 79, wherein the gas dispensation arrangement is configured to dispense gas in an asymmetric manner in or into a region located in-between the imprint lithography template arrangement and the substrate holder and/or substrate.

81. The apparatus of clause 79 or clause 80, wherein the gas dispensation arrangement comprises a plurality of outlets that are asymmetrically distributed, or asymmetrically distributable, around the imprint lithography template arrangement.

82. The apparatus of any of clauses 79 to 81, wherein the gas dispensation arrangement comprises a plurality of outlets distributed, or distributable, around the imprint lithography template arrangement, the gas dispensation arrangement configured to dispense gas at different pressures at different outlets, to thus dispense gas in an asymmetric manner in the provision of the gaseous atmosphere.

83. The apparatus of any of clauses 79 to 82, wherein the gas dispensation arrangement comprises a plurality of outlets distributed, or distributable, around the imprint lithography template arrangement, the gas dispensation arrangement configured to dispense gas at different times at different outlets, to thus dispense gas in an asymmetric manner in the provision of the gaseous atmosphere.

84. The apparatus of any of clauses 79 to 83, wherein the gas dispensation arrangement is configured to dispense helium.

85. An imprint lithography method, comprising:
providing a gaseous atmosphere in which imprinting of a pattern into a layer of imprintable medium provided on a substrate is to take place;
wherein the gas constituting the gaseous atmosphere is dispensed in an asymmetric manner.

86. An imprint lithography apparatus, comprising:
an imprint lithography template arrangement for use in imprinting a pattern into a layer of imprintable medium provided on a substrate, the imprint lithography template arrangement comprising, at least in use, an imprint lithography template provided with a patterned region to provide the pattern;

a substrate stage to hold the substrate; and a contamination barrier dividing the apparatus into at least two regions:

i) a first, relatively unclean, region in which is located a movable element; and ii) a second, relatively clean, region in which is located the substrate stage and, if holding a substrate, the substrate itself, and the patterned region of the imprint lithography template.

87. The apparatus of clause 86, wherein the first region is a generally upper region of the apparatus, and the second region is a generally lower region of the apparatus.

88. The apparatus of clause 86 or clause 87, wherein at least a portion of a reverse side of the imprint lithography template, opposite to the side on which the patterned region is provided, is located or locatable in the second region.

89. The apparatus of clause 88, wherein in the vicinity of the at least a portion of the reverse side of the imprint lithography template, the contamination barrier is formed from a material substantially transparent to actinic radiation.

90. The apparatus of any of clauses 86 to 89, wherein the contamination barrier comprises a tray or container, located between fixed parts of the imprint lithography apparatus, to catch contamination.

91. The apparatus of any of clauses 86 to 90, wherein the contamination barrier comprises a flexible member located between movable parts of the imprint lithography apparatus, and/or between a fixed part and a movable part of the imprint lithography apparatus.

92. The apparatus of any of clauses 86 to 91, wherein at least a portion of the contamination barrier substantially surrounds the imprint lithography template arrangement.

93. The apparatus of any of clauses 86 to 92, wherein the contamination barrier extends generally across the imprint lithography apparatus.

94. The apparatus of any of clauses 86 to 93, wherein the movable element is configured for use in conjunction with the imprint lithography template in providing a pattern in the layer of imprintable medium.

95. The apparatus of any of clauses 86 to 94, wherein the movable element comprises one or more selected from, or an actuator for one or more selected from, the following:

a part of the imprint lithography template arrangement, such as an imprint lithography template holder and/or an imprint lithography template positioner;

an imprint lithography template holder;

an imprint lithography template positioner;

a camera;

a sensor; and/or a radiation source.

96. An imprint lithography apparatus, comprising:

an imprint compartment, in which is located an imprint lithography template arrangement for use in imprinting a pattern into a layer of imprintable medium provided on a substrate, and a substrate stage to hold the substrate; and a print head compartment in connection with the imprint compartment via a sealed or sealable access port, the print head compartment comprising an actuator to move a print head from the imprint compartment into the print head compartment, and/or to move a print head into the imprint compartment from the print head compartment.

97. The apparatus of clause 96, wherein the actuator is arranged to move an arm, the arm arranged to hold the print head.

98. The apparatus of clause 97, wherein the actuator is located below the arm.

99. The apparatus of clause 97 or clause 98, wherein the arm is fully locatable within the print head compartment.

100. The apparatus of any of clauses 96 to 99, wherein the print head compartment comprises a gas shower located adjacent to the access port.

101. The apparatus of any of clauses 96 to 100, wherein the print head compartment comprises a further, sealable, access port to provide access to a print head located or locatable in the print head compartment.

102. The apparatus of any of clauses 96 to 102, wherein, at least in use, the imprint compartment is maintained at a higher gas pressure than a gas pressure within the print head compartment.

103. An imprint lithography apparatus, comprising:

a substrate handling system to hold and/or move a substrate, onto which a layer of imprintable medium is to be provided;

wherein the substrate handling system is configured to also function as an imprint lithography template handling system.

104. The apparatus of clause 103, wherein the substrate handling system comprises: a substrate handler to load a substrate onto a substrate stage; and/or a substrate stage.

105. The apparatus of clause 103 or clause 104, wherein the substrate handling system in use, handles a dummy substrate, the dummy substrate comprising a standard substrate and, in connection with the standard substrate, an arrangement to accommodate an imprint lithography template, the arrangement located, in use, on an upper side of the standard substrate.

106. A dummy substrate for use in handling an imprint lithography template, the dummy substrate having a standard substrate and, in connection with the standard substrate, an arrangement to accommodate an imprint lithography template, the arrangement being located, in use, on an upper side of the standard substrate.

107. The dummy substrate of clause 106, wherein the arrangement to accommodate an imprint lithography template comprises an abutment surface, and a biasing element to bias the imprint lithography template into contact with the abutment surface.

108. The dummy substrate of clause 107, wherein the abutment surface and/or the biasing element is/are arranged to contact a base region of the imprint lithography template.

109. An imprint lithography method, comprising:

in an imprint lithography apparatus, using a substrate handling system to handle, directly or indirectly, an imprint lithography template.

110. The method of clause 109, wherein the substrate handling system handles the imprint lithography template by handling a dummy substrate that is configured to accommodate the imprint lithography template.

111. The method of clause 110, wherein the imprint lithography template is loaded on the dummy substrate with a patterned region of the imprint lithography template directed towards the dummy substrate.

The invention claimed is:

1. An imprint lithography apparatus, comprising:

an imprint lithography template arrangement for use in imprinting a pattern into a layer of imprintable medium provided on a substrate;

an actuator to position and/or deform an imprint lithography template of the imprint lithography template arrangement;

a substrate stage to hold the substrate;

a control system configured to at least:
  control a position and deformation of the imprint lithography template relative to the substrate to achieve a position and deformation substantially as intended; and
  responsive to the imprint lithography template being positioned and deformed substantially as intended, reduce a control bandwidth related to the deformation of the imprint lithography template compared to that during a period of control of the position and deformation of the imprint lithography template prior to the imprint lithography template being positioned and deformed substantially as intended.

2. The apparatus of claim 1, wherein the control bandwidth is an implementation bandwidth related to the implementation of the deformation of the imprint lithography template.

3. The apparatus of claim 1, wherein the controller is configured to reduce the bandwidth to:
  less than 100 Hz; and/or
  a bandwidth that is in the detection bandwidth of an alignment sensor used in the alignment of the imprint lithography template with a target portion of the substrate.

4. The apparatus of claim 1, wherein the control system is further configured to cause imprinting of an imprint lithography template into a layer of imprintable medium provided on a substrate to form a pattern in that layer of imprintable medium, and
  wherein the control of the position and the deformation is undertaken:
    before the imprinting; or
    during the imprinting, and before the pattern is fixed into a substantially solid state; or
    before and during the imprinting, and before the pattern is fixed into a substantially solid state.

5. The apparatus of claim 1, further comprising:
  an alignment sensor to align the imprint lithography template relative to a target portion of the substrate, the alignment sensor having a first detection bandwidth; and
  a relative position sensor to measure a relative position between the imprint lithography template and the substrate, the relative position sensor having a second detection bandwidth greater than the first detection bandwidth of the alignment sensor.

6. The apparatus of claim 5, wherein the alignment sensor has a detection bandwidth of less than 10 Hz.

7. The apparatus of claim 1, wherein the actuator comprises, or is in connection with, a force sensor to measure, directly or indirectly, a force applied by the actuator, the force sensor having a first detection bandwidth; and
  further comprising an alignment sensor to align the imprint lithography template relative to a target portion of the substrate, the alignment sensor having a second detection bandwidth, wherein the first detection bandwidth is greater than the second detection bandwidth.

8. An imprint lithography apparatus, comprising:
  an imprint lithography template arrangement for use in imprinting a pattern into a layer of imprintable medium provided on a substrate;
  an actuator to position and/or deform an imprint lithography template of the imprint lithography template arrangement;
  a substrate stage to hold the substrate;
  an alignment sensor to align the imprint lithography template relative to a target portion of the substrate, the alignment sensor having a first detection bandwidth; and
  a relative position sensor to measure a relative position between the imprint lithography template and the substrate, the relative position sensor having a second detection bandwidth greater than the first detection bandwidth of the alignment sensor.

9. The apparatus of claim 8, wherein the alignment sensor has a detection bandwidth of less than 10 Hz.

10. The apparatus of claim 8, wherein the relative position sensor has a detection bandwidth of greater than 100 Hz.

11. The apparatus of claim 8, wherein the actuator comprises, or is in connection with, a force sensor to measure, directly or indirectly, a force applied by the actuator.

12. The apparatus of claim 11, wherein the force sensor has a third detection bandwidth, the third detection bandwidth being greater than the first detection bandwidth of the alignment sensor.

13. The apparatus of claim 11, wherein the force sensor is a position or current sensor.

14. The apparatus of claim 11, wherein the third detection bandwidth is greater than 50 Hz.

15. An imprint lithography apparatus, comprising:
  an imprint lithography template arrangement for use in imprinting a pattern into a layer of imprintable medium provided on a substrate;
  an actuator to position and/or deform an imprint lithography template of the imprint template lithography arrangement, the actuator comprising, or is in connection with, a force sensor to measure, directly or indirectly, a force applied by the actuator, the force sensor having a first detection bandwidth;
  a substrate stage to hold the substrate; and
  an alignment sensor to align the imprint lithography template relative to a target portion of the substrate, the alignment sensor having a second detection bandwidth, wherein the first detection bandwidth is greater than the second detection bandwidth.

16. The apparatus of claim 15, further comprising a control arrangement configured to receive an output from the force sensor, and configured to convert the output into a position of the imprint lithography template.

17. The apparatus of claim 15, wherein the second detection bandwidth is less than 10 Hz.

18. The apparatus of claim 15, wherein the first detection bandwidth is greater than 50 Hz.

19. The apparatus of claim 15, comprising a plurality of actuators to position and/or deform the imprint lithography template, wherein each of the plurality of actuators comprises, or is in connection with, a force sensor.

20. The apparatus of claim 15, wherein the force sensor is a position or current sensor.

* * * * *